(12) United States Patent
Forutanpour et al.

(10) Patent No.: US 12,725,187 B2
(45) Date of Patent: Sep. 1, 2026

(54) KIOSK FOR EVALUATING AND PURCHASING ELECTRONIC DEVICES AND ASSOCIATED METHODS OF MANUFACTURE AND USE

(71) Applicant: ecoATM, LLC, San Diego, CA (US)

(72) Inventors: Babak Forutanpour, San Diego, CA (US); Ted Ray Gooding, San Diego, CA (US); Robert O'Neill, San Diego, CA (US)

(73) Assignee: ecoATM, LLC, San Diego, CA (US)

( * ) Notice: Subject to any disclaimer, the term of this patent is extended or adjusted under 35 U.S.C. 154(b) by 190 days.

(21) Appl. No.: 18/441,898

(22) Filed: Feb. 14, 2024

(65) Prior Publication Data

US 2024/0185317 A1 Jun. 6, 2024

Related U.S. Application Data

(63) Continuation-in-part of application No. 17/445,158, filed on Aug. 16, 2021, now Pat. No. 12,033,454, and (Continued)

(51) Int. Cl.

*G06Q 30/0601* (2023.01)
*G01R 31/392* (2019.01)

(Continued)

(52) U.S. Cl.

CPC ....... *G06Q 30/0278* (2013.01); *G01R 31/392* (2019.01); *G06K 19/06028* (2013.01); *G06K 19/06037* (2013.01)

(58) Field of Classification Search

CPC ............. G06Q 30/0278; G01R 31/392; G06K 19/06028; G06K 19/06037

See application file for complete search history.

(56) References Cited

U.S. PATENT DOCUMENTS 1,327,315 A 1/1920 Davies
1,730,015 A 10/1929 Rooke (Continued)

FOREIGN PATENT DOCUMENTS

CA 2760863 11/2010
CA 2818533 A1 5/2012

(Continued)

OTHER PUBLICATIONS

2006 Florida Statutes Title XXXIII, Chapter 538, Sections 538.03 and 538.04, 7 pages.

(Continued)

*Primary Examiner* — Florian M Zeender
(74) *Attorney, Agent, or Firm* — Perkins Coie LLP

(57) ABSTRACT

Disclosed herein are various embodiments of systems and methods to evaluate a device and present a price quote to the user. In some embodiments, a kiosk can receive information from and/or about the device and provide an initial offer. If the user declines the initial offer, the kiosk can inform the user of a potential higher offer based on further evaluation/testing of the device. If the user decides to proceed with the further evaluation/testing, the kiosk can perform one or more tests on the device and/or provide instructions for executing a software application on the device to allow the user to perform further tests. If the results of the further evaluation/tests are sufficient to confirm a higher offer and the user accepts the higher offer, the kiosk can verify that the device is the same device that underwent the additional evaluation/testing and not a different device.

49 Claims, 17 Drawing Sheets

Related U.S. Application Data a continuation-in-part of application No. 17/445,082, filed on Aug. 13, 2021, now Pat. No. 12,271,929, and a continuation-in-part of application No. 17/445,083, filed on Aug. 13, 2021, now Pat. No. 11,922,467.

(60) Provisional application No. 63/484,972, filed on Feb. 14, 2023.

(51) Int. Cl.

| | |
|---|---|
| ***G06F 3/14*** | (2006.01) |
| ***G06K 19/06*** | (2006.01) |
| ***G06Q 30/02*** | (2023.01) |
| ***G06V 20/50*** | (2022.01) |
| ***G06V 40/10*** | (2022.01) |

(56) References Cited

U.S. PATENT DOCUMENTS

| | | | |
|---|---|---|---|
| 2,817,725 | A | 12/1957 | Rochfort |
| 3,808,439 | A | 4/1974 | Renius |
| 4,248,334 | A | 2/1981 | Hanley et al. |
| 4,519,522 | A | 5/1985 | McElwee |
| 4,593,820 | A | 6/1986 | Antonie |
| 4,715,709 | A | 12/1987 | Sekine et al. |
| 4,821,118 | A | 4/1989 | Lafreniere |
| 4,845,636 | A | 7/1989 | Walker |
| 4,870,357 | A | 9/1989 | Young et al. |
| 4,878,736 | A | 11/1989 | Hekker et al. |
| 4,893,789 | A | 1/1990 | Novorsky |
| 4,927,051 | A | 5/1990 | Falk et al. |
| 4,951,308 | A | 8/1990 | Bishop et al. |
| 5,025,344 | A | 6/1991 | Maly et al. |
| 5,027,074 | A | 6/1991 | Haferstat |
| 5,077,462 | A | 12/1991 | Newell et al. |
| 5,091,773 | A | 2/1992 | Fouche et al. |
| 5,105,149 | A | 4/1992 | Tokura |
| 5,159,560 | A | 10/1992 | Newell et al. |
| 5,216,502 | A | 6/1993 | Katz |
| 5,280,170 | A | 1/1994 | Baldwin |
| 5,319,459 | A | 6/1994 | Mochizuki et al. |
| 5,339,096 | A | 8/1994 | Beaufort et al. |
| 5,413,454 | A | 5/1995 | Movesian |
| 5,419,438 | A | 5/1995 | Squyres et al. |
| 5,436,554 | A | 7/1995 | Decker |
| 5,482,140 | A | 1/1996 | Moore |
| 5,533,645 | A | 7/1996 | Wittern |
| 5,570,920 | A | 11/1996 | Crisman et al. |
| 5,572,444 | A | 11/1996 | Lentz et al. |
| 5,610,710 | A | 3/1997 | Canfield et al. |
| 5,711,530 | A | 1/1998 | Lewis |
| 5,717,780 | A | 2/1998 | Mitsumune et al. |
| 5,747,784 | A | 5/1998 | Walter et al. |
| 5,748,084 | A | 5/1998 | Isikoff |
| 5,775,806 | A | 7/1998 | Allred |
| 5,839,058 | A | 11/1998 | Phillips et al. |
| 5,871,371 | A | 2/1999 | Rothenberger et al. |
| 5,920,338 | A | 7/1999 | Katz |
| 5,937,396 | A | 8/1999 | Konya |
| 5,949,901 | A | 9/1999 | Nichani et al. |
| 5,965,858 | A | 10/1999 | Suzuki et al. |
| 5,966,654 | A | 10/1999 | Croughwell et al. |
| 5,987,159 | A | 11/1999 | Nichani |
| 5,988,431 | A | 11/1999 | Roe |
| 6,029,851 | A | 2/2000 | Jenkins et al. |
| 6,041,229 | A | 3/2000 | Turner |
| 6,055,512 | A | 4/2000 | Dean et al. |
| 6,100,986 | A | 8/2000 | Rydningen |
| 6,170,702 | B1 | 1/2001 | Zettler et al. |
| 6,181,805 | B1 | 1/2001 | Koike et al. |
| 6,216,890 | B1 | 4/2001 | Rathmer |
| 6,228,008 | B1 | 5/2001 | Pollington et al. |
| 6,234,812 | B1 | 5/2001 | Ivers et al. |
| 6,259,827 | B1 | 7/2001 | Nichani |
| 6,264,104 | B1 | 7/2001 | Jenkins et al. |
| 6,283,475 | B1 | 9/2001 | Stubben |
| 6,323,782 | B1 | 11/2001 | Stephens et al. |
| 6,330,354 | B1 | 12/2001 | Companion et al. |
| 6,330,958 | B1 | 12/2001 | Ruskin et al. |
| 6,393,095 | B1 | 5/2002 | Robinson |
| 6,462,644 | B1 | 10/2002 | Howell et al. |
| 6,529,837 | B1 | 3/2003 | Kang |
| 6,535,637 | B1 | 3/2003 | Wootton et al. |
| 6,573,886 | B1 | 6/2003 | Lehtinen et al. |
| 6,587,581 | B1 | 7/2003 | Matsuyama et al. |
| 6,595,684 | B1 | 7/2003 | Casagrande et al. |
| 6,597,552 | B1 | 7/2003 | Griepentrog et al. |
| 6,633,377 | B1 | 10/2003 | Weiss et al. |
| 6,667,800 | B1 | 12/2003 | Larsson et al. |
| 6,679,499 | B2 | 1/2004 | Jeon |
| 6,687,679 | B1 | 2/2004 | Van Luchene |
| 6,748,296 | B2 | 6/2004 | Banerjee et al. |
| 6,754,637 | B1 | 6/2004 | Stenz |
| 6,758,370 | B2 | 7/2004 | Cooke et al. |
| 6,758,394 | B2 | 7/2004 | Maskatiya et al. |
| 6,795,201 | B2 | 9/2004 | Rangarajan et al. |
| 6,798,528 | B1 | 9/2004 | Hartman |
| 6,822,422 | B2 | 11/2004 | Sagawa |
| 6,842,596 | B2 | 1/2005 | Morii et al. |
| 6,847,393 | B2 | 1/2005 | Ashe |
| 6,854,656 | B2 | 2/2005 | Matsumori |
| 6,874,932 | B2 | 4/2005 | Devitt et al. |
| 6,882,269 | B2 | 4/2005 | Moreno |
| 6,886,744 | B2 | 5/2005 | Ichihara et al. |
| 6,947,941 | B1 | 9/2005 | Koon |
| D512,964 | S | 12/2005 | Kissinger et al. |
| 6,983,067 | B2 | 1/2006 | Cox |
| 7,001,038 | B2 | 2/2006 | Bock et al. |
| 7,027,031 | B2 | 4/2006 | Kawasaki et al. |
| 7,039,609 | B2 | 5/2006 | Aoki |
| 7,062,454 | B1 | 6/2006 | Giannini et al. |
| 7,066,767 | B2 | 6/2006 | Liao |
| 7,069,236 | B1 | 6/2006 | Tsunenari |
| 7,076,449 | B2 | 7/2006 | Tsunenari et al. |
| 7,086,592 | B2 | 8/2006 | Wagner et al. |
| 7,109,293 | B2 | 9/2006 | Hwang et al. |
| 7,142,335 | B2 | 11/2006 | Tesavis |
| 7,153,086 | B2 | 12/2006 | Kauppila et al. |
| 7,158,170 | B2 | 1/2007 | Gustavsson |
| 7,164,518 | B2 | 1/2007 | Yang |
| 7,166,856 | B2 | 1/2007 | Cho et al. |
| 7,178,720 | B1 | 2/2007 | Strubbe et al. |
| 7,200,497 | B2 | 4/2007 | Wang et al. |
| 7,201,125 | B2 | 4/2007 | Evans |
| 7,205,529 | B2 | 4/2007 | Andersen et al. |
| 7,213,754 | B2 | 5/2007 | Eglen et al. |
| 7,213,766 | B2 | 5/2007 | Ryan et al. |
| 7,234,609 | B2 | 6/2007 | DeLazzer et al. |
| 7,251,458 | B2 | 7/2007 | O'Connell |
| 7,268,345 | B2 | 9/2007 | Schultz |
| 7,334,729 | B2 | 2/2008 | Brewington |
| 7,343,319 | B1 | 3/2008 | Jen |
| 7,348,884 | B2 | 3/2008 | Higham |
| 7,388,977 | B2 | 6/2008 | Wang et al. |
| 7,407,392 | B1 | 8/2008 | Cooke et al. |
| 7,408,674 | B2 | 8/2008 | Moro et al. |
| 7,431,158 | B2 | 10/2008 | Yamada et al. |
| 7,455,226 | B1 | 11/2008 | Hammond et al. |
| 7,520,666 | B2 | 4/2009 | Pevzner et al. |
| 7,529,687 | B1 | 5/2009 | Phan |
| 7,567,344 | B2 | 7/2009 | LeBlanc et al. |
| 7,584,269 | B2 | 9/2009 | Moore et al. |
| 7,635,131 | B2 | 12/2009 | Fukazawa |
| 7,642,687 | B2 | 1/2010 | Kageyama et al. |
| 7,646,193 | B2 | 1/2010 | Suzuki et al. |
| 7,649,450 | B2 | 1/2010 | Campion et al. |
| 7,702,108 | B2 | 4/2010 | Amon et al. |
| 7,735,125 | B1 | 6/2010 | Alvarez et al. |
| 7,761,331 | B2 | 7/2010 | Low et al. |
| 7,783,379 | B2 | 8/2010 | Beane et al. |
| 7,848,833 | B2 | 12/2010 | Li |
| 7,881,965 | B2 | 2/2011 | Bowles et al. |
| 7,890,373 | B2 | 2/2011 | Junger |
| D640,199 | S | 6/2011 | Wilson |

(56) References Cited

U.S. PATENT DOCUMENTS 8,010,402 B1 8/2011 Sharma et al.
8,019,588 B1 9/2011 Wohlberg et al.
8,025,229 B2 9/2011 Hammond et al.
8,031,930 B2 10/2011 Wang et al.
8,107,243 B2 1/2012 Guccione et al.
8,112,325 B2 2/2012 Foy et al.
8,142,199 B1 3/2012 Almouli
8,156,008 B2 4/2012 Bae et al.
8,195,511 B2 6/2012 Bowles et al.
8,200,533 B2 6/2012 Librizzi et al.
8,200,736 B2 6/2012 Shi
8,215,546 B2 7/2012 Lin et al.
8,234,185 B2 7/2012 Davis
8,239,262 B2 8/2012 Bowles et al.
8,254,883 B2 8/2012 Uchida
8,266,008 B1 9/2012 Siegel et al.
8,340,815 B2 12/2012 Peters et al.
8,369,987 B2 2/2013 Claessen
8,401,914 B1 3/2013 Kim
8,417,234 B2 4/2013 Sanding et al.
8,423,404 B2 4/2013 Bowles et al.
8,429,021 B2 4/2013 Kraft et al.
8,463,646 B2 6/2013 Bowles
8,536,472 B2 9/2013 Wu et al.
8,543,358 B2 9/2013 Trabona
8,566,183 B1 10/2013 Bonar et al.
8,606,633 B2 12/2013 Tarbert et al.
8,712,893 B1 4/2014 Brandmaier
8,718,717 B2 5/2014 Vaknin et al.
8,743,215 B1 6/2014 Lee
8,755,783 B2 6/2014 Brahami et al.
8,781,622 B2 7/2014 Mockus
8,806,280 B2 8/2014 Stephenson
8,823,794 B2 9/2014 Suzuki et al.
8,824,136 B1 9/2014 Interian et al.
8,922,643 B2 12/2014 Ji et al.
9,010,627 B1 4/2015 Prasad et al.
9,043,026 B2 5/2015 Lien et al.
9,075,781 B2 7/2015 Matthews
9,081,477 B2 7/2015 Kang
9,124,056 B1 9/2015 Lewis, Jr.
9,147,063 B1 9/2015 Florissi
9,153,089 B1 10/2015 Hewett
9,189,911 B2 11/2015 Kavli et al.
9,195,979 B2 11/2015 Geller
9,256,863 B2 2/2016 Chayon et al.
9,283,672 B1 3/2016 Matthews
9,317,989 B2 4/2016 Grow et al.
9,355,515 B2 5/2016 Brahami et al.
9,367,436 B2 6/2016 Matthews
9,367,982 B2 6/2016 Chayun et al.
9,378,606 B2 6/2016 Chayun et al.
9,390,442 B2 7/2016 Lyle
9,469,037 B2 10/2016 Matthews
9,497,563 B2 11/2016 Hornung et al.
9,549,316 B2 1/2017 Ben-Harosh et al.
9,578,133 B2 2/2017 Matthews
9,582,101 B2 2/2017 Chang et al.
9,595,238 B2 3/2017 Won
9,621,947 B1 4/2017 Oztaskent
9,641,997 B2 5/2017 Vratskides
9,668,298 B1 5/2017 Pearl et al.
9,697,548 B1 7/2017 Jaff et al.
9,704,142 B2 7/2017 Ahn
9,718,196 B2 8/2017 Matthews
9,792,597 B1 10/2017 Abbott
9,818,160 B2 11/2017 Bowles et al.
9,858,178 B2 1/2018 Matthews
9,866,664 B2 1/2018 Sinha et al.
9,881,284 B2 1/2018 Bowles et al.
9,885,672 B2 2/2018 Forutanpour et al.
9,904,911 B2 2/2018 Bowles et al.
9,911,102 B2 3/2018 Bowles
9,934,644 B2 4/2018 Chayun et al.
9,936,331 B2 4/2018 Matthews
9,972,046 B2 5/2018 Ackerman
10,032,140 B2 7/2018 Bowles et al.
10,043,339 B2 8/2018 Walker et al.
10,044,843 B2 8/2018 Sinha et al.
10,055,798 B2 8/2018 Bowles et al.
10,127,647 B2 11/2018 Forutanpour et al.
10,157,379 B2 12/2018 Singh
10,157,427 B2 12/2018 Bowles et al.
10,261,611 B2 4/2019 Matthews
10,264,426 B2 4/2019 Matthews
10,269,110 B2 4/2019 Forutanpour et al.
10,275,813 B2 4/2019 Fu
10,304,057 B1 5/2019 Powell
10,325,440 B2 6/2019 Abdelmalak et al.
10,339,509 B2 7/2019 Bordeleau et al.
10,401,411 B2 9/2019 Snook et al.
10,417,615 B2 9/2019 Bowles et al.
10,438,174 B2 10/2019 Bowles et al.
10,445,708 B2 10/2019 Hunt et al.
10,452,527 B2 10/2019 Matthews
10,475,002 B2 11/2019 Silva et al.
10,496,963 B2 12/2019 Silva et al.
10,528,992 B2 1/2020 Yost
10,529,008 B1 1/2020 Pritchard
10,565,629 B2 2/2020 Hartman
10,572,946 B2 2/2020 Bowles et al.
10,600,095 B2 3/2020 Ackerman
10,671,367 B2 6/2020 Matthews
10,679,279 B2 6/2020 Ward
10,726,542 B2 7/2020 Nguyen
10,740,891 B1 8/2020 Chen et al.
10,755,401 B2 8/2020 Bian et al.
10,803,527 B1 10/2020 Zankat et al.
10,810,732 B2 10/2020 Dwivedi et al.
10,824,942 B1 11/2020 Bhotika et al.
10,825,082 B2 11/2020 Librizzi et al.
10,834,555 B2 11/2020 Matthews
10,839,651 B2 11/2020 Smart
10,846,672 B2 11/2020 Dion et al.
10,853,873 B2 12/2020 Bowles et al.
10,860,122 B2 12/2020 Matthews
10,860,990 B2 12/2020 Bowles et al.
10,891,669 B2 1/2021 Glickman et al.
10,909,673 B2 2/2021 Forutanpour et al.
10,965,862 B2 3/2021 Weir et al.
10,970,786 B1 4/2021 Matheson et al.
10,977,700 B2 4/2021 Bordeleau et al.
10,991,093 B2 4/2021 Do et al.
11,004,126 B1 5/2021 Jacobs, II
11,010,841 B2 5/2021 Bowles et al.
11,014,093 B1 5/2021 Drexler
11,024,111 B2 6/2021 Abdelmalak et al.
11,069,141 B2 7/2021 Wurmfeld et al.
11,079,753 B1 8/2021 Roy
11,080,662 B2 8/2021 Bowles et al.
11,080,672 B2 8/2021 Bowles
11,107,046 B2 8/2021 Bowles
11,122,034 B2 9/2021 Cicchitto
11,126,973 B2 9/2021 Silva et al.
11,164,000 B2 11/2021 Leet et al.
11,232,412 B2 1/2022 Hunt et al.
11,249,769 B2 2/2022 Li et al.
11,257,057 B1 2/2022 Asmi et al.
11,288,789 B1 3/2022 Chen et al.
11,302,038 B2 4/2022 Muendel et al.
11,315,093 B2 4/2022 Bowles
11,321,768 B2 5/2022 Beauchamp
11,328,562 B2 5/2022 Smart
11,341,471 B2 5/2022 Dion et al.
11,361,599 B2 6/2022 Herman et al.
11,379,886 B1 7/2022 Fields et al.
11,386,740 B2 7/2022 Shah
11,417,068 B1 8/2022 Burris et al.
11,436,570 B2 9/2022 Bowles et al.
11,443,289 B2 9/2022 Bowles et al.
11,462,868 B2 10/2022 Forutanpour et al.
11,481,754 B2 10/2022 Priebatsch
11,482,067 B2 10/2022 Forutanpour et al.
11,526,932 B2 12/2022 Bowles et al.

(56) References Cited

U.S. PATENT DOCUMENTS 11,574,182 B2 2/2023 Matthews
11,580,627 B2 2/2023 Johnson et al.
11,599,796 B2 3/2023 Boa et al.
11,623,823 B1 4/2023 Hoshino
11,631,096 B2 4/2023 Schubert et al.
11,657,631 B2 5/2023 Sagnoas
11,687,900 B2 6/2023 Dion et al.
11,688,149 B1 6/2023 Mascarin et al.
11,688,222 B2 6/2023 Dion et al.
11,720,871 B2 8/2023 Dion et al.
11,734,654 B2 8/2023 Silva et al.
11,790,327 B2 10/2023 Bowles et al.
11,790,328 B2 10/2023 Forutanpour et al.
11,798,250 B2 10/2023 Forutanpour et al.
11,803,954 B2 10/2023 Forutanpour et al.
11,836,867 B2 12/2023 Sadalgi
11,843,206 B2 12/2023 Forutanpour et al.
11,900,553 B2 2/2024 Ha
11,907,915 B2 2/2024 Bowles et al.
11,922,467 B2 3/2024 Forutanpour et al.
11,935,138 B2 3/2024 Bowles et al.
11,989,701 B2 5/2024 Hunt et al.
11,989,710 B2 5/2024 Forutanpour et al.
12,008,520 B2 6/2024 Bowles
12,033,454 B2 7/2024 Forutanpour et al.
12,045,973 B2 7/2024 Johnson et al.
12,182,773 B2 12/2024 Bowles
12,198,108 B2 1/2025 Bowles
12,205,081 B2 1/2025 Bowles et al.
12,217,221 B2 2/2025 Silva et al.
12,223,684 B2 2/2025 Silva et al.
12,271,929 B2 4/2025 Forutanpour et al.
12,300,059 B2 5/2025 Forutanpour et al.
12,321,965 B2 6/2025 Forutanpour et al.
12,322,259 B2 6/2025 Forutanpour et al.
2001/0025883 A1 10/2001 Ichihara et al.
2001/0035425 A1 11/2001 Rocco et al.
2001/0039531 A1 11/2001 Aoki
2002/0014577 A1 2/2002 Ulrich et al.
2002/0035515 A1 3/2002 Moreno
2002/0046122 A1 4/2002 Barber
2002/0067184 A1 6/2002 Smith et al.
2002/0087413 A1 7/2002 Mahaffy et al.
2002/0112177 A1 8/2002 Voltmer
2002/0129170 A1 9/2002 Moore et al.
2002/0147656 A1 10/2002 Tam
2002/0157033 A1 10/2002 Cox
2002/0162966 A1 11/2002 Yoder
2002/0186878 A1 12/2002 Hoon et al.
2003/0006277 A1 1/2003 Maskatiya et al.
2003/0018897 A1 1/2003 Bellis, Jr. et al.
2003/0025476 A1 2/2003 Trela
2003/0036866 A1 2/2003 Nair et al.
2003/0061150 A1 3/2003 Kocher et al.
2003/0063527 A1 4/2003 Ostwald
2003/0083983 A1 5/2003 Fisher
2003/0100707 A1 5/2003 Hwang et al.
2003/0146898 A1 8/2003 Kawasaki et al.
2003/0158789 A1 8/2003 Miura et al.
2003/0170529 A1 9/2003 Sagawa
2003/0179371 A1 9/2003 Rangarajan et al.
2003/0191675 A1 10/2003 Murashita
2003/0197782 A1 10/2003 Ashe
2003/0204289 A1 10/2003 Banerjee et al.
2004/0012825 A1 1/2004 Tesavis
2004/0039639 A1 2/2004 Walker
2004/0088231 A1 5/2004 Davis
2004/0114153 A1 6/2004 Andersen et al.
2004/0141320 A1 7/2004 Bock et al.
2004/0150815 A1 8/2004 Sones et al.
2004/0156557 A1 8/2004 Van Der Weij
2004/0184651 A1 9/2004 Nordbryhn
2004/0186744 A1 9/2004 Lux
2004/0189812 A1 9/2004 Gustavsson
2004/0200902 A1 10/2004 Ishioroshi
2004/0205015 A1 10/2004 DeLaCruz
2004/0235513 A1 11/2004 O'Connell
2004/0242216 A1 12/2004 Boutsikakis
2004/0243478 A1 12/2004 Walker et al.
2004/0262521 A1 12/2004 Devitt et al.
2005/0022699 A1 2/2005 Goza
2005/0027622 A1 2/2005 Walker et al.
2005/0043897 A1 2/2005 Meyer
2005/0088379 A1 4/2005 Tsuchida
2005/0109841 A1 5/2005 Ryan et al.
2005/0128551 A1 6/2005 Yang
2005/0135917 A1 6/2005 Kauppila et al.
2005/0137942 A1 6/2005 LaFluer
2005/0139661 A1 6/2005 Eglen et al.
2005/0143149 A1 6/2005 Becker et al.
2005/0167620 A1 8/2005 Cho et al.
2005/0187657 A1 8/2005 Hashimoto et al.
2005/0216120 A1 9/2005 Rosenberg et al.
2005/0222690 A1 10/2005 Wang et al.
2005/0231595 A1 10/2005 Wang et al.
2005/0240958 A1 10/2005 Nguyen et al.
2006/0022827 A1 2/2006 Highham
2006/0038114 A9 2/2006 Cofer et al.
2006/0047573 A1 3/2006 Mitchell et al.
2006/0074756 A1 4/2006 Boykin
2006/0085158 A1 4/2006 Cakiner
2006/0129411 A1 6/2006 Bhatti et al.
2006/0167580 A1 7/2006 Whittier
2006/0184379 A1 8/2006 Tan et al.
2006/0195384 A1 8/2006 Bauer et al.
2006/0215027 A1 9/2006 Nonoyama et al.
2006/0217152 A1 9/2006 Fok et al.
2006/0219776 A1 10/2006 Finn
2006/0229108 A1 10/2006 Cehelnik
2006/0230013 A1 10/2006 Hrle
2006/0235747 A1 10/2006 Hammond et al.
2006/0258008 A1 11/2006 Holler et al.
2006/0261931 A1 11/2006 Cheng et al.
2006/0271431 A1 11/2006 Wehr et al.
2006/0279307 A1 12/2006 Wang et al.
2006/0280356 A1 12/2006 Yamagashi
2006/0287929 A1 12/2006 Bae et al.
2007/0012665 A1 1/2007 Nelson
2007/0013124 A1 1/2007 Graef et al.
2007/0013139 A1 1/2007 Kumagai
2007/0032098 A1 2/2007 Bowles et al.
2007/0050083 A1 3/2007 Signorelli
2007/0057815 A1 3/2007 Foy et al.
2007/0129906 A1 6/2007 Stoecker et al.
2007/0133844 A1 6/2007 Waehner et al.
2007/0140310 A1 6/2007 Rolton et al.
2007/0150403 A1 6/2007 Mock et al.
2007/0205751 A1 9/2007 Suzuki et al.
2007/0258085 A1 11/2007 Robbins
2007/0263099 A1 11/2007 Motta et al.
2007/0269099 A1 11/2007 Nishino et al.
2007/0271194 A1 11/2007 Walker
2007/0276911 A1 11/2007 Bhumkar
2007/0281734 A1 12/2007 Mizrachi
2007/0282999 A1 12/2007 Tu et al.
2008/0004828 A1 1/2008 Mizrachi
2008/0027581 A1 1/2008 Saether et al.
2008/0033596 A1 2/2008 Fausak et al.
2008/0071627 A1 3/2008 Junger
2008/0097770 A1 4/2008 Low et al.
2008/0109746 A1 5/2008 Mayer
2008/0111989 A1 5/2008 Dufour et al.
2008/0133432 A1 6/2008 Ramseyer
2008/0149720 A1 6/2008 Colville
2008/0167578 A1 7/2008 Bryer et al.
2008/0177598 A1 7/2008 Davie
2008/0207198 A1 8/2008 Juric
2008/0228582 A1 9/2008 Fordyce
2008/0231113 A1 9/2008 Guccione et al.
2008/0255901 A1 10/2008 Carroll et al.
2008/0256008 A1 10/2008 Kwok
2008/0260235 A1 10/2008 Cai et al.
2008/0277467 A1 11/2008 Carlson
2008/0281691 A1 11/2008 Pearson et al.

(56) References Cited

U.S. PATENT DOCUMENTS

2008/0296374 A1 12/2008 Gonen et al.
2008/0303915 A1 12/2008 Omi
2008/0306701 A1 12/2008 Zhong et al.
2009/0051907 A1 2/2009 Li et al.
2009/0078775 A1 3/2009 Giebel et al.
2009/0079388 A1 3/2009 Reddy
2009/0095047 A1 4/2009 Patel et al.
2009/0108015 A1 4/2009 Kreamer
2009/0114716 A1 5/2009 Ramachandran
2009/0132813 A1 5/2009 Schibuk
2009/0145727 A1 6/2009 Johns
2009/0156199 A1 6/2009 Steenstra et al.
2009/0160668 A1 6/2009 Crowley et al.
2009/0177319 A1 7/2009 Garibaldi et al.
2009/0184865 A1 7/2009 Valo et al.
2009/0187491 A1 7/2009 Bull et al.
2009/0190142 A1 7/2009 Taylor et al.
2009/0191931 A1 7/2009 Peck
2009/0207743 A1 8/2009 Huq et al.
2009/0244285 A1 10/2009 Chathukutty
2009/0247133 A1 10/2009 Holmen et al.
2009/0248883 A1 10/2009 Suryanarayana et al.
2009/0251815 A1 10/2009 Wang et al.
2009/0262341 A1 10/2009 Konopa et al.
2009/0265035 A1 10/2009 Jenkinson et al.
2009/0299543 A1 12/2009 Cox et al.
2009/0312009 A1 12/2009 Fishel
2009/0321511 A1 12/2009 Browne
2009/0322706 A1 12/2009 Austin
2010/0005004 A1 1/2010 Hudak et al.
2010/0051695 A1 3/2010 Yepez et al.
2010/0063894 A1 3/2010 Lundy
2010/0088192 A1 4/2010 Bowles et al.
2010/0110174 A1 5/2010 Leconte
2010/0115887 A1 5/2010 Schroeder et al.
2010/0147953 A1 6/2010 Barkan
2010/0157280 A1 6/2010 Kusevic et al.
2010/0161397 A1 6/2010 Gauthier et al.
2010/0162359 A1 6/2010 Casey et al.
2010/0169231 A1 7/2010 Bowles et al.
2010/0174596 A1 7/2010 Gilman
2010/0185506 A1 7/2010 Wolff
2010/0219234 A1 9/2010 Forbes
2010/0228676 A1 9/2010 Librizzi et al.
2010/0235198 A1 9/2010 Fini et al.
2010/0237854 A1 9/2010 Kumhyr et al.
2010/0260271 A1 10/2010 Kapoor
2010/0262481 A1 10/2010 Baker et al.
2010/0268792 A1 10/2010 Butler
2010/0312639 A1 12/2010 Mastronardi
2011/0035322 A1 2/2011 Lively
2011/0043628 A1 2/2011 Yun
2011/0047022 A1 2/2011 Walker
2011/0050164 A1 * 3/2011 Partovi .................. H02J 50/12
320/108
2011/0055322 A1 3/2011 Gregersen
2011/0060641 A1 3/2011 Grossman et al.
2011/0066514 A1 3/2011 Maraz
2011/0067520 A1 3/2011 Ihrke et al.
2011/0082734 A1 4/2011 Zhang et al.
2011/0099264 A1 4/2011 Chapin et al.
2011/0113479 A1 5/2011 Ganem
2011/0173576 A1 7/2011 Murphy et al.
2011/0191861 A1 8/2011 Spears
2011/0235853 A1 9/2011 Bowles et al.
2011/0295417 A1 12/2011 Smith, III
2011/0296339 A1 12/2011 Kang
2011/0296508 A1 12/2011 Os et al.
2011/0313840 A1 12/2011 Mason et al.
2012/0004761 A1 1/2012 Madruga
2012/0016518 A1 1/2012 Saario et al.
2012/0022965 A1 1/2012 Seergy
2012/0026582 A1 2/2012 Okabe et al.
2012/0029985 A1 2/2012 Wilson et al.
2012/0030097 A1 2/2012 Hagan et al.
2012/0030399 A1 2/2012 Ben-Harosh
2012/0054113 A1 3/2012 Jayaraman et al.
2012/0063501 A1 3/2012 Aguren
2012/0078413 A1 3/2012 Baker
2012/0095875 A1 4/2012 Guthrie
2012/0116928 A1 5/2012 Gventer
2012/0116929 A1 5/2012 Gventer
2012/0117001 A1 5/2012 Gventer et al.
2012/0127307 A1 5/2012 Hassenzahl
2012/0146956 A1 6/2012 Jenkinson
2012/0191562 A1 7/2012 Bowles et al.
2012/0209783 A1 8/2012 Smith et al.
2012/0235812 A1 9/2012 De Mello et al.
2012/0246083 A1 9/2012 Bowles
2012/0249779 A1 10/2012 Ji et al.
2012/0254046 A1 10/2012 Librizzi et al.
2012/0263394 A1 10/2012 Fujiwara et al.
2012/0280934 A1 11/2012 Ha
2012/0294490 A1 11/2012 Bowles et al.
2012/0301009 A1 11/2012 Dabic
2012/0303431 A1 11/2012 Phillips et al.
2013/0006713 A1 1/2013 Haake
2013/0034305 A1 2/2013 Jahanshahi et al.
2013/0041508 A1 2/2013 Hu et al.
2013/0046611 A1 2/2013 Bowles et al.
2013/0046699 A1 2/2013 Bowles et al.
2013/0073376 A1 3/2013 Heath
2013/0112440 A1 5/2013 Alsaif et al.
2013/0124426 A1 5/2013 Bowles et al.
2013/0126741 A1 5/2013 Srivastava et al.
2013/0137376 A1 5/2013 Fitzgerald et al.
2013/0138528 A1 5/2013 McAlhaney
2013/0144797 A1 6/2013 Bowles et al.
2013/0155061 A1 6/2013 Jahanshahi et al.
2013/0157641 A1 6/2013 Brahami et al.
2013/0159119 A1 6/2013 Henderson et al.
2013/0169413 A1 7/2013 Schuessler
2013/0173430 A1 7/2013 Benjamin
2013/0173434 A1 7/2013 Hartman
2013/0181935 A1 7/2013 McKenzie et al.
2013/0191236 A1 7/2013 Bowles
2013/0198089 A1 8/2013 Bowles
2013/0198144 A1 8/2013 Bowles
2013/0200912 A1 8/2013 Panagas
2013/0226679 A1 8/2013 Bowles
2013/0246211 A1 9/2013 Sullivan
2013/0246212 A1 9/2013 Sullivan
2013/0246285 A1 9/2013 Chayun et al.
2013/0253700 A1 9/2013 Carson et al.
2013/0275314 A1 10/2013 Bowles
2013/0284805 A1 10/2013 Kraft et al.
2013/0290146 A1 10/2013 West et al.
2013/0297388 A1 11/2013 Kyle, Jr. et al.
2014/0006451 A1 1/2014 Mullis et al.
2014/0012643 A1 1/2014 Behrisch
2014/0028449 A1 1/2014 Sigal et al.
2014/0038556 A1 2/2014 DeSousa
2014/0046748 A1 2/2014 Nagarajan
2014/0046845 A1 2/2014 Dogin et al.
2014/0052329 A1 2/2014 Amirpour
2014/0067710 A1 3/2014 Gventer et al.
2014/0080550 A1 3/2014 Ino et al.
2014/0143161 A1 5/2014 Ahn
2014/0147004 A1 5/2014 Uchida
2014/0149201 A1 5/2014 Abbott
2014/0150100 A1 5/2014 Gupta et al.
2014/0156883 A1 6/2014 Bowles
2014/0178029 A1 6/2014 Raheman et al.
2014/0214505 A1 7/2014 Shuster-Arechiga et al.
2014/0235258 A1 8/2014 Wang et al.
2014/0244315 A1 8/2014 Cahill et al.
2014/0249668 A1 9/2014 Kavli et al.
2014/0267691 A1 9/2014 Humphrey
2014/0273245 A1 9/2014 Ochranek et al.
2014/0278244 A1 9/2014 Humphrey et al.
2014/0295819 A1 10/2014 Chayun et al.
2014/0297368 A1 10/2014 Ferder
2014/0316561 A1 10/2014 Tkachenko
2014/0330685 A1 11/2014 Nazzari

(56) References Cited

U.S. PATENT DOCUMENTS

2014/0346185 A1 11/2014 Chayun et al.
2014/0347473 A1 11/2014 Wolff et al.
2015/0006281 A1 1/2015 Takahashi
2015/0046343 A1 2/2015 Martini
2015/0066677 A1 3/2015 Bowles et al.
2015/0073590 A1 3/2015 Garcia
2015/0088698 A1 3/2015 Ackerman
2015/0088731 A1 3/2015 Ackerman
2015/0105901 A1 4/2015 Joshi
2015/0120485 A1 4/2015 Nash
2015/0161714 A1 6/2015 Fainshtein
2015/0170237 A1 6/2015 Powell
2015/0177330 A1 6/2015 Morris
2015/0193797 A1 7/2015 Gerrity
2015/0206200 A1 7/2015 Edmondson et al.
2015/0249353 A1 9/2015 Hamilton
2015/0278529 A1 10/2015 Cho et al.
2015/0293860 A9 10/2015 Bowles
2015/0294278 A1 10/2015 Nguyen
2015/0309912 A1 10/2015 Nguyen et al.
2015/0317619 A1 11/2015 Curtis
2015/0324761 A1 11/2015 Nguyen et al.
2015/0324870 A1 11/2015 Nguyen et al.
2015/0332206 A1 11/2015 Trew et al.
2015/0356637 A1 12/2015 Graffia et al.
2016/0019607 A1 1/2016 Burmester et al.
2016/0019685 A1 1/2016 Nguyen et al.
2016/0055392 A1 2/2016 Nakano
2016/0078434 A1 3/2016 Huxham et al.
2016/0087381 A1 3/2016 Wong et al.
2016/0091549 A1 3/2016 Snook et al.
2016/0092849 A1 3/2016 Cirannek et al.
2016/0098688 A1 4/2016 Hunt et al.
2016/0098689 A1 4/2016 Bowles et al.
2016/0098690 A1* 4/2016 Silva ..................... G06Q 10/30 705/21
2016/0125367 A1 5/2016 Bowles et al.
2016/0125548 A1 5/2016 Bowles et al.
2016/0125612 A1 5/2016 Seki et al.
2016/0132840 A1 5/2016 Bowles et al.
2016/0171456 A1 6/2016 Bowles et al.
2016/0171544 A1 6/2016 Heminger et al.
2016/0171575 A1 6/2016 Bowles et al.
2016/0184990 A1 6/2016 Song et al.
2016/0210648 A1 7/2016 Cirannek et al.
2016/0253861 A1 9/2016 Seo
2016/0269401 A1 9/2016 Saito et al.
2016/0269895 A1 9/2016 Soini et al.
2016/0275460 A1* 9/2016 Ploetner ................. G06V 10/44
2016/0275518 A1 9/2016 Bowles et al.
2016/0284019 A1 9/2016 Bowles et al.
2016/0292710 A1 10/2016 Casselle
2016/0301786 A1 10/2016 Koltsov et al.
2016/0328684 A1 11/2016 Bowles et al.
2016/0335616 A1 11/2016 Bordeleau et al.
2016/0364939 A1 12/2016 Chayun et al.
2016/0379287 A1 12/2016 Dabiri
2017/0011374 A1 1/2017 McDivitt
2017/0083886 A1 3/2017 Silva et al.
2017/0091823 A1 3/2017 Adinarayan et al.
2017/0110902 A1 4/2017 Miller
2017/0115235 A1 4/2017 Ohlsson et al.
2017/0123828 A1 5/2017 Ben-Harosh et al.
2017/0142484 A1 5/2017 Jeon
2017/0169401 A1 6/2017 Beane et al.
2017/0221110 A1 8/2017 Sullivan et al.
2017/0256051 A1 9/2017 Dwivedi et al.
2017/0256119 A1 9/2017 Abdelmalak et al.
2017/0278191 A1 9/2017 Tassone et al.
2017/0286920 A1 10/2017 Silva et al.
2017/0286921 A1 10/2017 Bowles
2017/0301010 A1 10/2017 Bowles et al.
2017/0301035 A1 10/2017 Bowles et al.
2017/0301078 A1 10/2017 Forutanpour et al.
2017/0323279 A1* 11/2017 Dion ....................... G07F 19/20
2017/0330158 A1 11/2017 Librizzi et al.
2017/0343481 A1 11/2017 Jahanshahi et al.
2017/0356857 A1 12/2017 Forutanpour et al.
2017/0372273 A1 12/2017 Bowles et al.
2017/0372465 A1 12/2017 Forutanpour et al.
2018/0084094 A1 3/2018 Sinha et al.
2018/0101810 A1 4/2018 Feng et al.
2018/0122022 A1 5/2018 Kelly
2018/0130136 A1 5/2018 Bowles et al.
2018/0157246 A1 6/2018 Huang et al.
2018/0157820 A1 6/2018 Adams et al.
2018/0160269 A1 6/2018 Baarman et al.
2018/0165655 A1 6/2018 Marcelle et al.
2018/0240144 A1 8/2018 Curtis
2018/0247280 A1 8/2018 Bowles et al.
2018/0255047 A1 9/2018 Cicchitto
2018/0260794 A1 9/2018 Bowles et al.
2018/0293566 A1 10/2018 Engles et al.
2018/0293664 A1 10/2018 Zhang et al.
2018/0300776 A1 10/2018 Yost
2018/0321163 A1 11/2018 Casadio
2018/0322623 A1 11/2018 Memo et al.
2018/0342050 A1 11/2018 Fitzgerald et al.
2018/0350163 A1 12/2018 Pofale et al.
2018/0365744 A1 12/2018 Lennon
2019/0017863 A1 1/2019 Saltzman et al.
2019/0019147 A1 1/2019 McCarty et al.
2019/0051090 A1 2/2019 Goldberg et al.
2019/0066075 A1 2/2019 Lobo et al.
2019/0066439 A1 2/2019 Pinkus
2019/0073566 A1 3/2019 Brauer
2019/0073568 A1 3/2019 He et al.
2019/0102874 A1 4/2019 Goja
2019/0156611 A1 5/2019 Redhead
2019/0166278 A1 5/2019 Hiyama et al.
2019/0222748 A1 7/2019 Weir et al.
2019/0251777 A1 8/2019 Abdelmalak et al.
2019/0272628 A1 9/2019 Tsou
2019/0279181 A1 9/2019 Kelly
2019/0279431 A1 9/2019 Wurmfeld et al.
2019/0287141 A1 9/2019 Bordeleau et al.
2019/0318465 A1 10/2019 Nguyen
2019/0325530 A1 10/2019 Bowles et al.
2019/0372827 A1 12/2019 Vasseur et al.
2019/0375300 A1 12/2019 Lyon
2020/0020091 A1 1/2020 Forutanpour et al.
2020/0020097 A1 1/2020 Do et al.
2020/0042795 A1 2/2020 Lee et al.
2020/0042969 A1 2/2020 Ray
2020/0066067 A1 2/2020 Herman et al.
2020/0090137 A1 3/2020 Bowles et al.
2020/0104028 A1 4/2020 Vats
2020/0104720 A1 4/2020 Boa et al.
2020/0104868 A1 4/2020 Schubert et al.
2020/0126046 A1 4/2020 Bowles
2020/0151677 A1 5/2020 Bowles et al.
2020/0151678 A1 5/2020 Silva et al.
2020/0151679 A1 5/2020 Hunt et al.
2020/0167748 A1 5/2020 Dion et al.
2020/0175481 A1 6/2020 Pham
2020/0175669 A1 6/2020 Bian et al.
2020/0202319 A1 6/2020 Forutanpour et al.
2020/0202405 A1 6/2020 Glickman et al.
2020/0202419 A1 6/2020 Beauchamp
2020/0241891 A1 7/2020 Li et al.
2020/0258343 A1 8/2020 Forutanpour et al.
2020/0259300 A1 8/2020 Forutanpour et al.
2020/0265487 A1 8/2020 Forutanpour et al.
2020/0265666 A1 8/2020 Yamamiya
2020/0286030 A1 9/2020 Hewett
2020/0342442 A1 10/2020 Curtis
2020/0387881 A1 12/2020 Smith
2020/0393742 A1 12/2020 Dion et al.
2020/0410793 A1 12/2020 Folco
2021/0012315 A1 1/2021 Priebatsch
2021/0035206 A1 2/2021 Bowles et al.
2021/0081698 A1 3/2021 Lindeman et al.
2021/0081914 A1 3/2021 Nelms et al.
2021/0110366 A1 4/2021 Published

(56) References Cited

U.S. PATENT DOCUMENTS

| | | | | |
|---|---|---|---|---|
| 2021/0110440 | A1* | 4/2021 | Dion | G06Q 30/018 |
| 2021/0150773 | A1 | 5/2021 | Muendel et al. | |
| 2021/0174312 | A1 | 6/2021 | Bowles et al. | |
| 2021/0192484 | A1 | 6/2021 | Forutanpour et al. | |
| 2021/0209512 | A1 | 7/2021 | Gaddam et al. | |
| 2021/0209746 | A1 | 7/2021 | Johnson et al. | |
| 2021/0217076 | A1 | 7/2021 | Kruper et al. | |
| 2021/0224867 | A1 | 7/2021 | Bordeleau et al. | |
| 2021/0247016 | A1 | 8/2021 | Affentranger | |
| 2021/0254966 | A1 | 8/2021 | Hur et al. | |
| 2021/0255240 | A1 | 8/2021 | McGrath | |
| 2021/0264483 | A1 | 8/2021 | Hirata | |
| 2021/0272208 | A1 | 9/2021 | Leise et al. | |
| 2021/0278338 | A1 | 9/2021 | Jung | |
| 2021/0295494 | A1 | 9/2021 | Forutanpour et al. | |
| 2021/0327203 | A1 | 10/2021 | Shah | |
| 2021/0343030 | A1 | 11/2021 | Sagnoas | |
| 2021/0357545 | A1 | 11/2021 | Sugawara et al. | |
| 2022/0027879 | A1 | 1/2022 | Bowles et al. | |
| 2022/0050897 | A1 | 2/2022 | Gaddam et al. | |
| 2022/0051212 | A1 | 2/2022 | Forutanpour et al. | |
| 2022/0051300 | A1 | 2/2022 | Forutanpour et al. | |
| 2022/0051301 | A1 | 2/2022 | Forutanpour et al. | |
| 2022/0051507 | A1 | 2/2022 | Forutanpour et al. | |
| 2022/0051514 | A1 | 2/2022 | Schmidt | |
| 2022/0067798 | A1 | 3/2022 | Forutanpour et al. | |
| 2022/0068076 | A1 | 3/2022 | Forutanpour et al. | |
| 2022/0084296 | A1 | 3/2022 | Sadalgi | |
| 2022/0114854 | A1 | 4/2022 | Forutanpour et al. | |
| 2022/0164833 | A1 | 5/2022 | Dion et al. | |
| 2022/0172178 | A1 | 6/2022 | Forutanpour et al. | |
| 2022/0187802 | A1 | 6/2022 | Wittenberg et al. | |
| 2022/0198407 | A1 | 6/2022 | Beane et al. | |
| 2022/0254216 | A1 | 8/2022 | Schwarzli | |
| 2022/0262189 | A1 | 8/2022 | Dion et al. | |
| 2022/0277281 | A1 | 9/2022 | Dion et al. | |
| 2022/0284406 | A1 | 9/2022 | Hunt et al. | |
| 2022/0292464 | A1 | 9/2022 | Silva et al. | |
| 2022/0318774 | A1 | 10/2022 | Bowles | |
| 2023/0007937 | A1 | 1/2023 | Forutanpour et al. | |
| 2023/0051060 | A1 | 2/2023 | Nitu | |
| 2023/0077844 | A1 | 3/2023 | Bowles et al. | |
| 2023/0100849 | A1 | 3/2023 | Bowles et al. | |
| 2023/0188998 | A1 | 6/2023 | Zellner et al. | |
| 2023/0196865 | A1 | 6/2023 | Forutanpour et al. | |
| 2023/0215109 | A1 | 7/2023 | Ha | |
| 2023/0238751 | A1 | 7/2023 | Forutanpour et al. | |
| 2023/0259910 | A1 | 8/2023 | Forutanpour et al. | |
| 2023/0264871 | A1 | 8/2023 | Williams et al. | |
| 2023/0274346 | A1 | 8/2023 | Bowles et al. | |
| 2023/0297973 | A1 | 9/2023 | Bowles et al. | |
| 2023/0297974 | A1 | 9/2023 | Bowles et al. | |
| 2023/0306384 | A1 | 9/2023 | Bowles et al. | |
| 2023/0371729 | A1 | 11/2023 | Williams et al. | |
| 2023/0394904 | A1 | 12/2023 | Forutanpour et al. | |
| 2024/0005289 | A1 | 1/2024 | Silva et al. | |
| 2024/0087276 | A1 | 3/2024 | Silva et al. | |
| 2024/0144461 | A1 | 5/2024 | Forutanpour et al. | |
| 2024/0185317 | A1 | 6/2024 | Forutanpour et al. | |
| 2024/0249251 | A1 | 7/2024 | Bowles | |
| 2024/0249321 | A1 | 7/2024 | Forutanpour et al. | |
| 2024/0265364 | A1 | 8/2024 | Forutanpour et al. | |
| 2024/0265470 | A1 | 8/2024 | Bowles et al. | |
| 2024/0289753 | A1 | 8/2024 | Bowles | |
| 2024/0312284 | A1 | 9/2024 | Dion | |
| 2024/0321033 | A1 | 9/2024 | Forutanpour et al. | |
| 2024/0322599 | A1 | 9/2024 | Bober | |
| 2024/0333032 | A1 | 10/2024 | Bober | |
| 2024/0346463 | A1 | 10/2024 | Hunt et al. | |

FOREIGN PATENT DOCUMENTS

| | | | |
|---|---|---|---|
| CA | 2866147 | | 9/2013 |
| CA | 2942619 | A1 | 9/2014 |
| CA | 2937152 | A1 | 7/2015 |
| CA | 2985549 | | 11/2016 |
| CA | 3069888 | | 1/2019 |
| CA | 3069890 | | 1/2019 |
| CA | 2926097 | | 11/2020 |
| CN | 1365479 | | 8/2002 |
| CN | 1574437 | | 2/2005 |
| CN | 2708415 | | 7/2005 |
| CN | 1864088 | | 11/2006 |
| CN | 1957320 | | 5/2007 |
| CN | 2912132 | | 6/2007 |
| CN | 200965706 | | 10/2007 |
| CN | 101176124 | | 5/2008 |
| CN | 101379488 | A | 3/2009 |
| CN | 201956656 | U | 8/2011 |
| CN | 102246384 | | 11/2011 |
| CN | 102315630 | A | 1/2012 |
| CN | 102467728 | A | 5/2012 |
| CN | 202351953 | | 7/2012 |
| CN | 202353475 | U | 7/2012 |
| CN | 102654927 | | 8/2012 |
| CN | 202394296 | | 8/2012 |
| CN | 102682597 | A | 9/2012 |
| CN | 202564711 | U | 11/2012 |
| CN | 102812500 | | 12/2012 |
| CN | 202585951 | U | 12/2012 |
| CN | 202702438 | U | 1/2013 |
| CN | 202711369 | U | 1/2013 |
| CN | 102930642 | | 2/2013 |
| CN | 102976004 | | 3/2013 |
| CN | 103198562 | | 7/2013 |
| CN | 103226870 | | 7/2013 |
| CN | 203242065 | | 10/2013 |
| CN | 103440607 | | 12/2013 |
| CN | 103514641 | | 1/2014 |
| CN | 103544772 | | 1/2014 |
| CN | 203408902 | | 1/2014 |
| CN | 103662541 | | 3/2014 |
| CN | 103679147 | A | 3/2014 |
| CN | 103765455 | | 4/2014 |
| CN | 203520502 | | 4/2014 |
| CN | 103824387 | A | 5/2014 |
| CN | 203588366 | U | 5/2014 |
| CN | 103843040 | | 6/2014 |
| CN | 103954626 | | 7/2014 |
| CN | 103999053 | | 8/2014 |
| CN | 302944037 | S | 9/2014 |
| CN | 302944252 | S | 9/2014 |
| CN | 302944253 | S | 9/2014 |
| CN | 303042750 | S | 12/2014 |
| CN | 205103926 | U | 3/2016 |
| CN | 105488702 | | 4/2016 |
| CN | 105513201 | | 4/2016 |
| CN | 205129815 | U | 4/2016 |
| CN | 205132514 | U | 4/2016 |
| CN | 205140067 | U | 4/2016 |
| CN | 205247436 | | 5/2016 |
| CN | 106022379 | A | 10/2016 |
| CN | 303896361 | S | 10/2016 |
| CN | 106203643 | A | 12/2016 |
| CN | 106293734 | A | 1/2017 |
| CN | 106372638 | A | 2/2017 |
| CN | 304051346 | S | 2/2017 |
| CN | 304139831 | S | 5/2017 |
| CN | 106911159 | | 6/2017 |
| CN | 304169301 | S | 6/2017 |
| CN | 206440635 | U | 8/2017 |
| CN | 107220640 | A | 9/2017 |
| CN | 206466691 | U | 9/2017 |
| CN | 107514978 | A | 12/2017 |
| CN | 206861374 | U | 1/2018 |
| CN | 207037788 | U | 2/2018 |
| CN | 105444678 | B | 3/2018 |
| CN | 304702339 | S | 6/2018 |
| CN | 304702340 | S | 6/2018 |
| CN | 304747709 | S | 7/2018 |
| CN | 304795309 | S | 8/2018 |
| CN | 108596658 | A | 9/2018 |
| CN | 207854959 | | 9/2018 |
| CN | 108647588 | A | 10/2018 |

(56) References Cited

FOREIGN PATENT DOCUMENTS

CN 207993120 U 10/2018
CN 207993121 U 10/2018
CN 207995226 U 10/2018
CN 304842785 S 10/2018
CN 108764236 A 11/2018
CN 208086545 U 11/2018
CN 208172834 U 11/2018
CN 208176564 12/2018
CN 304958348 S 12/2018
CN 305014434 S 1/2019
CN 305014435 S 1/2019
CN 208790107 4/2019
CN 109831575 A 5/2019
CN 208819255 U 5/2019
CN 208819289 U 5/2019
CN 208819290 U 5/2019
CN 208969761 U 6/2019
CN 305275610 S 7/2019
CN 110333876 A 10/2019
CN 110347341 A 10/2019
CN 110595361 A 12/2019
CN 110653162 A 1/2020
CN 110675399 A 1/2020
CN 110751002 A 2/2020
CN 110788015 A 2/2020
CN 110796646 A 2/2020
CN 110796647 A 2/2020
CN 110796669 A 2/2020
CN 110827244 A 2/2020
CN 110827245 A 2/2020
CN 110827246 A 2/2020
CN 110827247 A 2/2020
CN 110827248 A 2/2020
CN 110827249 A 2/2020
CN 110880028 A 3/2020
CN 110928730 A 3/2020
CN 305638504 S 3/2020
CN 11080184 A 4/2020
CN 110976302 A 4/2020
CN 111009073 A 4/2020
CN 210348162 U 4/2020
CN 111175318 A 5/2020
CN 111210473 A 5/2020
CN 305767220 S 5/2020
CN 111238430 A 6/2020
CN 111262987 A 6/2020
CN 111272067 A 6/2020
CN 111272388 A 6/2020
CN 111272393 A 6/2020
CN 111273704 A 6/2020
CN 111277466 A 6/2020
CN 111277659 A 6/2020
CN 111277695 A 6/2020
CN 111277696 A 6/2020
CN 111290660 A 6/2020
CN 111290949 A 6/2020
CN 111291661 A 6/2020
CN 111292302 A 6/2020
CN 111294454 A 6/2020
CN 111294459 A 6/2020
CN 111307429 A 6/2020
CN 111311556 A 6/2020
CN 111311687 A 6/2020
CN 111311749 A 6/2020
CN 111314445 A 6/2020
CN 111314535 A 6/2020
CN 111325715 A 6/2020
CN 111325716 A 6/2020
CN 111325717 A 6/2020
CN 111325901 A 6/2020
CN 210666955 U 6/2020
CN 305818424 S 6/2020
CN 111439560 A 7/2020
CN 211149556 U 7/2020
CN 305955503 S 7/2020
CN 211291337 U 8/2020
CN 211296771 U 8/2020
CN 211402187 U 9/2020
CN 211515235 U 9/2020
CN 211538600 U 9/2020
CN 111830293 A 10/2020
CN 111830354 A 10/2020
CN 111860890 A 10/2020
CN 111860891 A 10/2020
CN 211630227 U 10/2020
CN 306113050 S 10/2020
CN 306113051 S 10/2020
CN 306113052 S 10/2020
CN 212023984 U 11/2020
CN 212031269 U 11/2020
CN 306164092 S 11/2020
CN 306164093 S 11/2020
CN 306164094 S 11/2020
CN 306164095 S 11/2020
CN 112098443 A 12/2020
CN 212084259 U 12/2020
CN 212268703 U 1/2021
CN 212314534 U 1/2021
CN 212322247 U 1/2021
CN 212364464 1/2021
CN 306272538 S 1/2021
CN 306283626 S 1/2021
CN 112348761 A 2/2021
CN 112348808 A 2/2021
CN 112393880 A 2/2021
CN 112395118 A 2/2021
CN 212460662 2/2021
CN 212586854 U 2/2021
CN 212597202 U 2/2021
CN 306323627 S 2/2021
CN 112433902 A 3/2021
CN 112452935 A 3/2021
CN 112455988 A 3/2021
CN 112456100 A 3/2021
CN 112565505 A 3/2021
CN 212677296 U 3/2021
CN 212681731 U 3/2021
CN 111314537 4/2021
CN 112613622 A 4/2021
CN 112613914 A 4/2021
CN 112614117 A 4/2021
CN 112614269 A 4/2021
CN 112633194 A 4/2021
CN 112634245 A 4/2021
CN 112634288 A 4/2021
CN 112634301 A 4/2021
CN 112672145 A 4/2021
CN 112735081 A 4/2021
CN 213001252 U 4/2021
CN 213004872 U 4/2021
CN 112777290 A 5/2021
CN 112783702 A 5/2021
CN 112816490 A 5/2021
CN 112822740 A 5/2021
CN 112828842 A 5/2021
CN 112837076 A 5/2021
CN 112837102 A 5/2021
CN 213149008 U 5/2021
CN 213301455 U 5/2021
CN 213301535 U 5/2021
CN 213305483 U 5/2021
CN 112907182 A 6/2021
CN 112991614 A 6/2021
CN 113032198 A 6/2021
CN 113034481 A 6/2021
CN 113034493 A 6/2021
CN 113034529 A 6/2021
CN 113034530 A 6/2021
CN 113034531 A 6/2021
CN 113038012 A 6/2021
CN 113052798 A 6/2021
CN 113110806 A 7/2021
CN 113114794 A 7/2021
CN 113132523 A 7/2021

(56) References Cited

FOREIGN PATENT DOCUMENTS

CN 113160494 A 7/2021
CN 113190215 A 7/2021
CN 113191789 A 7/2021
CN 213765490 U 7/2021
CN 213796595 U 7/2021
CN 213807304 U 7/2021
CN 306700330 S 7/2021
CN 113220647 A 8/2021
CN 113220648 A 8/2021
CN 113237473 A 8/2021
CN 113238680 A 8/2021
CN 113238905 A 8/2021
CN 113252678 A 8/2021
CN 113254292 A 8/2021
CN 113254293 A 8/2021
CN 113254294 A 8/2021
CN 113268162 A 8/2021
CN 113298078 A 8/2021
CN 113301202 A 8/2021
CN 113329222 A 8/2021
CN 213917879 U 8/2021
CN 213933659 U 8/2021
CN 306744667 S 8/2021
CN 306744668 S 8/2021
CN 306786433 S 8/2021
CN 306786434 S 8/2021
CN 113422860 A 9/2021
CN 214160736 U 9/2021
CN 214162705 U 9/2021
CN 214427985 U 10/2021
CN 113591066 A 11/2021
CN 113591963 A 11/2021
CN 113808322 A 12/2021
CN 215246545 U 12/2021
CN 215247165 U 12/2021
CN 215247245 U 12/2021
CN 215247426 U 12/2021
CN 215262785 U 12/2021
CN 215262787 U 12/2021
CN 215266884 U 12/2021
CN 215266954 U 12/2021
CN 215325354 U 12/2021
CN 113887609 A 1/2022
CN 113901996 A 1/2022
CN 113947445 A 1/2022
CN 215555043 U 1/2022
CN 215556081 U 1/2022
CN 215575427 U 1/2022
CN 215576764 U 1/2022
CN 215576765 U 1/2022
CN 114038114 A 2/2022
CN 114063364 A 2/2022
CN 114066367 A 2/2022
CN 215703219 U 2/2022
CN 215708961 U 2/2022
CN 114155260 A 3/2022
CN 114170419 A 3/2022
CN 114170435 A 3/2022
CN 114186702 A 3/2022
CN 114219105 A 3/2022
CN 114281627 A 4/2022
CN 114298204 A 4/2022
CN 114298345 A 4/2022
CN 114299293 A 4/2022
CN 114299657 A 4/2022
CN 114328051 A 4/2022
CN 114330533 A 4/2022
CN 114330534 A 4/2022
CN 114332016 A 4/2022
CN 114371417 A 4/2022
CN 114374795 A 4/2022
CN 114386629 A 4/2022
CN 114494856 A 5/2022
CN 216612155 U 5/2022
CN 216751854 U 6/2022
CN 216751855 U 6/2022
CN 217133280 U 8/2022
CN 217133770 U 8/2022
CN 217550626 U 10/2022
CN 217589621 U 10/2022
CN 307592104 S 10/2022
CN 217820056 U 11/2022
CN 113870223 A 12/2022
CN 115512480 A 12/2022
CN 218260123 U 1/2023
CN 218313632 U 1/2023
CN 218329991 U 1/2023
CN 218332714 U 1/2023
CN 218336838 U 1/2023
CN 112672145 B 2/2023
CN 218497120 U 2/2023
DE 10031532 10/2001
EP 0116970 12/1991
EP 0654003 5/1995
EP 1168253 1/2002
EP 1270905 1/2003
EP 1703436 9/2006
EP 2701450 2/2014
EP 2810219 12/2014
EP 2974137 A4 4/2017
EP 3206194 A1 8/2017
EP 3255753 12/2017
EP 2428072 1/2018
EP 3295434 A1 3/2018
FR 3047833 B1 3/2018
GB 2167553 5/1986
GB 202012494 9/2020
GB 202209941 7/2022
GR 20210100761 7/2022
HK 30014296 A 8/2020
IL 241616 A 12/2015
JP H7112801 5/1995
JP H7334583 12/1995
JP H11242005 9/1999
JP H11334851 12/1999
JP 2000121564 4/2000
JP 2000171409 A 6/2000
JP 2000180371 6/2000
JP 3123095 1/2001
JP 2001312766 11/2001
JP 2002019147 1/2002
JP 2002183286 6/2002
JP 2002259528 9/2002
JP 2002302252 10/2002
JP 2002324264 11/2002
JP 2002358354 12/2002
JP 2003016179 1/2003
JP 2003139516 5/2003
JP 2003230229 8/2003
JP 2003242243 8/2003
JP 2003264007 9/2003
JP 2003267509 9/2003
JP 2004021569 1/2004
JP 2004191496 7/2004
JP 2004226129 8/2004
JP 2004226328 8/2004
JP 2004239850 8/2004
JP 2004288143 10/2004
JP 2004303102 10/2004
JP 2004341681 12/2004
JP 2005063203 3/2005
JP 2005122059 5/2005
JP 2005308476 11/2005
JP 2006127308 5/2006
JP 2006195814 7/2006
JP 2006203451 8/2006
JP 2006227764 8/2006
JP 2006260246 9/2006
JP 2007141266 6/2007
JP 2007155455 6/2007
JP 2007179516 7/2007
JP 2007265340 10/2007
JP 2008045959 2/2008
JP 2008059403 3/2008

(56) References Cited

FOREIGN PATENT DOCUMENTS

| | | | |
|---|---|---|---|
| JP | 2008522299 | | 6/2008 |
| JP | 2008293391 | | 12/2008 |
| JP | 2007086725 | | 4/2009 |
| JP | 2009175035 | | 8/2009 |
| JP | 2009245058 | | 10/2009 |
| JP | 2009250971 | | 10/2009 |
| JP | 2009290852 | | 12/2009 |
| JP | 2010177720 | | 8/2010 |
| JP | 2010276896 | | 12/2010 |
| JP | 2011518387 | | 6/2011 |
| JP | 2012032370 | | 2/2012 |
| JP | 2012504832 | | 2/2012 |
| JP | 2012058932 | | 3/2012 |
| JP | 2013033361 | | 2/2013 |
| JP | 2013037441 | | 2/2013 |
| JP | 2013531823 | | 8/2013 |
| JP | 2014513829 | | 6/2014 |
| JP | 2015505999 | | 2/2015 |
| JP | 2015513135 | | 4/2015 |
| JP | 2016504900 | | 2/2016 |
| JP | 6050922 | | 12/2016 |
| JP | 2017040957 | | 2/2017 |
| JP | 2017093938 | | 6/2017 |
| JP | 2017142781 | | 8/2017 |
| JP | 2017173902 | | 9/2017 |
| JP | 2017201559 | | 11/2017 |
| JP | 6266065 | | 3/2018 |
| JP | 2018520453 | | 7/2018 |
| JP | 2019012474 | | 1/2019 |
| JP | 2019513262 | | 5/2019 |
| JP | 3223233 | U | 9/2019 |
| JP | 2020526847 | | 8/2020 |
| JP | 2021530786 | | 11/2021 |
| JP | 2022539909 | A | 9/2022 |
| JP | 2022539910 | A | 9/2022 |
| JP | 2022539912 | A | 9/2022 |
| JP | 2022545336 | A | 9/2022 |
| KR | 20000064168 | | 11/2000 |
| KR | 20010074614 | | 8/2001 |
| KR | 20010097567 | | 11/2001 |
| KR | 100581234 | | 5/2006 |
| KR | 100766860 | | 10/2007 |
| KR | 20130085255 | | 7/2013 |
| KR | 101326680 | | 11/2013 |
| KR | 101329949 | | 11/2013 |
| KR | 20140037543 | | 3/2014 |
| KR | 101599251 | | 3/2016 |
| KR | 20180088062 | | 8/2018 |
| KR | 20180088063 | | 8/2018 |
| KR | 1020180086617 | | 8/2018 |
| KR | 20180117278 | | 10/2018 |
| KR | 20190026131 | | 3/2019 |
| KR | 20190107593 | | 9/2019 |
| KR | 20190107595 | | 9/2019 |
| KR | 20190107596 | | 9/2019 |
| KR | 1020190107594 | | 9/2019 |
| KR | 1020200115308 | | 10/2020 |
| KR | 20210020717 | | 2/2021 |
| KR | 1020210059148 | | 5/2021 |
| KR | 1020210107515 | | 9/2021 |
| WO | 8503790 | | 8/1985 |
| WO | 2001015096 | | 3/2001 |
| WO | 2002005176 | | 1/2002 |
| WO | 221090 | | 3/2002 |
| WO | 2002025613 | | 3/2002 |
| WO | 2002039357 | | 5/2002 |
| WO | 2003012717 | | 2/2003 |
| WO | 2003014994 | | 2/2003 |
| WO | 2004021114 | | 3/2004 |
| WO | 2004114490 | | 12/2004 |
| WO | 2005008566 | | 1/2005 |
| WO | 2005054877 | | 6/2005 |
| WO | 2005101346 | | 10/2005 |
| WO | 2006021825 | | 3/2006 |
| WO | 2006058601 | | 6/2006 |
| WO | 2006080851 | | 8/2006 |
| WO | 2007066166 | | 6/2007 |
| WO | 2009089607 | | 7/2009 |
| WO | 2009128173 | | 10/2009 |
| WO | 2009128176 | | 10/2009 |
| WO | 2009129526 | | 10/2009 |
| WO | 2010040116 | | 4/2010 |
| WO | 2010128267 | | 11/2010 |
| WO | 2010128315 | | 11/2010 |
| WO | 2011115857 | A2 | 9/2011 |
| WO | 2011131016 | | 10/2011 |
| WO | 2012073126 | | 6/2012 |
| WO | 2012138679 | | 10/2012 |
| WO | 2013002748 | | 1/2013 |
| WO | 2013063042 | | 5/2013 |
| WO | 2013074819 | | 5/2013 |
| WO | 2013116256 | | 8/2013 |
| WO | 2014033350 | | 3/2014 |
| WO | 2014075055 | | 5/2014 |
| WO | 2014088978 | | 6/2014 |
| WO | 2014141180 | | 9/2014 |
| WO | 2015022409 | | 2/2015 |
| WO | 2015093676 | | 6/2015 |
| WO | 2015108864 | | 7/2015 |
| WO | 2015146026 | | 10/2015 |
| WO | 2016181224 | | 11/2016 |
| WO | 2015196175 | | 12/2016 |
| WO | 2016196175 | | 12/2016 |
| WO | 2017034441 | | 3/2017 |
| WO | 2017081527 | | 5/2017 |
| WO | 2017156046 | | 9/2017 |
| WO | 2018003026 | | 1/2018 |
| WO | 2018124669 | | 7/2018 |
| WO | 2018133068 | | 7/2018 |
| WO | 2018146374 | | 8/2018 |
| WO | 2019012305 | | 1/2019 |
| WO | 2019012505 | | 1/2019 |
| WO | 2019012506 | | 1/2019 |
| WO | 2019212513 | | 11/2019 |
| WO | 2019212515 | | 11/2019 |
| WO | 2019008943 | | 4/2020 |
| WO | 2020082991 | | 4/2020 |
| WO | 2020204503 | | 10/2020 |
| WO | 2021019286 | | 2/2021 |
| WO | 2021082918 | | 5/2021 |
| WO | 2021082919 | | 5/2021 |
| WO | 2021082920 | | 5/2021 |
| WO | 2021082921 | | 5/2021 |
| WO | 2021082922 | | 5/2021 |
| WO | 2021082923 | | 5/2021 |
| WO | 2021142009 | | 7/2021 |
| WO | 2021147385 | | 7/2021 |
| WO | 2021147386 | | 7/2021 |
| WO | 2021147387 | | 7/2021 |
| WO | 2021147388 | | 7/2021 |
| WO | 2021172803 | | 9/2021 |
| WO | 2022034298 | | 2/2022 |
| WO | 2022090999 | | 5/2022 |
| WO | 2022091000 | | 5/2022 |
| WO | 2023073248 | | 5/2023 |

OTHER PUBLICATIONS

3GPP Organizational Partners, “3rd Generation Partnership Project; Technical Specification Group Terminals; AT command set for GSM Mobile Equipment (ME),” Global System for Mobile Communications, 1998, 124 pages.

Aftermarket Cellular Accessories, “Cellular Phone Model Identification,” retrieved from http://web/archive.org/web/20060328064957/http://aftermarketcellular.com/ic/identification.html on Mar. 16, 2014, published Mar. 28, 2006, 3 pages.

Altec Lansing User’s Guide 2007, 8 pages.

Anderle, Megan, “Verizon’s new app aims to make phone recycling easy and profitable”, Internet Article, May 1, 2014, XP093222792, retrieved from the Internet: URL: https://www.theguardian.com/sustainable-business/verizon-mobile-phone-recycling-cell-ecoatm.

Bhule et al., “Environmental and economic trade-offs in consumer electronic products recycling: a case study of cell phones and

(56) References Cited

OTHER PUBLICATIONS computers," IEEE International Symposium on Electronics and the Environment, Conference Record, 2004.
Bournique, D.: "Mobile Karma Shuts Down as iCloud and Blacklists Challenge Used Phone Buyers", Prepaid Phone News, Jul. 23, 2014 (Jul. 23, 2014), XP055229747, Retrieved from the Internet <URL:http://www.prepaidphonenews.com/2014/07/mobile-karma-shuts-down-as-icloud-and.html>; accessed Nov. 27, 2017; 2 pages.
Business Wire, "The World's First Office Photography Machine" at CES 2008 Launched by Ortery Technologies, Jan. 7, 2008, 3 pages.
CNET, "Tackling LCD "burn ins", and dead/stick Pixels", published Sep. 2, 2009, retrieved from http://www.cnet.com/news/tackling-lcd-burn-ins-and-deadstuck-pixels/.
Cybercom Group Europe AB, "OMSI Forum," Downloads, 2005, 2 pages.
Cybercom Group Europe AB, "OMSI Provides Easy Service and Maintenance for Mobile Phones," Press Release, 2005, 1 page.
Cybercom Group Europe AB, "The OMSI 2.0 Interface Supports," OMSI 2.0 Description, available at least before Oct. 2008, 1 page.
Cybercom Group, "Leading Telecom Organisations Address Device Management Issues," Press Release, 2007, 1 page.
Evgenii Masunov, Mar. 25, 2010, http://www.appleinsider.ru/news/ipone-obladaet-luchshim-tachskrinom-provereno_robotom.html, 4 pages.
Foster et al., "Automated Visual Inspection: a Tutorial" 1990 Computers Ind. Eng. vol. 18(4): 493-504.
Geekanoids, You Tube Video, "Apple iphone 3GS Unboxing and Review", uploaded on Jun. 19, 2009, retrieved from http://www.youtube.com/watch?v=GCEi9QAeDqk on Sep. 2, 2009.
Geyer et al. "The economics of cell phone reuse and recycling," The International Journal of Advanced Manufacturing Technology, 47(5): 515-525, 2010.
Graffia et al., "Retail Station for E-Device Identification, Assessment, and Trade-In", Jun. 6, 2014 (Drawings and Specification) (Year: 2014).
Grose, Thomas; "New Life for Old Phones," ASE Prism 22.3 (2012): 18.
GSM Arena Glossary, "LCD (Liquid Crystal Display", retrieved from http://www.gsmarena.com/glossary.php3?term=lcd on Apr. 28, 2016, 1 page.
Hassan, et al.; "A Novel Cascaded Deep Neural Network for Analyzing Smart Phone Data for Indoor Localization", Dec. 2019, vol. 101, pp. 760-769, Future Generation Computer Systems.
Hazelwood, et al.; "Life Extension of Electronic Products: a Case Study of Smartphones", Sep. 20, 2021, IEEE Access, vol. 9, pp. 144726-144739, DOI: 10.1109/ACCESS.2021.3121733.
International Numbering Plan. Retrieved on Apr. 5, 2013 at <http://web.archive.org/web/20070322214125/http://www.numberingplans.com/?page+analysis&sub+imeinr>, 2 pages.
International Search Report and Written Opinion Jun. 10, 2014 in International Application No. PCT/US24/15849, pp. all.
Investopedia: What's the difference between weighted average accounting and FIFO/LIFO accounting methods? Aug. 19, 2010. Accessed via archive.org [https://web.archive.org/web/20100819200402/http://www.investopedia.com/ask/answers/09/weighted-average-fifo-lifo-accounting.asp].
Kanter, James Max, "Color Crack:Identifying Cracks in Glass," dated Dec. 9, 2014; retrieved from the internet http://www.jmaxkanter.com/static/papers/color_crack.pdf on Sep. 22, 2017.
Kuriyan, et al.: "Review of Research on Rural PC Kiosks," Apr. 14, 2007, 22 pages, retrieved at http://research.microsoft.com/research/tem/kiosks.
Lambert, Emily, "Use It up, Wear It Out", Forbes 175.5 (2005): 77-78. Business Source Complete. Web. Jan. 6, 2015, 3 pages.
Littleton Partners with Donations Ink (Jan. 19, 2006) US Fed News Service, Including US State News. Web. Jan. 6, 2015, 1 page.
MobileGazette.com, "2006 in Review: the Good, the Bad and the Ugly", published Dec. 2006, retrieved from http://www.mobilegazette.com/2006-review-06x12x22.htm on Nov. 11, 2015.
Novotny, et al.; "Smart City Concept, Applications and Services," Aug. 26, 2014, Journal of Telecommunications System & Management, vol. 3, Issue 2, pp. 1-8, DOI: 10.4172/2167-0919.1000117.
Oliveira, et al., "Automatic crack detection on road imagery using anisotropic diffusion and region linkage," 18th European Signal Processing Conference (EUSIPCO-2010), Aug. 23, 2010, pp. 274-278.
Park, et al., "Ambiguous Surface Defect Image Classification of AMOLED Displays in Smartphones", Jan. 26, 2016, IEEE Transactions on Industrial Informatics, vol. 12, Issue 2, pp. 597-607, DOI: 10.1109/TII.2016.2522191.
PC World, "Wipe Your Cell Phone's Memory Before Giving it Away", published Jan. 2006, retrieved from http://www.washingtonpost.com/wp-dyn/content/article/2006/01/30/AR2006013001144.html on Nov. 10, 2015.
Perng et al., "A Novel Vision System for CRT Panel Auto-Inspection", Journal of the Chinese Institute of Industrial Engineers, vol. 24, No. 5, pp. 341-350 (2007).
Perng et al., "A Novel Vision System for CRT Panel Auto-Inspection", Proceedings of the 2005 IEEE International Conference on Mechatronics, Jul. 10-12, 2005, pp. 4.
Phifer, "How to Use your 3G Phone as a Wireless Broad Band Modem," Computer Weekly News, 2007, 6 pages.
Rawson, Chris, "TUAW: 25 Ways to Check the Hardware on Your iPhone 4", published Aug. 12, 2010, retrieved at http://www.tuaw.com/2010/08/13/hardware-test-your-iphone-4/ on Feb. 28, 2014.
Rehg et al. "Vision for a Smart Kiosk", Jun. 1997, Computer Vision and Pattern Recognition, pp. 690-696.
RMS Communications Group, "RMS Communications Group Inc. opens cell phone kiosk at Ocean City Mall in Toms River, N.J.", retrieved from http://www.prweb.com/releases/2004/11/prweb177351.htm, Nov. 12, 2004, 2 pages.
Rolf Steinhilper "Remanufacturing: the Ultimate Form of Recycling", Fraunhofer IRBVerlag, 1998, parts 1-3, http://www.reman.org/Publications_main.htm.
Romano "Recycling a Phone at EcoATM is an Easy Route to Feeling Green," Xconomy, Jan. 22, 2014, pp. 1-3.
Rosebrock, "How to Build a Kick-Ass Mobile Document Scanner in Just 5 Minutes" PyImage Search, Sep. 2014, 19 pages.
Shotton et al., "Efficiently Combining Contour and Texture Cues for Object Recognition", Proceedings of the British Machine Vision Conference 2008, (Sep. 1, 2008), pp. 7.1-7.10 * abstract *.
Shue, Jiuh-Biing et al. "Extended consumer responsibility: Syncretic value-oriented pricing strategies for trade-in-for-upgrade programs" Transportation Research Part E: Logistics and Transportation Review 122 (2019) 350-367.
SimplySellular, "Get Cash for your Old Cell Phone", published Apr. 2, 2010, retrieved from http://simplysellular.com/conditions.php on Jan. 6, 2015, 2 pages.
Sony Ericsson Mobile Communications Ab, "P800/P802," White Paper, 2003, 128 pages.
Sony Ericsson Mobile Communications AB, "T68i/T68ie," White Paper, 2002, 71 pages.
TecAce Software: "Android Smartphone Testing App—Movaluate—TecAce Software | PRLog" Internet Article, May 6, 2013, XP093222769, retrieved from the Internet: URL: https://www.prlog.org/12132313-android-smartphone-testing-app-movaluate.html.
Tecace Software: "Your phone appraisal-Movaluate -Android Apps on Google Play", Android Apps on Google Play, Aug. 12, 2013 (Aug. 12, 2013), XP055230264, Retrieved from the Internet <URL:https://play.google.com/store/apps/details?id=com.tecace.android.app.movaluate&hl=en>; accessed Nov. 27, 2017; 2 pages.
Tech Spurt; Sandisk iXpand Review, Wireless Charger & Auto Photo Backup!, Aug. 21, 2019, 1 page, retrieved at https://www.youtube.com/watch?v=zemKQ6xULww.
Trading devices for dollars, The Economist (US) 405.8813:8 (US), Economist Intelligence Unit N.A. Incorporated, Dec. 1, 2012.
Turner, "5 MP3 Players for Pumping up Your Workouts," Mashable.com, Nov. 4, 2010, available online at https://mashable.com/2010/11/04/mp3-players-for-sports/ (Year: 2010).
Watson; "Review: SanDisk iXpand Wireless Charger" Sep. 15, 2019, 4 pages retrieved at https://www.whatmobile.net/Reviews/article/review-sandisk-ixpand-wireless-charger.

(56) References Cited

OTHER PUBLICATIONS

Waugh, “Phone recycling machine lets you drop in old mobiles—and spits out cash instantly,” Daily Mail Online, Jan. 13, 2012, p. 1-2.
Wikipedia, “Machine Vision” Sep. 19, 2009, 6 pages.
Wiley Encyclopedia of Computer Science and Technology, Nov. 2008, 2362 pages, Wiley-interscience, ISBN-10:0471383937, ISBN-13: 978-0471383932.
Wilson, Doug, “Liquid Crystal Display (LCD) Inspection System”, National Instruments Case Study, available May 10, 2009, retrieved from http://sine.ni.com/cs/app/cod/p/id/cs-345 on Jan. 5, 2015, 2 pages.
Wu, “Overview of Wireless Power and Data Communication” WPC/QI Developers Forum, Oct. 29, 2016, 21 pages.
Yahoo Answers, “What is a Clean ESN?” published Jun. 23, 2009, retrieved from http://web.archive.org/web/20090623215042/http://answers.yahoo.com/question/inde,8020US?qid=20080318061012AANFRco on Apr. 3, 2014.
Zhang, Yiyang, “The design of glass crack detection system based on image preprocessing technology,” 2014 IEEE 7th Joint International Information Technology and Artificial Intelligence Conference, IEEE, Dec. 20, 2014; pp. 39-42.
Huang et al., “Construction of an Automatic Inspection system using capability of identifying Color Characteristics of Products,” 2008, pp. 1-6 (Year 2006).
Nithi et al., “Smart Power Management for Mobile Handsets”.
Shi, “The LOB Recreation Model: Predicting the Limit Order Book from TAQ History Using an Ordinary Differential Equation Recurrent Neural Network” 548-556. The Thirty-Fifth AAAI Conference on Artificial Intelligence. 2021; <DOI: 10.48550/arXiv.2103.01670> abstract; p. 551, 2nd column, 1st paragraph; p. 552, 1st column, 1st paragraph; fig. 3.
Tuzun, “Usability testing of a 3D touch screen kiosk system for way-finding,” Computers in Human Behavior vol. 61, Aug. 2016, pp. 73-79.

* cited by examiner 320
216
338a
325
338b
358a-c
324
327
322
380
378
212
210
F
222
586a
586b
366a,b
334

586a
210
378
586b
D1

D2

R1

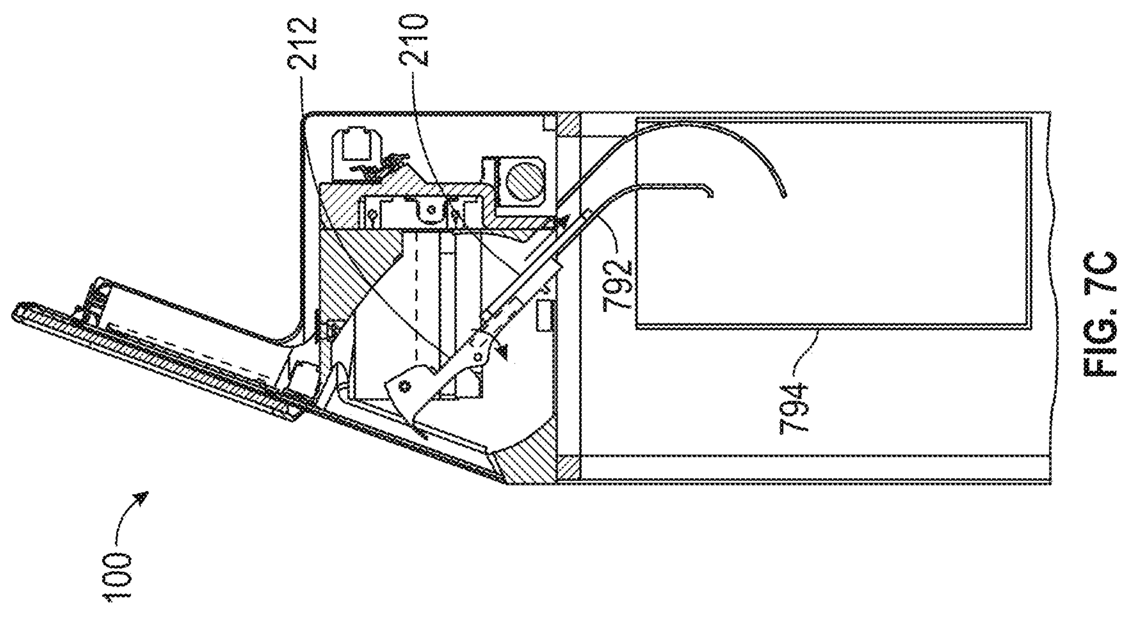
FIG. 7C
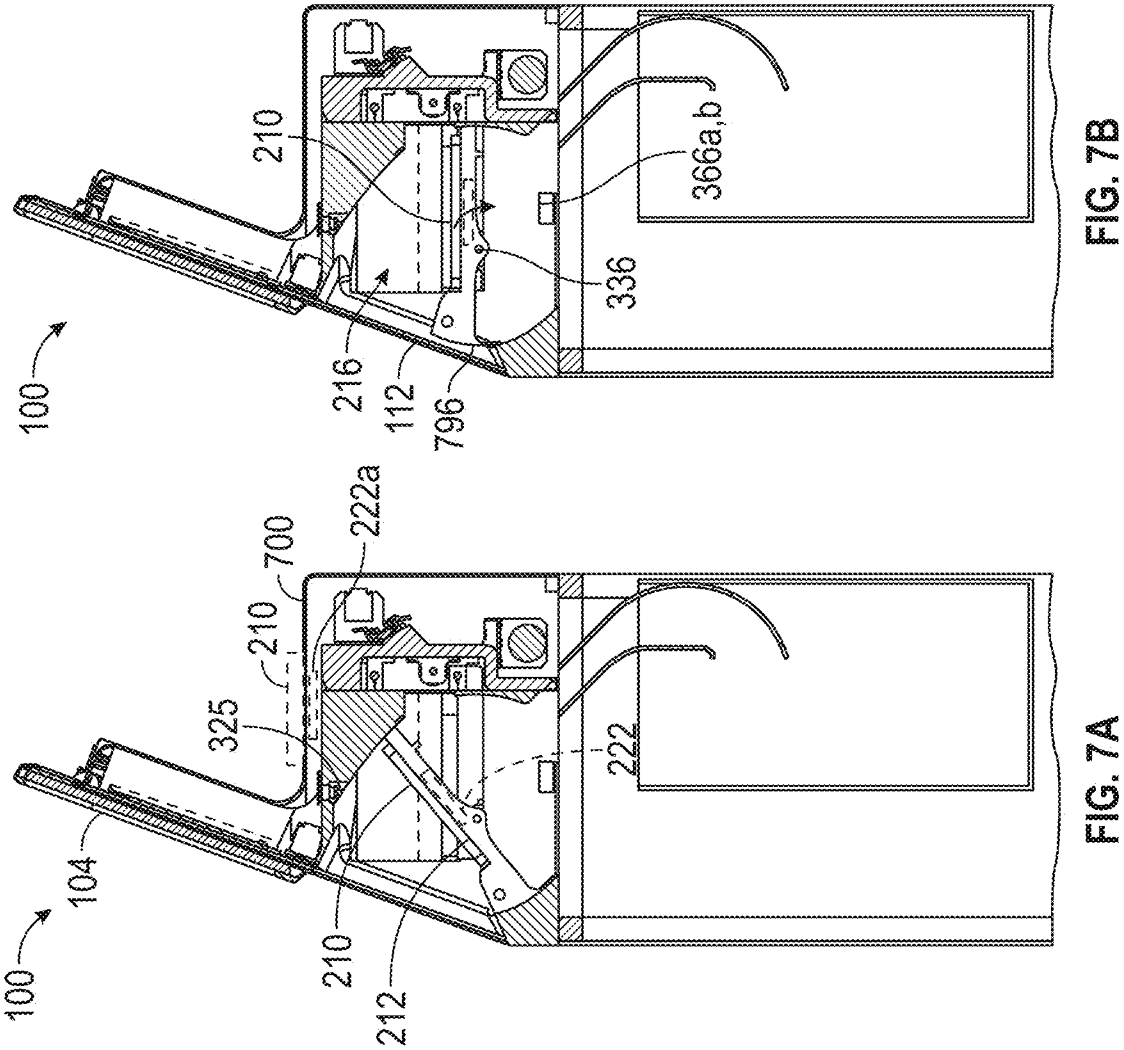
FIG. 7B
FIG. 7A

KIOSK FOR EVALUATING AND PURCHASING ELECTRONIC DEVICES AND ASSOCIATED METHODS OF MANUFACTURE AND USE

CROSS-REFERENCE TO RELATED APPLICATION(S)

The present application claims priority to U.S. Provisional App. No. 63/484,972, filed Feb. 14, 2023, and is a continuation-in-part of U.S. application Ser. No. 17/445,082, filed Aug. 13, 2021; a continuation-in-part of U.S. application Ser. No. 17/445,158, filed Aug. 16, 2021; and a continuation-in-part of Ser. No. 17/445,083, filed Aug. 13, 2021. The entirety of each of the above-identified applications is incorporated by reference herein.

TECHNICAL FIELD

The present disclosure is directed generally to kiosks and associated apparatuses, systems and methods for evaluating and/or purchasing mobile phones and other electronic devices from users.

BACKGROUND

There are more mobile phones and other electronic devices (e.g., laptop computers, notebooks, tablets, PDAs, MP3 players, wearable smart devices, etc.) in use now than there are people on the planet. The rapid growth of electronic devices is due in part to the rapid pace at which they evolve. Because of the rapid pace of development, a relatively high percentage of electronic devices are replaced every year as consumers continually upgrade to obtain the latest features or a better operating plan. According to the U.S. Environmental Protection Agency, the United States alone disposes of over 370 million mobile phones, PDAs, tablets, and other electronic devices every year. Millions of other outdated or broken mobile phones and other electronic devices are simply tossed into junk drawers or otherwise kept until a suitable disposal solution arises.

Although many electronic device retailers and cell carrier stores now offer trade-in or buyback programs, many old devices still end up in landfills or are improperly disassembled and disposed of in developing countries. Unfortunately, mobile phones and similar devices typically contain substances that can be harmful to the environment, such as arsenic, lithium, cadmium, copper, lead, mercury, and zinc. If not properly disposed of, these toxic substances can seep into groundwater from decomposing landfills and contaminate the soil with potentiality harmful consequences for humans and the environment.

As an alternative to retailer trade-in or buyback programs, consumers can recycle and/or sell their used mobile phones using self-service kiosks located in malls, retail stores, or other publicly accessible areas. Such kiosks are operated by ecoATM, LLC, the assignee of the present application, and embodiments of these kiosks are described in, for example: U.S. Pat. Nos. 8,463,646, 8,423,404, 8,239,262, 8,200,533, 8,195,511, and 7,881,965, each of which is incorporated herein by reference in its entirety.

There continues to be a need for improving the means available to consumers for recycling or reselling their mobile phones and other electronic devices. Simplifying the recycling/reselling process, enhancing the consumer experience, and discouraging fraud can incentivize consumers to dispose of their old electronic devices in an efficient and environmentally conscientious way.

BRIEF DESCRIPTION OF THE DRAWINGS

FIGS. 7A-7C are a series of cross-sectional side views of the kiosk of FIG. 1 illustrating three stages of operation of the inspection tray, in accordance with embodiments of the present technology.

Figure 2A:
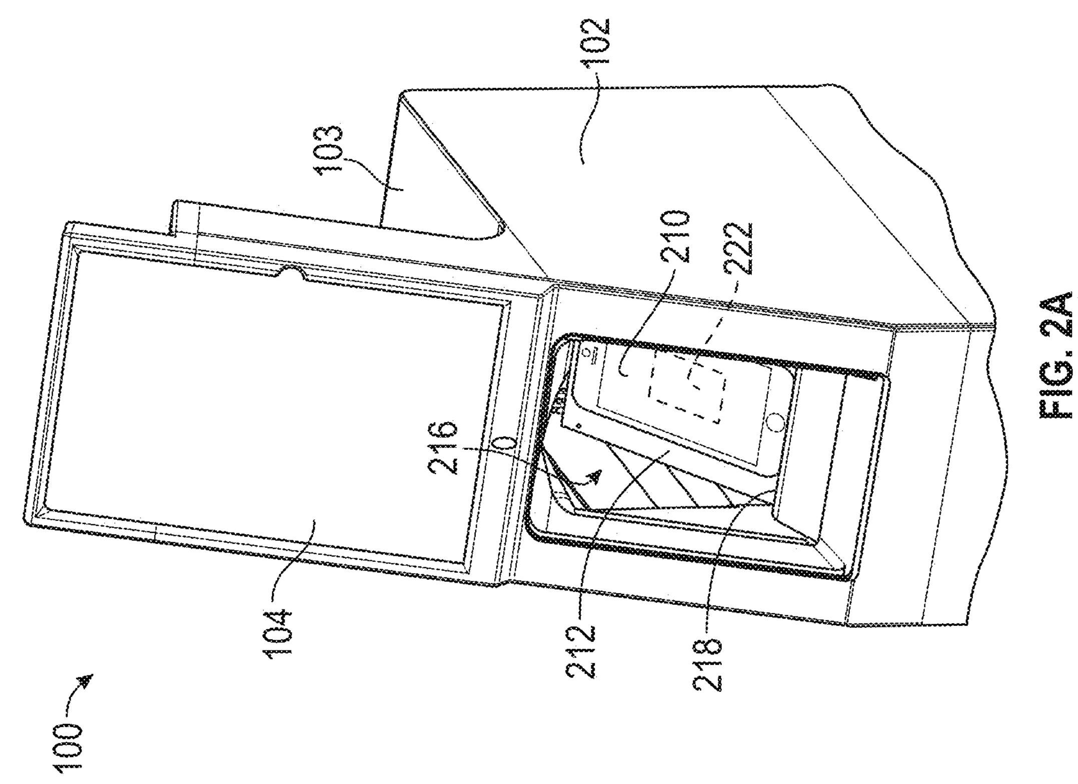
FIGS. 2A-2C are a series of enlarged isometric views illustrating structures and functions associated with an inspection area of the kiosk of FIG. 1, configured in accordance with embodiments of the present technology.

The technologies described herein will become more apparent to those skilled in the art from studying the Detailed Description in conjunction with the drawings. Embodiments or implementations describing aspects of the present technology are illustrated by way of example, and the same references can indicate similar elements. While the drawings depict various implementations for the purpose of illustration, those skilled in the art will recognize that alternative implementations can be employed without departing from the principles of the present technologies.

Accordingly, while specific implementations are shown in the drawings, the technology is amenable to various modifications.

DETAILED DESCRIPTION

The following disclosure describes various embodiments of systems, apparatuses and methods that enable users to sell and/or recycle mobile phones and other electronic devices. In some embodiments, the systems described herein include a kiosk configured to receive information from an electronic device and provide a user (e.g., of the electronic device and/or the kiosk) with an initial offer to purchase the device. If the user declines the initial offer, the kiosk can inform the user of a potentially higher offer based on a further evaluation of the device. In some embodiments, if the user agrees to the further evaluation, then the kiosk can perform one or more tests, such as an electrical inspection of the device and/or a visual inspection of the device (e.g., performed within the kiosk), to determine whether a higher offer is available for the device. If so, the higher offer can be displayed or otherwise extended to the user. If not, in some embodiments the kiosk can prompt the user to run additional tests on the device using, e.g., analysis software loaded onto the device, to determine whether a higher offer is available for the device. In some embodiments, the user may remove their device from the kiosk to run the additional tests. If, after performing the additional tests, the kiosk determines that the device is worth a higher offer, then the kiosk can instruct the user to place the device back in the kiosk to receive the higher offer. In one aspect of the present technology, if the user decides to accept the higher offer and places the device back in the kiosk, the kiosk can verify that the received device is the same device that underwent the additional testing (e.g., outside the kiosk), and not a different device (e.g., an untested device of lesser value). After the kiosk verifies that the device is the same device that underwent the additional testing, the kiosk can facilitate providing compensation to the user for the device.

In some embodiments, the systems described herein include a kiosk or other structure having a wireless charger in, or proximate to, a device inspection area. As described in greater detail below, in various embodiments, the wireless charger can be used to obtain information about a device (e.g., a mobile phone) placed in proximity to the wireless charger, and the information can be used to determine a price quote for the device. For example, in some embodiments, the systems described herein can include a kiosk that utilizes a wireless charger to obtain information about a device, e.g., as part of the charging process. This information can include, for example, the make of the device. The kiosk can also guide the user to navigate through or otherwise interact with the device (via, e.g., user interaction with the device touchscreen) and cause the device to display additional information such as model, memory capacity, a unique identifier (e.g., an International Mobile Equipment Identity (IMEI) number), and/or a carrier of the device. The kiosk can capture and evaluate the displayed information via, for example, a camera and an associated Optical Character Recognition (OCR) system. Embodiments of such OCR systems are described in U.S. patent application Ser. No. 17/445,083, titled EVALUATING AN ELECTRONIC DEVICE USING OPTICAL CHARACTER RECOGNITION and filed on Aug. 13, 2021, and U.S. Provisional Patent Application No. 63/116,020, titled EVALUATION AN ELECTRONIC DEVICE USING OPTICAL CHARACTER RECOGNITION and filed on Nov. 19, 2020, both of which are incorporated herein by reference in their entireties.

In some embodiments, based on the unique identifier, the kiosk and/or associated systems can determine additional information about the device, such as whether the device has been stolen. If the device has not been stolen, the kiosk can determine an estimated price or price range for the device based on the obtained information and present the price or price range to the user. The price range can include a high price and a low price. If the user wishes to proceed and sell the device, the kiosk can inform the user that further inspection of the device may be necessary (to, for example, inspect the device display screen for cracks) before the high price can be paid, and that this additional inspection may take a few minutes. If the user does not wish to wait, the user can accept the low price and the kiosk can proceed to enable purchase of the device for the lower price. If instead the user wishes to have the device further inspected so that they can obtain a higher price, the kiosk can proceed to enable further inspection of the device and then offer a more accurate (and likely higher) price based on the more thorough inspection. In some embodiments, the kiosks and other systems described herein can further inspect the device by means of one or more cameras that image the device for visual inspection of, e.g., the device display screen for cracks or other damage, and/or an electrical cable that connects to the device and performs an electrical inspection of, e.g., device functionality.

The following disclosure also describes various embodiments of kiosk systems and apparatuses that can turn a mobile device over in an inspection area of the kiosk. As described in detail below, the apparatus (which may be referred to as a "flipping apparatus") enables the kiosk to obtain images of a first side of a mobile phone (e.g., a front side) with one or more cameras positioned above the phone, and then use the same one or more cameras to obtain images of a second side (e.g., a back side) of the mobile phone after the phone has been flipped over. Accordingly, one benefit of some embodiments of the kiosks disclosed herein is that the flipping apparatus eliminates the need to position cameras both above and below a mobile device for visual inspection. Additionally, in some embodiments the apparatus is operable to hold the phone in a non-horizontal orientation (e.g., an edgewise, partially edgewise, or inclined orientation) so that one or more cameras positioned, e.g., above the phone can obtain images of the left side and/or the right side of the phone without the need for mirrors.

Certain details are set forth in the following description and in FIGS. 1-13C to provide a thorough understanding of various embodiments of the present technology. In other instances, well-known structures, materials, operations, and/or systems often associated with smartphones and other handheld mobile electronic devices, consumer electronic devices, computer hardware, software, and network systems, etc., are not shown or described in detail in the following disclosure to avoid unnecessarily obscuring the description of the various embodiments of the present technology. Those of ordinary skill in the art will recognize, however, that the present technology can be practiced without one or more of the details set forth herein, or with other structures, methods, components, and so forth.

The terminology used below is to be interpreted in its broadest reasonable manner, even though it is being used in conjunction with a detailed description of certain examples of embodiments of the technology. Indeed, certain terms may even be emphasized below; however, any terminology intended to be interpreted in any restricted manner will be specifically defined as such in this Detailed Description section.

The accompanying Figures depict embodiments of the present technology and are not intended to be limiting of its scope. Component details may be abstracted in the Figures to exclude details such as position of components and certain precise connections between such components when such details are unnecessary for a complete understanding of how to make and use the invention. Many of the details, dimensions, angles, and other features shown in the Figures are merely illustrative of particular embodiments of the present technology. Accordingly, other embodiments can have other details, dimensions, angles, and features without departing from the spirit or scope of the present disclosure. In addition, those of ordinary skill in the art will appreciate that further embodiments of the present technology can be practiced without several of the details described below. In the Figures, identical reference numbers identify identical, or at least generally similar, elements. To facilitate the discussion of any particular element, the most significant digit or digits of any reference number refers to the Figure in which that element is first introduced. For example, element 110 is first introduced and discussed with reference to FIG. 1.

Figure 1:
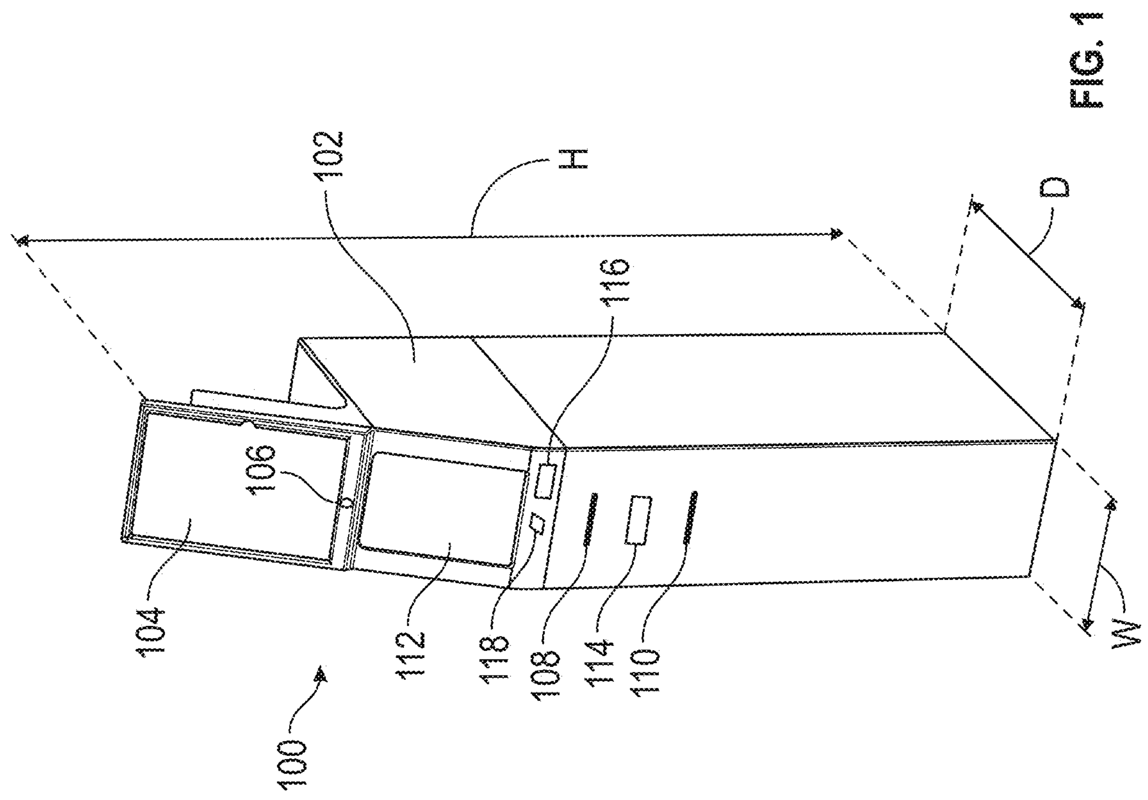
FIG. 1 is an isometric view of a consumer operated kiosk for purchasing mobile electronic devices from users, configured in accordance with embodiments of the present technology.

FIG. 1 is an isometric view of a consumer operated kiosk 100 for purchasing mobile phones and/or other electronic devices from users, configured in accordance with embodiments of the present technology. The kiosk 100 includes an enclosure or housing 102 that supports a display screen 104 positioned above an inspection area access door 112. In some embodiments, the display screen 104 is positioned at an incline relative to a horizontal plane (e.g., at an angle of from about 10 degrees to about 89 degrees, an angle of from about 30 degrees to about 85 degrees, an angle of from about 60 degrees to about 80 degrees, or an angle of about 70 degrees, relative to the horizontal plane) to facilitate viewing of the display screen 104 by a user. In other embodiments, the display screen 104 can be positioned in other suitable orientations including, for example, a vertical orientation (e.g., a 90 degree angle relative to the horizontal plane). The access door 112 can be formed from, e.g., various types of plastic (e.g., polyethylene, polycarbonate, etc.), glass, etc. that can be transparent, opaque, or solid. The housing 102 can be manufactured from, for example, sheet metal, plastic panels, etc., in a conventional manner. By way of example only, in some embodiments, the kiosk 100 can have a width W of from about 7 inches to about 14 inches, or from about 8 inches to about 9 inches; a depth D of from about 12 inches to about 18 inches, or from 14 inches to about 15 inches; and an overall height H of from about 3 feet to about 5 feet, or about 4 feet. The foregoing dimensions are but one example; in other embodiments, kiosks configured in accordance with the present disclosure can have other dimensions without departing from the present disclosure.

A plurality of user interface devices are provided on a front portion of the housing 102 for providing instructions and other information to users, and/or for receiving user inputs and other information from users. For example, in some embodiments, the display screen 104 can include a liquid crystal display (LCD) or a light emitting diode (LED) display screen, a projected display (such as a heads-up display or a head-mounted device), and so on, for providing information, prompts, etc. to users. The display screen 104 can also display one or more graphical user interfaces (GUIs), including one or more touch screens, for receiving user input and responses to displayed prompts. In addition or alternatively, the kiosk 100 can include a separate keyboard or keypad for receiving user inputs. The kiosk 100 can also include an ID reader or scanner 108 (e.g., a driver's license scanner), a fingerprint scanner 118, and one or more external cameras 106 (e.g., digital still and/or video cameras). The kiosk 100 can additionally include output devices such as a label printer (e.g., a barcode label printer) having an outlet 116, a payment (e.g., cash, voucher, coupon, etc.) dispenser having an outlet 110, and/or a receipt dispenser having an outlet 114. Although not identified in FIG. 1, the kiosk 100 can further include, e.g., a speaker and/or a headphone jack for audibly communicating information to users, one or more lights for visually communicating signals or other information to users, a handset or microphone for receiving verbal input from the user, a card reader (e.g., a credit/debit card reader, loyalty card reader, etc.), as well as other user input and/or output devices. Additionally, the kiosk 100 can also include a barcode reader (for reading, e.g., a barcode displayed on a mobile device), a QR code reader (for reading, e.g., a QR code displayed on a mobile device), a package or bag dispenser (e.g., a shipping package dispenser), a digital signature pad, etc. The user interface devices described above are representative of such devices that can be included with some embodiments of the kiosk 100. Depending on the particular use case or commercial application, other embodiments of the kiosks disclosed herein can include other devices, or one or more of the above devices may be omitted. Accordingly, embodiments of the kiosk 100 are not limited to the type or arrangement of user interface devices described above.

Figure 2C:
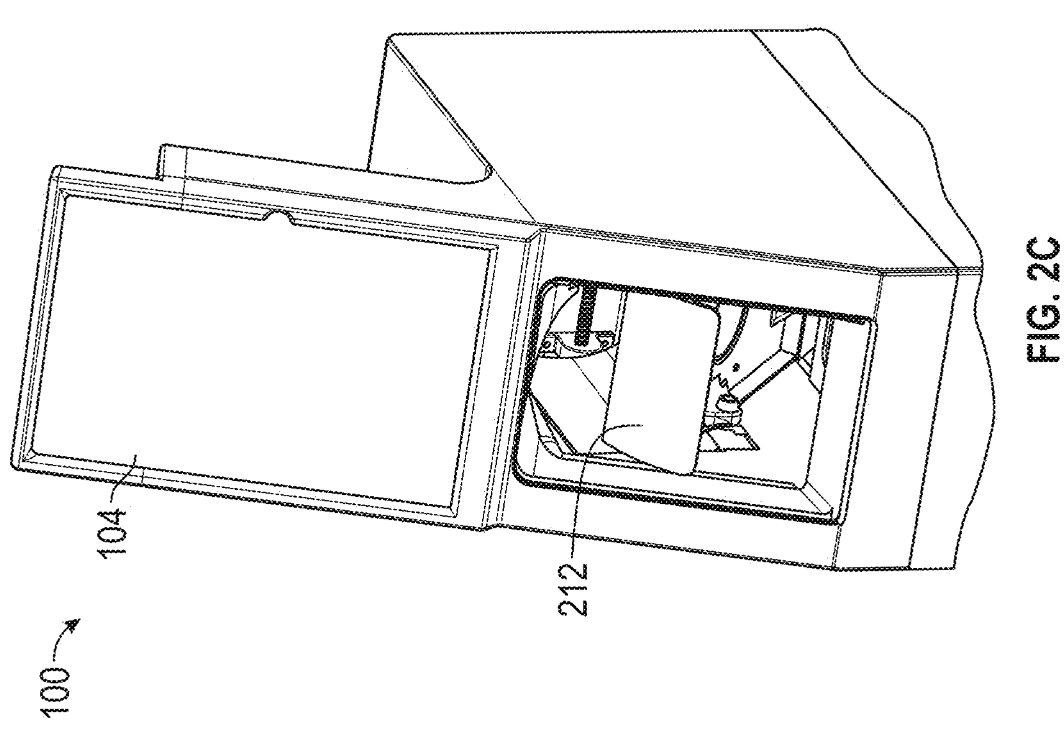
Figure 2B:
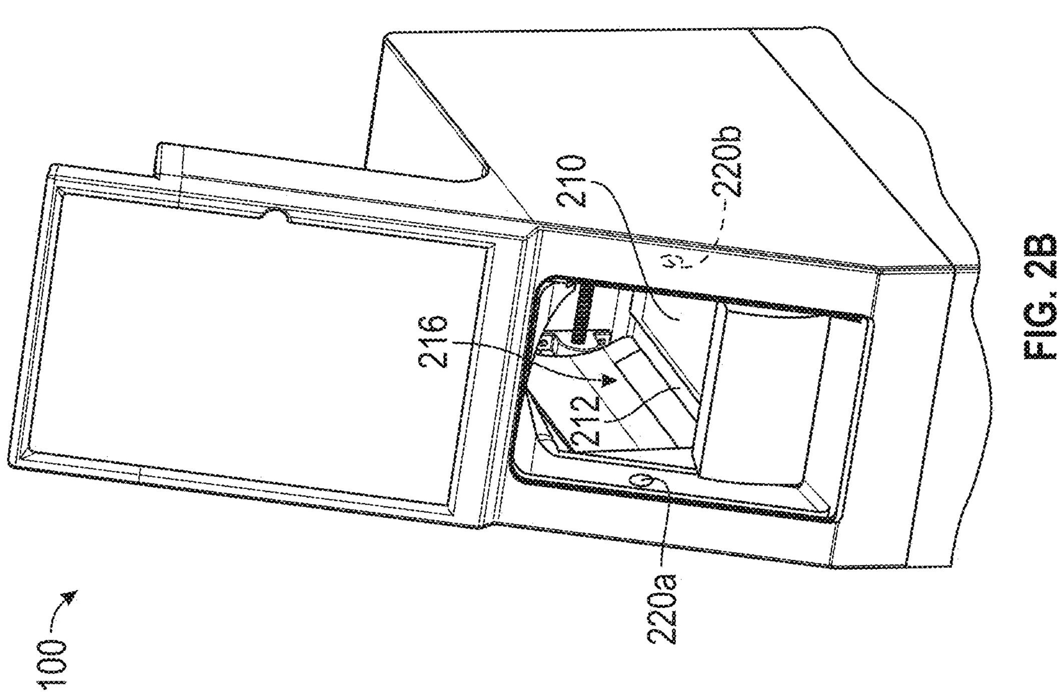

FIGS. 2A-2C are a series of enlarged isometric views illustrating structures and functions associated with an inspection area 216 of the kiosk 100, configured in accordance with embodiments of the present technology. Referring first to FIG. 2A, in some embodiments, a user wishing to sell an electronic device (e.g., a used mobile phone 210) via the kiosk 100 would first approach the kiosk 100 and follow prompts displayed on the display screen 104. Such prompts, for example, may ask the user what type of phone they wish to sell/trade, who the carrier is, etc. In response to receiving the user's input, the access door 112 (FIG. 1) retracts upwardly behind the display screen 104 to expose the inspection area 216. In other embodiments, the access door 112 may be stored in the retracted position. The inspection area 216 includes an inspection tray 212 having a shelf 218. As can be seen in FIG. 2A, in some embodiments the inspection tray 212 is initially positioned at an incline relative to a horizontal plane (e.g., at an angle greater than 0 degrees but less than 90 degrees, an angle of from about 10 degrees to about 85 degrees, an angle of from about 20 degrees to about 70 degrees, an angle of from about 30 degrees to about 60 degrees, or an angle of about 35 degrees relative to the horizontal plane). In other embodiments, however, the inspection tray 212 can initially be positioned in other suitable orientations including, for example, a horizontal orientation (e.g., a non-inclined orientation), etc. In some embodiments, the user is instructed (via, e.g., prompts on the display screen 104) to position the mobile phone 210 on the shelf 218 so that the phone (e.g., a display screen of the phone) is facing outwardly toward the user with the electrical connector receptacle on the mobile phone 210 facing downwardly toward the shelf 218, as shown in FIG. 2A. In other embodiments, the user may be instructed to position the mobile phone 210 on the shelf 218 so that the phone (e.g., a display screen of the phone) is facing inwardly toward the inspection tray 212. In some embodiments, the user may also be asked to turn on the mobile phone 210.

In some embodiments, the kiosk 100 includes a wireless charger 222 positioned in relatively close proximity to the mobile phone 210 when the phone is positioned on the inspection tray as shown in FIG. 2A. For example, in the illustrated embodiment, the wireless charger 222 is mounted to the backside of the inspection tray 212 (which could also be referred to as the underside of the inspection tray 212). The wireless charger 222 can be, for example, a "Qi wireless charger" that functions in accordance with the Qi open interface standard that defines wireless power transfer using inductive charging over distances of up to, e.g., about 1.6 inches. In operation, the wireless charger 222 can provide a quick charge to the mobile phone 210 if it is placed on the inspection tray 212 without power. Additionally, as described in greater detail below, in some embodiments, the wireless charger 222 can receive certain information about the mobile phone (e.g., make, model, a unique 32-bit identifier associated with the phone, and/or Qi standard, etc.) as part of the charging process. In these and/or other embodiments, the wireless charger 222 or another wireless charger can be positioned elsewhere on and/or in the kiosk 100, such as on an upper surface portion 103 of the housing 102, above the inspection area 216, behind the kiosk display screen 104, etc. Accordingly, embodiments of the present technology are not limited to the use of one or more wireless charges in any particular location on and/or in the kiosk 100 unless the context clearly requires otherwise. In some embodiments, the wireless charger 222 can be omitted.

In some embodiments, identifying the unique ID of the mobile phone 210 and maintaining the wireless connection between the wireless charger 222 and the mobile phone 210 during the kiosk transaction enables the kiosk 100 to monitor and/or detect whether the user attempts to switch the mobile phone 210 with another mobile phone (e.g., another mobile phone of the same model but lesser value) at any time during the transaction. For example, if the connection between the wireless charger 222 and the mobile phone 210 is broken, the kiosk 100 can require that the connection with the mobile phone 210 be reestablished prior to purchasing the mobile phone 210. Reestablishing the connection can involve receiving the unique ID in the header packet of the wireless charging protocol. By obtaining the unique ID in the header packet, the kiosk 100 can identify whether the mobile phone 210 has been switched for a different phone or other object. If so, the kiosk 100 can stop the transaction, display a warning to the user, and/or take other steps to prevent the user from committing fraud by pricing one phone but actually selling the kiosk a different phone of, for example, a lesser value.

In some embodiments, the information obtained from the wireless charger 222 may include only the make (e.g., the manufacturer or provider) of the mobile phone 210. In most instances, the make of the mobile phone 210 will be only a part of the information needed to provide an accurate price quote for the device. After receiving the make of the mobile phone 210, the kiosk 100 can offer to purchase the mobile phone 210 from the user for a low price based solely on the make of the phone. In at least some embodiments, however, the kiosk 100 can offer to perform a more thorough evaluation of the mobile phone 210, including, e.g., an electrical and/or visual inspection of the mobile phone 210 and/or one or more tests performed on the mobile phone 210 by the user and facilitated via a software application loaded on the mobile phone 210, and potentially offer the user a higher price if the user is willing to wait for the more thorough evaluation to be completed.

If the user decides to wait and authorizes the kiosk 100 to perform a more thorough evaluation, the kiosk 100 can instruct the user (via, e.g., prompts displayed on the kiosk display screen 104) how to navigate (e.g., via touch) menus on the mobile phone 210 while it is positioned on the inspection tray 212, e.g., as shown in FIG. 2A, to cause the mobile phone 210 to display information about the device, such as the model, the carrier, memory capacity, unique identification number (e.g., an IMEI number), etc. The kiosk 100 can adjust its user interface and/or the instructions presented to the user based on the make of the mobile phone 210 obtained, e.g., via the wireless charger 222. For example, the kiosk's user interface and/or the instructions presented to the user via the display screen 104 for Google® devices may be different than the user interface and/or the instructions presented for Apple® devices based at least in part on the different operating systems, settings, and/or menus of those devices. A camera (not shown in FIG. 2A) in or proximate the inspection area 216 can capture one or more images of the information displayed on the mobile phone 210, and in some embodiments an OCR system associated with the kiosk 100 can extract the device information from the images. Embodiments of such OCR systems are described in U.S. patent application Ser. No. 17/445,083 and U.S. Provisional Patent Application No. 63/116,020, filed on Nov. 19, 2020, both of which are incorporated herein by reference in their entireties. Other embodiments are described in U.S. patent application Ser. No. 17/445,158 and U.S. Provisional Patent Application No. 63/066,794, filed on Aug. 17, 2020, both of which are also incorporated herein by reference in their entireties. As described in greater detail below, e.g., with reference to FIG. 12, the information obtained by the wireless charger 222 and/or the associated OCR system can be used to present a more accurate price or price range to the user without the need to connect a cable from the kiosk 100 to the mobile phone 210.

If the kiosk 100 cannot obtain the information necessary to accurately price the mobile phone 210 by guiding the user to navigate the phone display because, for example, the user cannot follow the instructions provided, or because the user does not want to spend the time to follow the instructions, the kiosk 100 can present an electrical connector configured to connect to the mobile phone 210. For example, as described in greater detail below, in some embodiments, the kiosk 100 can present the appropriate electrical connector (not shown) by extending it outwardly through an aperture in the shelf 218, so that the user can connect the mobile phone 210 to the connector when he/she positions the mobile phone 210 on the shelf 218 as shown in FIG. 2A. The kiosk 100 can determine the appropriate electrical connector to present to the user based on the make of the mobile phone 210 (e.g., as determined via the wireless charger 222). The appropriate electrical connector can also be selected by the kiosk 100 in response to, for example, user responses to questions presented on the display screen 104 regarding the type of phone the user wishes to sell. After the user connects the mobile phone 210 to the appropriate electrical connector, the kiosk 100 can perform an electrical inspection of the device to obtain the additional device information via the electrical connector as described below with reference to FIG. 2B. In some embodiments, the kiosk 100 can perform the electrical inspection via the electrical connector when the inspection tray 212 is in the position shown in FIG. 2A. In other embodiments, the kiosk 100 can perform an electrical inspection of the mobile phone 210 when the inspection tray 212 is rotated to the position shown in FIG. 2B.

Before or after the kiosk 100 obtains the additional device information, the kiosk can perform a visual inspection of the mobile phone 210 to determine defects with the mobile phone 210 (e.g., whether the device screen is cracked or whether the phone 210 has other physical damage), as also described below with reference to FIG. 2B. For example, when the screen of the mobile phone 210 is cracked, the price offered for the mobile phone will be lower than if the screen is not cracked. After obtaining the device information and performing the visual inspection, the kiosk 100 can present a more accurate price for the mobile phone 210 to the user.

Turning next to FIG. 2B, the inspection tray 212 has been rotated rearwardly from the inclined position of FIG. 2A into a horizontal position so that the mobile phone 210 is facing upwardly in the inspection area 216. Although in some embodiments the access door 112 (FIG. 1) would normally be closed during this stage of kiosk operation, the access door 112 is not shown in FIG. 2B (or FIG. 2C) to better illustrate operation of the inspection tray 212 and the inspection area 216. As noted above, the kiosk 100 can perform an electrical inspection of the mobile phone 210 via the electrical connector to, e.g., identify the phone and further evaluate the condition of the phone and/or one or more specific components and/or operating parameters thereof, such as memory, carrier, etc. For example, in some embodiments, the kiosk 100 (e.g., a kiosk central processing unit (CPU) or other processing device) can query the mobile phone 210 (by using, e.g., an operating system API) to obtain characteristic information about the mobile phone 210, which can include device identification, make, model, and/or configuration. In other embodiments, the characteristic information can further include device functionality, including hardware/software configuration, charging capability, memory capacity, etc. Information necessary to identify and/or evaluate a mobile device such as the mobile phone 210 can include, for example, a unique identifier (e.g., an IMEI number or an MEID or equivalent number of a mobile phone, a hardware media access control address (MAC address) of a networkable device, or a model number and serial number of the electronic device), information describing the device manufacturer (e.g., a manufacturer name or ID code), model, characteristics and capabilities (e.g., CPU type and speed, storage capacity (SRAM, DRAM, disk, etc.)), wireless carrier, radio bands (frequency ranges and encodings such as CDMA, GSM, LTE, etc.), color, and/or condition, and so on. In other embodiments, the electrical analysis can include evaluating the condition and/or functionality of the charging circuit of the electronic device. In some embodiments, the kiosk 100 can perform the electrical analysis using one or more of the methods and/or systems described in detail in the patents and patent applications identified herein and incorporated herein by reference in their entireties.

Although the embodiments described above include establishing an electrical connection between the mobile phone 210 and the kiosk 100 via an electrical connector, in other embodiments, the kiosk 100 can establish a wireless connection with the mobile phone 210 to facilitate performing all or a portion of the phone evaluation and purchase steps described herein. For example, in some embodiments, the kiosk 100 can include a wireless radio transceiver that is accessible by electronic devices (e.g., the mobile phone 210). The kiosk 100 can establish a wireless connection with the mobile phone 210 by providing connection instructions and/or authentication information for the user to enter via the mobile phone 210 and/or via the display screen 104. For example, the kiosk 100 can direct the user to make the mobile phone's Bluetooth connection discoverable, and/or can provide a Bluetooth pairing code that the user can type or otherwise input on a screen of the phone or on the touchscreen of the kiosk 100. As another example, the kiosk 100 can provide a Wi-Fi network name and/or password that, when selected and/or entered on a user's phone, enables the user to wirelessly connect a device to the indicated Wi-Fi network.

In other embodiments, establishing the connection can include providing a set of indicia (e.g., machine readable indicia such as a visual code(s) or image(s) (e.g., a QR code, barcode, etc.)) for the user to scan using the mobile phone 210, such that scanning the code or image prompts the phone to connect to the kiosk's wireless network (e.g., upon user confirmation). In some embodiments, the code, image, and/or other indicia may be displayed on the kiosk display screen 104 and/or on another surface of the kiosk 100 via, e.g., a sticker or other graphic medium. Examples of a series of codes/indicia are described in U.S. Provisional Patent Application No. 63/220,381, titled IDENTIFYING ELECTRONIC DEVICES USING TEMPORALLY CHANGING INFORMATION, and filed on Jul. 9, 2021, U.S. Provisional Patent Application No. 63/220,890, titled IDENTIFYING ELECTRONIC DEVICES USING TEMPORALLY CHANGING INFORMATION, and filed on Jul. 12, 2021, and U.S. patent application Ser. No. 17/811,548, titled IDENTIFYING ELECTRONIC DEVICES USING TEMPORALLY CHANGING INFORMATION, and filed on Jul. 8, 2022, each of which is incorporated by reference herein in its entirety. In some embodiments, establishing the connection can include allowing a particular wireless device to join or use the wireless network or make a wireless connection. For example, when the kiosk 100 detects the mobile phone 210 and determines that the device is registered for access or otherwise recognized, the kiosk 100 can automatically connect to the mobile phone 210 without requiring further user authentication, and/or the kiosk 100 can connect to the mobile phone 210 after receiving user confirmation. In other embodiments, the user can load a mobile app onto the mobile phone 210, and the app can evaluate the electronic device and facilitate wireless communication between the mobile phone 210 and the kiosk 100 to facilitate phone evaluation and purchase by the kiosk 100. Various systems and methods for establishing a wireless connection between the kiosk 100 and a mobile phone or other electronic device of a user are described in at least some of the patents and/or patent applications incorporated herein by reference in their entireties. In other embodiments, wireless connections between the kiosk 100 and mobile phones and other electronic devices can be established using other suitable means known in the art.

As noted above, in addition to performing an electrical inspection, the kiosk 100 can also perform a visual inspection of the mobile phone 210 using one or more cameras (not shown) positioned in the inspection area 216. In some embodiments, the visual inspection can include a 3D visual analysis (of, e.g., the shape and/or size of a phone) to confirm the identification of the phone (e.g., make and model) and/or to evaluate or assess the condition and/or function of the phone and/or its various components and systems. In some embodiments, the inspection tray 212 can be colored (e.g., colored green) so that the technique of chroma key compositing, or chroma keying (sometimes referred to as green screening if used with a green screen), can be used to, e.g., remove the inspection tray 212 from images of the mobile phone 210 obtained by the one or more cameras positioned in the inspection area 216. Chroma keying the images can provide better definition of the phone's physical features and enable the kiosk processor to better determine the size (e.g., width, height, and curvature) of the mobile phone 210 based on the images. As described in greater detail below, in other embodiments, rather than being green (or some other opaque color) the inspection tray 212 can be configured as a light table to enable the images to provide a more accurate silhouette of the mobile phone 210 for visual analysis of, e.g., phone dimensions, shape, etc.

The visual analysis can also include an inspection of the mobile phone 210 for cracks or other damage to the display screen (LCD), as well as cracks off of the display screen. In some embodiments, the visual inspection can include performing OCR to identify printed or displayed patterns, codes, and/or text, and comparing characteristics of the patterns, codes, and/or text (e.g., layout, size, font, color, etc.) to templates to determine the presence of device identifiers such as model number, serial number, IMEI number, etc. As described in greater detail below, the visual inspection can be performed with one or more cameras, and the kiosk 100 can perform the visual analysis using one or more of the methods and/or systems described in detail in the patents and patent applications identified herein and incorporated herein by reference in their entireties.

Some mobile phones include a unique identifier (e.g., an IMEI number) that is printed or otherwise formed on the phone's Subscriber Identification Module (also known as a "SIM" card) holder or tray. In some embodiments, the kiosk 100 can instruct the user to extract the SIM card tray from their phone and position the SIM card tray on the inspection tray 212 so that the kiosk can perform OCR of the IMEI number on the SIM card tray. Further, in some embodiments the inspection tray 212 can include a designated area or a small tray configured to hold the SIM card tray so that the kiosk camera can obtain an image of the IMEI number for OCR. In some mobile phones (e.g., older iPhones® and Samsung® phones), the IMEI number may be printed or otherwise formed on the back side of the phone (the side opposite the display screen). In some embodiments, the kiosk may prompt the user to place such a phone on the inspection tray 212 with the back side facing outward so that the kiosk camera can obtain an image of the IMEI number printed on the back side for OCR by the kiosk software.

As described in greater detail below, in one aspect of the illustrated embodiment, the inspection area 216 includes an apparatus configured to flip the mobile phone 210 when the inspection tray 212 is in the position shown in FIG. 2B so that the front side of the phone (which can also be referred to as a front surface or front face of the mobile phone 210 that includes, e.g., a display screen) is facing downwardly toward the inspection tray 212. This enables the kiosk 100 to perform a visual inspection of the back side of the mobile phone (which can also be referred to as a back surface or back face of the mobile phone, e.g., the side opposite the front side) using the same imaging system (e.g., camera systems, lighting systems, etc.) that were used to inspect the front side of the mobile phone 210. This feature eliminates the need to place the mobile phone 210 on a transparent surface and provide cameras below the transparent surface to visually inspect the back side of the mobile phone 210. In addition to saving cost, this feature can also save space and reduce the size of the kiosk 100. In some embodiments in which the mobile phone 210 is first placed on the inspection tray 212 with the back side of the phone 210 facing outwardly (away) from the inspection tray 212, the apparatus can flip the mobile phone 210 over when the inspection tray 212 is in the position shown in FIG. 2B so that the front side of the phone is facing upwardly and away from the inspection tray 212, thereby enabling the kiosk 100 to perform a visual inspection of the front side of the mobile phone 210 after performing a visual inspection of the back side.

In some embodiments, the kiosk 100 can include a security feature that can detect if a user reaches into the inspection area 216 at an inappropriate time. For example, the security feature can detect if the user reaches into the inspection area 216 when the inspection tray 212 is in the position shown in FIG. 2B to, e.g., remove the mobile phone 210 and/or switch it for another phone. In some embodiments, the security feature can include a break-beam sensor system having an emitter 220*a* (e.g., infrared (IR) emitter, a laser beam emitter, etc.) mounted to a sidewall portion of the inspection area 216 just inside the access door opening, and a corresponding sensor 220*b* (e.g., an IR receiver, laser receiver, etc.) mounted to an opposite sidewall portion on the other side of the opening to detect the beam emitted by the emitter 220*a*. If the user extends their hand/arm through the access door opening, it will break the beam emitted by the emitter 220*a*, and the break in the beam will be sensed by the sensor 220*b*. The sensor 220*b* can be configured to send a corresponding signal to the kiosk processor, and the kiosk 100 can respond by stopping the transaction, displaying a warning to the user via the display 104, etc. In other embodiments, an internal camera positioned in the inspection area can be used by the kiosk 100 to detect if the user reaches into the inspection area 216 when the inspection tray is in the position shown in FIG. 2B. More specifically, the camera can be used to determine if a hand reaches into the inspection area 216 and swaps the mobile phone 210 for a different mobile phone. The different mobile phone can be of lower value than the mobile phone 210 and, upon detecting the attempted swap, the kiosk 100 can provide a warning to the user that the transaction has been terminated.

After the mobile phone 210 has been fully evaluated and the kiosk 100 has determined a purchase price (based, e.g., at least in part on the make and/or model of the mobile phone 210, the electrical inspection, and/or the visual inspection), the purchase price can be offered to the user via the display screen 104. The kiosk 100 can determine the purchase price based on the evaluation performed at the kiosk, by accessing one or more pricing databases, using one or more pricing models, etc. If the user accepts the purchase price offer (by, e.g., making a corresponding selection on a touch screen portion of the kiosk display screen 104), the access door 112 remains closed and the purchase transaction proceeds. For example, in some embodiments, the user may be prompted to place his or her identification (e.g., a driver's license) in the ID scanner 108 and provide a thumbprint via the fingerprint reader 118 (FIG. 1). As a fraud prevention measure, the kiosk 100 can be configured to transmit an image of the driver's license to a remote computer screen, and an operator at the remote computer can visually compare the picture (and/or other information) on the driver's license to the person standing in front of the kiosk 100 as viewed by one or more of the cameras 106 (FIG. 1) to confirm that the person attempting to sell the mobile phone 210 is in fact the person identified by the driver's license. In some embodiments, one or more of the cameras 106 can be movable to facilitate viewing of kiosk users, as well as other individuals in the proximity of the kiosk 100. Additionally, the user's biometric information (e.g., fingerprint, iris scan, etc.) can be checked against records of known fraud perpetrators.

Once the user's identity has been verified, the inspection tray 212 rotates further rearwardly from the horizontal position of FIG. 2B to the sloped or inclined position shown in FIG. 2C so that the mobile phone 210 can slide off of the inspection tray 212 and into a storage bin (not shown). (Although the access door 112 would normally be closed during this stage of operation, the access door 112 is omitted from FIG. 2C for purposes of illustrative clarity.) The kiosk 100 can then facilitate payment of the purchase price to the user. In some embodiments, payment can be made in the form of cash dispensed from the payment outlet 110. In other embodiments, the user can receive remuneration for the mobile phone 210 in various other useful ways. For example, the user can be paid via a redeemable cash voucher, a coupon, an e-certificate, a prepaid card, etc., that is dispensed from the kiosk 100; or via a gift code, redeemable voucher, coupon, e-certificate, etc., that is sent to the user via email, text, or other form of electronic message. Additionally, in some embodiments, the user can be paid via a wired or wireless monetary (e.g., cash) deposit to an electronic account (e.g., a bank account, credit account, loyalty account, online commerce account, mobile wallet, etc.) via, e.g., PayPal, Venmo, etc., or with cryptocurrency (e.g., Bitcoin), etc.

Alternatively, if the user declines the purchase price offer, or if the user's identity cannot be verified or the kiosk 100 otherwise determines that the transaction presents a fraud risk, the transaction can be declined and the mobile phone 210 returned to the user. More specifically, the inspection tray 212 rotates forwardly to the position illustrated in FIG. 2A and the access door 112 opens so that the user can retrieve the mobile phone 210 from the kiosk 100.

Figure 3A:
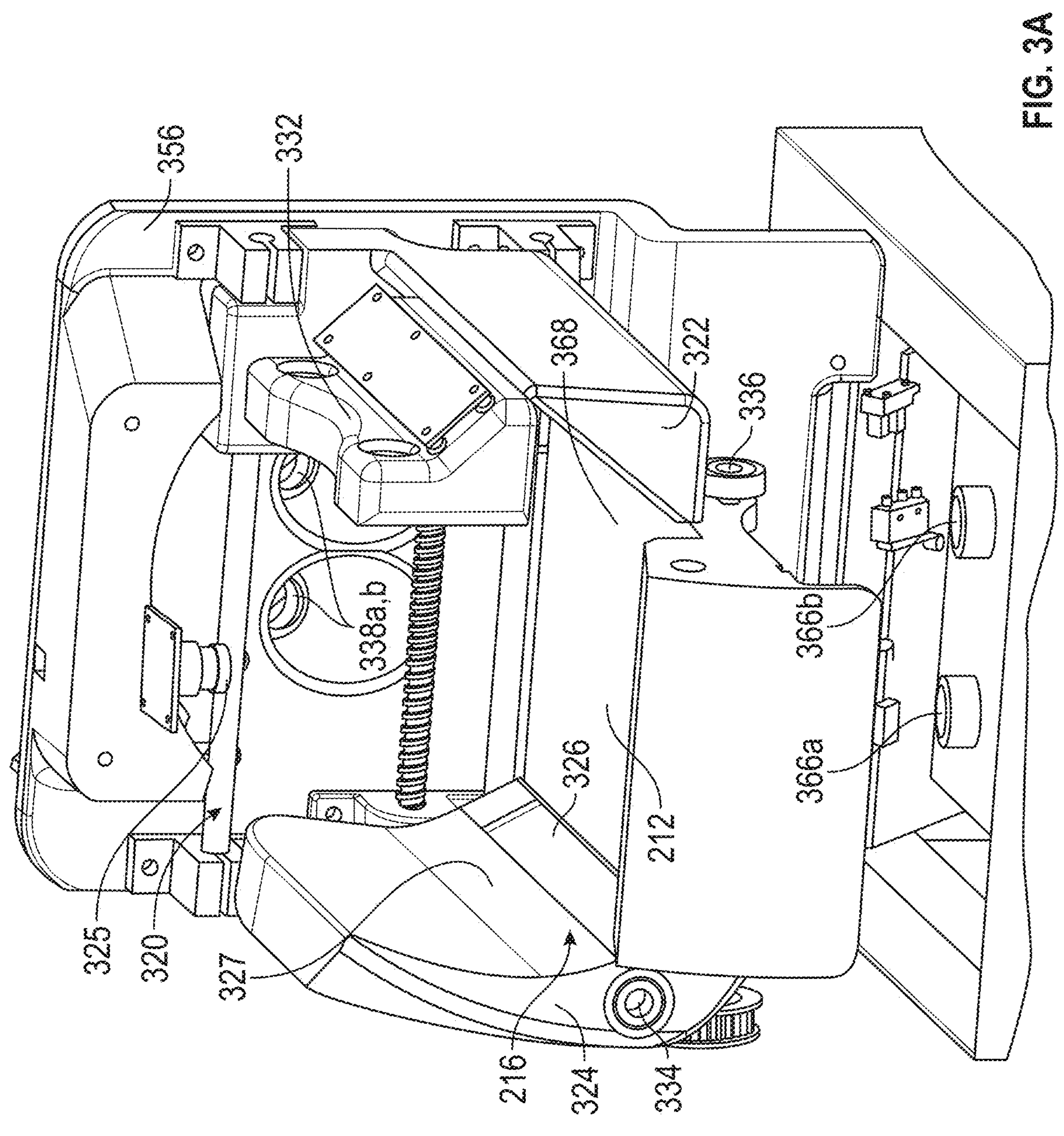
FIGS. 3A-3C are right front, left front, and left rear isometric views, respectively, of the inspection area of FIGS. 2A-2C with a housing and other exterior structures removed to better illustrate internal components associated with the inspection area.
Figure 3B:
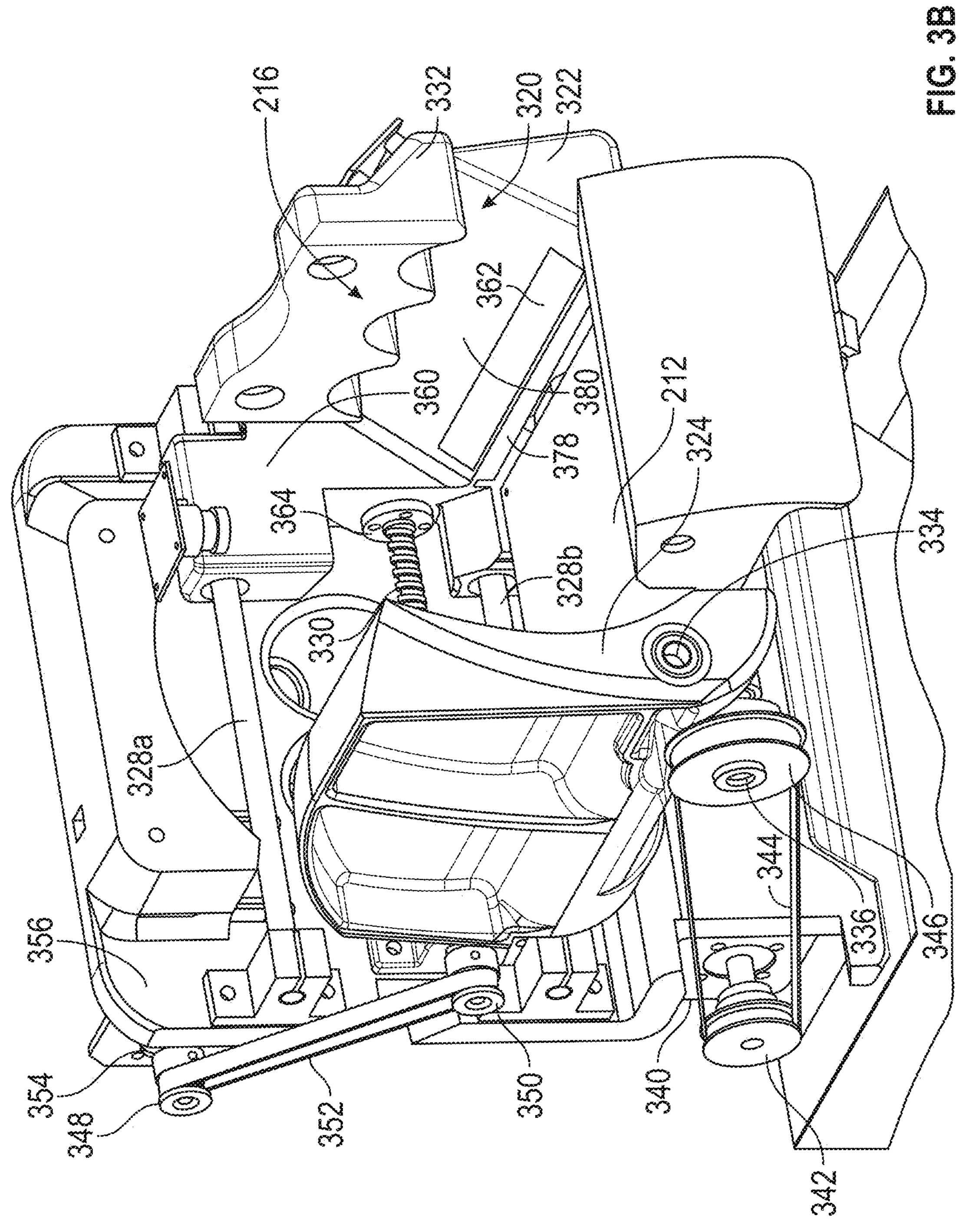
Figure 3C:
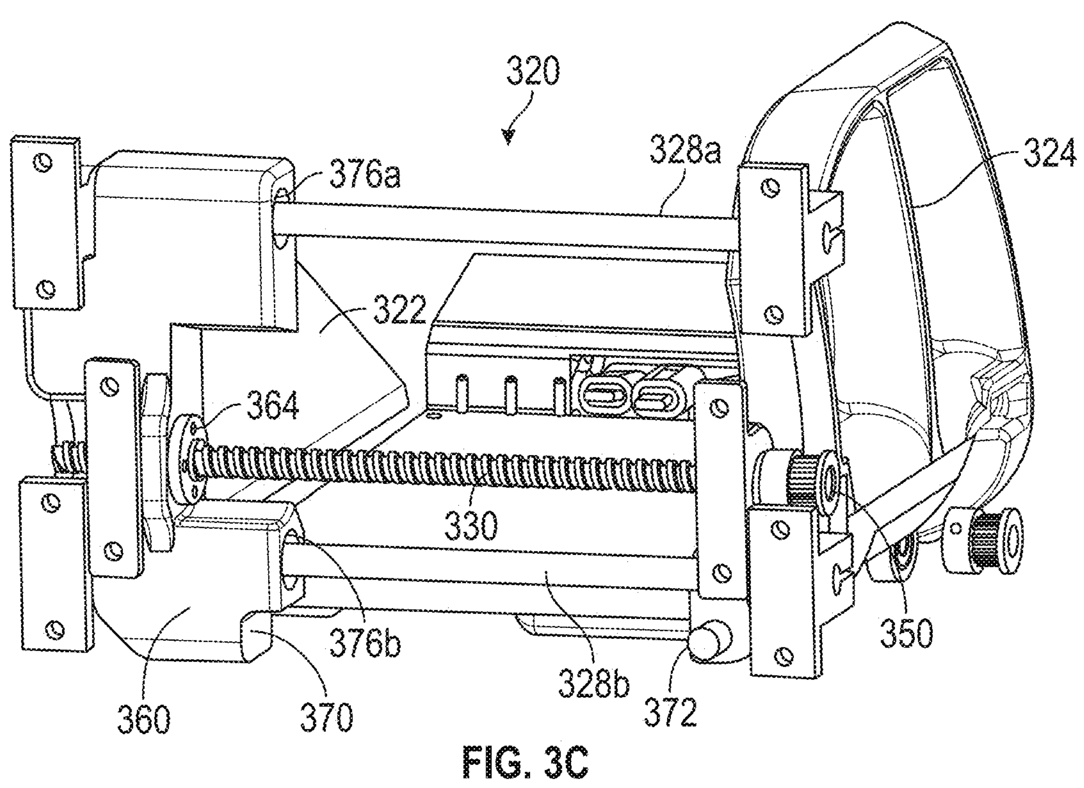
Figure 3D:
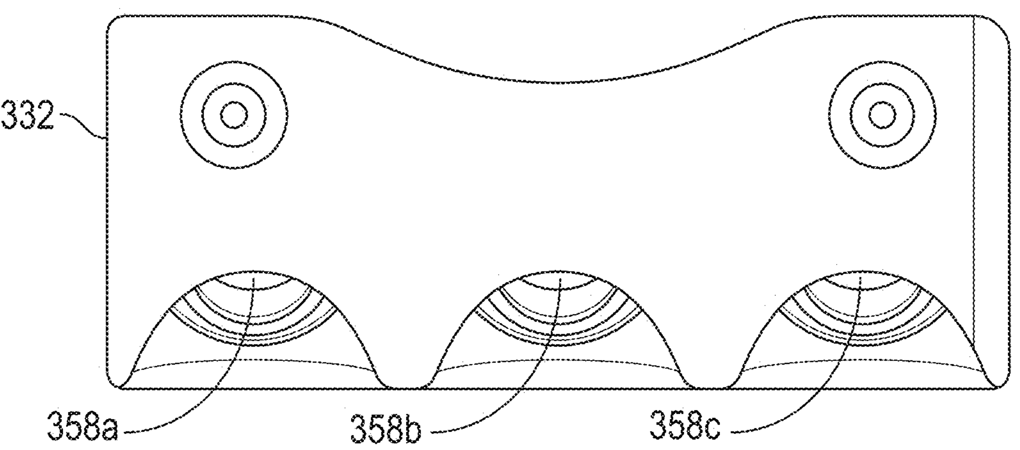
FIG. 3D is a front view of an inspection area light mount, configured in accordance with embodiments of the present technology.

FIGS. 3A-3C are right front, left front, and left rear isometric views, respectively, of the inspection area 216 with a number of external structures omitted to better illustrate certain operative components associated with the inspection area 216, and FIG. 3D is a front view of a light mount 332 that is used in the inspection area 216. Referring first to FIG. 3A, the inspection area 216 includes a camera 325 mounted above and directed downwardly toward the inspection tray 212. In some embodiments, the camera 325 can be configured to obtain still pictures and/or video images of mobile phones positioned on the inspection tray 212. In some embodiments, the camera 325 can include or be combined with one or more magnification tools, scanners, and/or other imaging components (e.g., other cameras) to view, photograph, and/or otherwise visually evaluate a mobile phone from multiple perspectives. Additionally, in some embodiments, the camera 325 can be movable to facilitate device visual inspection. In addition to the camera 325, the inspection area 216 can also include one or more lights directed toward the inspection tray 212 to facilitate the visual inspection of the mobile phone. For example, the inspection area can include a pair of lights 338*a*, 338*b* mounted in suitable bezels on a backplate 356. Similarly, as shown in FIG. 3D, the inspection area 216 can also include a plurality of lights 358*a-c* carried in suitable bezels on a light mount 332 that, as shown in FIG. 3A, is mounted generally above a pusher member 322 toward the right side of the inspection area 216.

As noted above, in some embodiments the inspection tray 212 can be configured as a light table. In such embodiments, the inspection tray 212 (or at least an inspection surface portion 368 of the inspection tray 212 upon which the mobile phone is placed) can be made from a translucent (e.g., semitransparent) material, such as a translucent glass or plastic. By way of example only, in some embodiments, the thickness of the translucent inspection surface portion 368 can be from about 0.08 inches to 0.25 inches, or about 0.12 inches. In such embodiments, the kiosk 100 can also include one or more lights 366*a* and 366*b* mounted to the kiosk chassis (or other adjacent kiosk structure) below the inspection area 216 and positioned to project light upwardly through the inspection tray 212 during visual inspection of, e.g., the mobile phone 210 (FIG. 2B). The lights 366*a*, 366*b* can include, for example, LEDs (such as white LEDs), fluorescent lights, incandescent lights, IR light, etc. Configuring the inspection tray 212 as a light table during visual evaluation of mobile phones can enhance the contrast and silhouette of the device as depicted in images of the device captured by the camera 325. This can facilitate more accurate evaluation of the size, shape, external features, etc. of a phone by the kiosk processor. Additionally, it is contemplated that in some embodiments the kiosk 100 can also include one or more UV light sources that can be positioned to project UV light on mobile phones in the inspection area 216 to clean the phones.

In the illustrated embodiment, the inspection area 216 further includes a flipping apparatus 320 having a pusher member 322 (which can also be referred to as, e.g., a "member 322," "pusher 322," etc.) operably positioned toward a right side of the inspection tray 212, and a ramp member 324 (which can also be referred to as, e.g., a "member 324," "ramp 324," etc.) operably positioned toward a left side of the inspection tray 212. As described in greater detail below, in operation, the pusher member 322 and the ramp member 324 cooperate to flip a mobile phone placed on the inspection tray 212 over from one side to the other side, such as from an upward-facing position to a downward-facing position. For example, if a mobile phone is positioned on the inspection tray 212 in an upwardly facing position (e.g., the front side of the phone (i.e., the side with the display screen) is facing upward and away from the inspection tray 212), the pusher member 322 and the ramp member 324 can cooperate to flip the phone over so that the back side of the phone is facing upward and away from the inspection tray. Similarly, if the mobile phone is positioned on the inspection tray 212 in a downwardly facing position (e.g., the front side of the phone is facing downward and toward the inspection tray 212), the pusher member 322 and the ramp member 324 can cooperate to flip the phone over so that the front side of the phone is facing upward and away from the inspection tray 212. Accordingly, it will be understood that embodiments of the flipping apparatus 320 can flip mobile phones over from either side to the other side and repeat the flipping process as necessary to position the phone in a desired orientation. However, those of ordinary skill in the art will appreciate that the pusher member 322 and/or the ramp member 324 are not essential to all embodiments of the present technology. For example, in some embodiments, the kiosk 100 can include flipping apparatuses having other configurations, such as one of the flipping apparatus configurations disclosed in U.S. patent application Ser. No. 18/167,390, titled APPARATUSES, SYSTEMS, AND METHODS FOR TURNING OVER ELECTRONIC DEVICES, AND ASSOCIATED KIOSKS FOR USE WITH SAME, and filed on Feb. 10, 2023, which is incorporated herein by reference in its entirety. In other embodiments, the flipping apparatus 320 can be omitted and the user can turn the mobile phone 210 over by hand if, e.g., needed or necessary to facilitate phone inspection, evaluation, identification, etc. For example, in some embodiments in which the flipping apparatus 320 may be omitted, the kiosk 100 can rotate the inspection tray 212 from the position shown in FIG. 2B to the position shown in FIG. 2A after one side (e.g., the front side) of the phone has been inspected with the inspection tray 212 in the position shown in FIG. 2B, and the user can be instructed by the kiosk 100 to manually turn the phone over on the inspection tray 212. After the user has turned the phone over, the inspection tray 212 can rotate back to the position shown in FIG. 2B so that the kiosk 100 can inspect the other side (e.g., the back side) of the phone.

In the illustrated embodiment, the ramp member 324 is pivotally mounted to a chassis (or other adjacent mounting structure not shown) by means of a horizontal pivot shaft 334. In the illustrated embodiment, the ramp member 324 includes a generally smooth, curved (e.g., radiused) concave surface 327 facing toward the pusher member 322. In some embodiments, a lower portion of the ramp member 324 can include a mirror 326 that enables the camera 325 to capture an image of the adjacent side of a mobile phone (not shown) positioned on the inspection tray 212. In the illustrated embodiment, the inspection tray 212 is pivotally mounted (via, e.g., bearings) to the chassis (or other adjacent support structure; not shown) by means of a horizontal pivot shaft 336 that is aligned with or otherwise defines a horizontal axis of rotation. In the illustrated embodiment, the pivot shaft 336 is fixedly attached to the inspection tray 212 and enables the inspection tray 212 to rotate about the horizontal axis between the positions shown in FIGS. 2A-2C. In other embodiments, the ramp member 324 and/or the inspection tray 212 can be pivotally or otherwise movably mounted to the chassis structure in other ways without departing from the present disclosure.

Turning next to FIG. 3B, a first pulley 346 is fixedly attached to a left end portion of the pivot shaft 336. The first pulley 346 is operably connected to a second pulley 342 by means of a drive belt 344 (e.g., a toothed rubber drive belt). The second pulley 342 is in turn fixedly attached to a drive shaft of a motor 340 (e.g., a stepper motor), which is mounted to a lower portion of the backplate 356. Accordingly, operation of the motor 340 (by, e.g., a kiosk controller; not shown) rotates the first pulley 346 by means of the second pulley 342 and the drive belt 344. Rotation of the first pulley 346 rotates the pivot shaft 336, which in turn rotates the inspection tray 212. In this manner, operation of the motor 340 can be used to rotate the inspection tray 212 between the three positions illustrated in FIGS. 2A-2C.

In the illustrated embodiment, the pusher member 322 includes a short vertical surface 378 extending upwardly adjacent to the upper surface of the inspection tray 212, and an angled surface 380 that extends upwardly from the vertical surface 582. The pusher member 322 extends forwardly from a base 360. The base 360 is slidably mounted on upper and lower guide shafts 328*a* and 328*b*, respectively. More specifically, in the illustrated embodiment, the base 360 includes two cylindrical bores 376*a* and 376*b* (FIG. 3C), and the guide shafts 328*a*, 328*b* can be cylindrical shafts that are slidably received in the corresponding bores 376*a*, 376*b*, respectively. The base 360 is movably coupled to a drive screw 330 by means of a threaded coupling 364 (e.g., a drive nut). An opposite end portion of the drive screw 330 is fixedly attached to a first pulley 350. As shown in FIG. 3B, the first pulley 350 is operably coupled to a second pulley 348 by means of a drive belt 352 (e.g., a toothed rubber drive belt). The second pulley 348 is fixedly attached to a drive shaft of an electric motor 354 (e.g., a stepper motor) that is mounted to the aft surface of the backplate 356. In operation, the kiosk controller (not shown) can operate the motor 354 to rotate the second pulley 348 and, in turn, drive the first pulley 350 to rotate the drive screw 330. Rotation of the drive screw 330 in a first direction causes the pusher member 322 to move across the inspection tray 212 on the guide shafts 328*a*, 328*b* toward the ramp member 324. Conversely, rotation of the drive screw 330 in the opposite direction causes the pusher member 322 to move away from the ramp member 324 and return to its starting position on the opposite side of the inspection tray 212.

As shown in FIG. 3C, the base 360 of the pusher member 322 includes a contact surface 370. In operation, as the pusher member 322 approaches the ramp member 324, the contact surface 370 contacts a contact feature (e.g., a cylindrical pin) that extends rearwardly from a lower portion of the ramp member 324. As the pusher member 322 continues moving toward the ramp member 324 (i.e., from left to right in FIG. 3C), the contact surface 370 drives the contact feature 372 to the right, thereby causing the ramp member 324 to rotate counterclockwise about the pivot shaft 334 (FIG. 3B) as viewed from FIG. 3C, which is equivalent to rotating in the clockwise direction about the pivot shaft 334 in FIG. 3B. When the pusher member 322 moves away from the ramp member 324, a return spring (not shown) and/or another biasing member operably coupled to the ramp member 324 causes the ramp member 324 to rotate back to its original position.

Figure 4A:
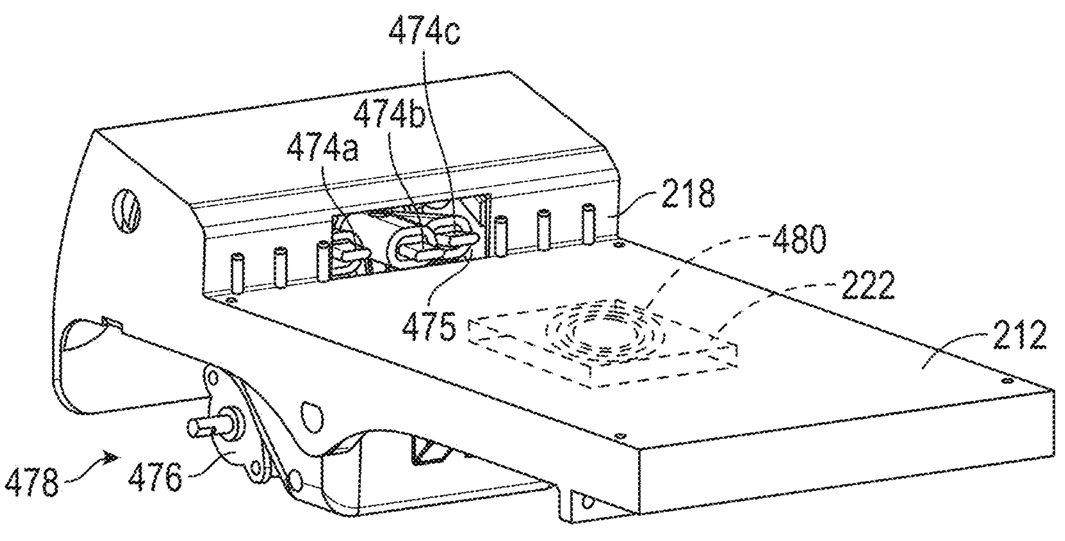
FIG. 4A is a right rear isometric view of a mobile device inspection tray assembly configured in accordance with embodiments of the present technology.

FIG. 4A is a right rear isometric view of the inspection tray 212 configured in accordance with embodiments of the present technology. In the illustrated embodiment, an electrical connector carrier assembly 478 is mounted to the underside of the inspection tray 212 and moves with the inspection tray 212 as it pivots between the three positions illustrated in FIGS. 2A-2C discussed above. The connector carrier assembly 478 includes an electric motor 476 (e.g., a stepper motor) operably coupled to a camshaft (not shown). The camshaft includes a plurality of lobes that are each operably positioned to move a corresponding one of a plurality of mobile device electrical connectors 474*a-c* (e.g., universal serial bus (USB) connectors, Android and/or iOS connectors, etc.) positioned in or near an opening 475 in the shelf 218 of the inspection tray 212. The electrical connectors 474*a-c* can be selectively deployed through the opening 475 and operably connected to the mobile phone 210 to create a wired communication link with the mobile phone 210 when, for example, the kiosk 100 is unable to wirelessly connect to the mobile phone 210. For example, in operation, a kiosk controller (not shown) can activate the motor 476, which in turn rotates the camshaft so that one of the lobes selectively drives the desired electrical connector (e.g., 474*b*) outwardly through the opening 475, while the other electrical connectors (e.g., 474*a* and 474*c*) remain back in the opening 475. With the desired electrical connector 474 in this position, the user can easily connect their mobile phone to the correct connector when placing their mobile phone on the shelf 218 as illustrated above with reference to FIG. 2A. As shown in FIG. 4A, the camshaft configuration of the carrier assembly 478 enables the electrical connectors 474*a-c* to be compactly arranged in the inspection tray assembly 470. In some embodiments, the correct electrical connector is selected based on the make and model of phone that the user has identified via the display screen 104 (FIG. 1) that they wish to sell. Once the mobile phone has been electrically inspected via the selected connector, the motor 476 can rotate the camshaft to drive the selected connector back through the opening to disengage the connector from the mobile phone. This enables the mobile phone to be flipped over as described in detail below. Additional details regarding such carrier assemblies are described in U.S. patent application Ser. No. 17/445,178, titled CONNECTOR CARRIER FOR ELECTRONIC DEVICE KIOSK, and filed on Aug. 16, 2021, the entirety of which is hereby incorporated by reference herein. In other embodiments, the inspection area 216 and/or other portions of the kiosk 100 can include other devices and systems for making wired electrical connections to mobile phones. Such devices and systems can include, for example, various types of connector cable systems, etc. Additionally, it is contemplated that some embodiments of the kiosk 100 can be provided without wired connectors for making electrical connections to phones. Accordingly, it will be appreciated that some embodiments of the kiosks and related systems described herein in accordance with the present technology are not limited to use with the electrical connector carrier assembly 478 and/or other carrier assemblies.

As noted above with reference to FIG. 2A, in some embodiments, the kiosk 100 includes a wireless charger 222 (e.g., a "Qi charger") mounted (via, e.g., a plurality of screws or other fasteners) to the backside of the inspection tray 212. The wireless charger 222 is positioned so that a charging pad 480 of the charger 222 is relatively close to (e.g., within 1.6 inches from) mobile phones placed on the frontside (inspection surface) of the inspection tray 212 so that the phones can be effectively charged. In some embodiments, the wireless charger 222 can be a wireless charger provided by STMicroelectronics of Coppell, Texas, USA. In other embodiments, other wireless chargers can be used.

Figure 4B:
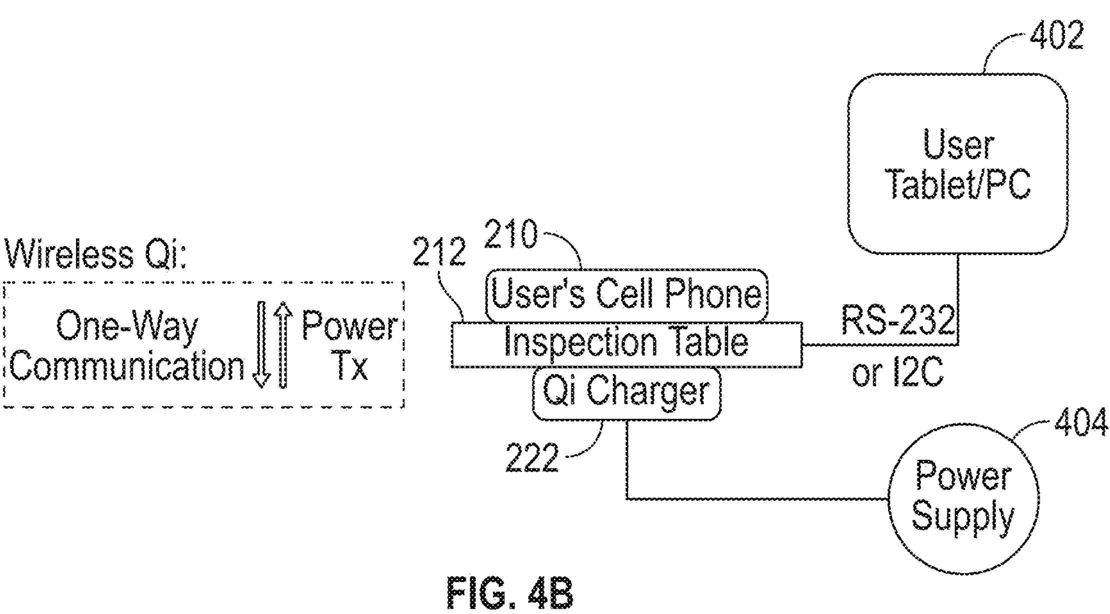
FIG. 4B is a schematic diagram illustrating a wireless charger mounted to the inspection tray assembly in accordance with embodiments of the present technology.

FIG. 4B is a schematic diagram illustrating a mounting arrangement of the wireless charger 222 configured in accordance with embodiments of the present technology. In the illustrated embodiment, the wireless charger 222 is electrically connected to a kiosk processor 402 (via, e.g., a serial port) and receives power from a kiosk power supply 404. In operation, when the charger 222 is powered on, it wirelessly provides power to the mobile phone 210, and the phone 210 responds by providing a one-way communication to the wireless charger 222. This communication can include specific information about the phone, including, for example, a wireless power identifier (ID) packet that can provide the device manufacturer (e.g., Apple®, Samsung®, Texas Instruments® (TI), etc.), a unique identifier associated with the phone, such as a unique 32-bit identifier, etc. As described herein, the kiosk processor 402 can use this information to guide and facilitate the phone intake and/or purchasing transaction, as well as other useful purposes.

Figures 5A, 5B, 5C, 5D, 5E:
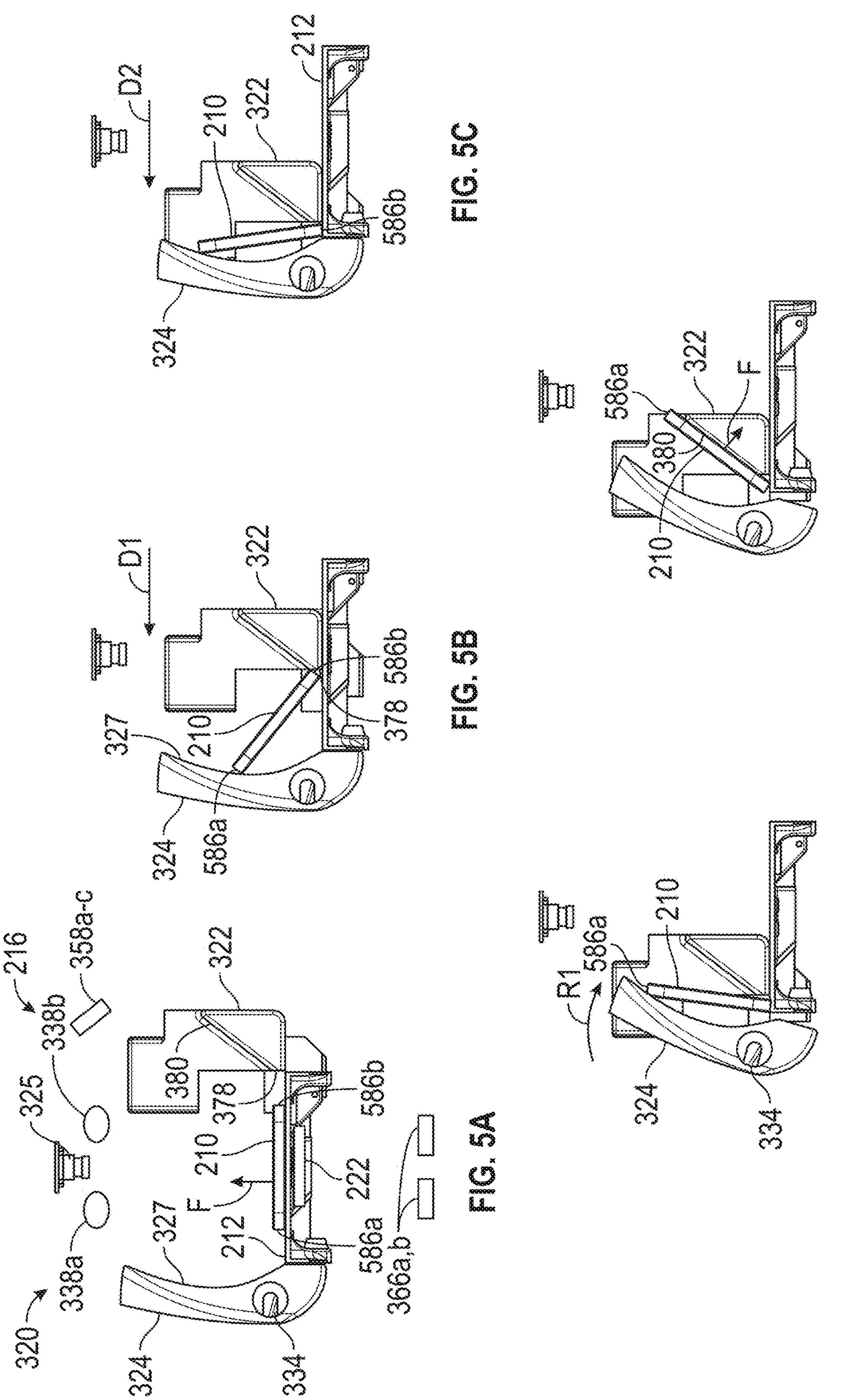
FIGS. 5A-5G are a series of front views of the kiosk inspection area illustrating operation of a mobile device flipping apparatus configured in accordance with embodiments of the present technology.

FIGS. 5A-5G are a series of front views of the inspection area 216 illustrating various stages of operation of the flipping apparatus 320 in accordance with embodiments of the present technology. In these Figures, the front portion of the inspection tray 212 has been omitted to better illustrate the operation of the flipping apparatus components. Starting in FIG. 5A, the mobile phone 210 is positioned on the inspection tray 212 with the front side (e.g., the display screen) facing upwardly as shown by the arrow F. By way of example, this position corresponds to the mobile phone 210 undergoing electrical and visual inspection as shown in FIG. 2B. For example, the mobile phone can undergo an electrical inspection and evaluation via a wireless connection and/or via the appropriate electrical connector 474*a-c* (FIG. 4A), and the front side of the mobile phone 210 can be visually inspected and evaluated via the camera 325 as described above. Those of ordinary skill in the art will appreciate, however, that the orientation of the mobile phone 210 shown in FIG. 5A is provided by way of example only and is not limiting, and that, in other embodiments, the mobile phone 210 can begin the evaluation process with the front side (e.g., the display screen) facing downwardly, opposite the direction shown by the arrow F, or in another suitable orientation. In addition to the front (and/or back) side of the mobile phone 210 being visually inspected, the sides of the mobile phone 210 (e.g., a first or left side 586*a* and a second or right side 586*b*) can be evaluated via the camera 325 using, e.g., one or more mirrors. For example, the mirror 326 (FIG. 3A) positioned on the lower portion of the ramp member 324 can enable the camera 325 to obtain a reflected image of the left side 586*a* of the mobile phone 210, and the mirror 362 (FIG. 3B) positioned toward a lower portion of the pusher member 322 can enable the camera 325 to obtain a reflected image of the right side 586*b* of the mobile phone 210. As described in greater detail below, in some embodiments one or both of the mirrors 326, 362 can be omitted and the mobile phone 210 can be held in a partially flipped state by, for example, the flipping apparatus 320 or the user, to allow the camera 325 to obtain one or more direct images of one or both of the sides 586*a, b* of the phone for evaluation.

If one of the electrical connectors 474 was used to electrical inspect/evaluate the mobile phone 210, the electrical connector 474 can be disengaged from the mobile phone 210 as described above with reference to FIG. 4A after the electrical inspection/evaluation is complete. Once the front side and/or the side surfaces 586*a, b* of the mobile phone 210 have been visually evaluated and/or imaged as needed, the mobile phone 210 can be flipped as described below so that the back side of the mobile phone 210 can be visually inspected via the camera 325. If, however, the mobile phone 210 is initially placed on the inspection tray 212 with the front side facing downwardly, the back side of the mobile phone 210 can be visually evaluated and/or imaged by the camera 325 and then the mobile phone 210 can be flipped to allow the front side to be visually evaluated and/or imaged by the camera 325. Accordingly, those of ordinary skill in the art will understand that the flipping apparatuses of the present technology can be configured to flip mobile phones and/or other electronic devices front-to-back, back-to-front, etc. so that, for example, both the front and back sides of these devices can be visually evaluated and/or imaged by the camera 325.

Referring next to FIG. 5B, before beginning the flipping process, the camera 325 verifies that there is an electronic device (e.g., the mobile phone 210) positioned on the inspection tray and that the phone is not too large to flip. After confirming this, the flipping process begins by the pusher member 322 moving from right to left as shown by the arrow D1. As the pusher member 322 moves in this direction, the vertical surface 378 contacts at least a portion of the right side 586*b* of the mobile phone 210 and pushes the left side 586*a* against the lower portion of the curved surface 327 of the ramp member 324. This causes the left side 586*a* to slide upwardly against the curved surface 584, and the right side 586*b* to slide from right to left across the upper surface of the inspection tray 212. If at any point the mobile phone 210 becomes jammed (as indicated by, e.g., an over-current draw of the motor 354—see FIG. 3B), the pusher member 322 reverses direction, returns to the starting position, and then the process repeats. If the mobile phone 210 cannot be flipped after a preset number of tries, the user can be informed via the display screen 104 (FIG. 1) and the phone can be returned to the user.

As shown in FIG. 5C, continued movement of the pusher member 322 from right to left as indicated by the arrow D2 causes the mobile phone 210 to move into an almost vertical orientation, leaning against the ramp member 324 with its right side 586*b* supported on the upper surface of the inspection tray 212. The reader will recall from the discussion of FIG. 3C above, that as the pusher member 322 moves into this position it interacts with the ramp member 324 and causes the ramp member 324 to rotate clockwise about the pivot shaft 334 through an arc R1 as shown in FIG. 5D. In some embodiments, the arc can be from 5 degrees to about 25 degrees, or about 10 degrees. Rotating the ramp member 324 in this manner moves the mobile phone 210 past the over-center position, causing it to fall onto the angled surface 380 of the pusher member 322, as shown in FIG. 5E. In this position, the mobile phone 210 is laying on the angled surface 380 with the front side of the phone (e.g., the display screen) facing the angled surface 380.

Figure 5G:
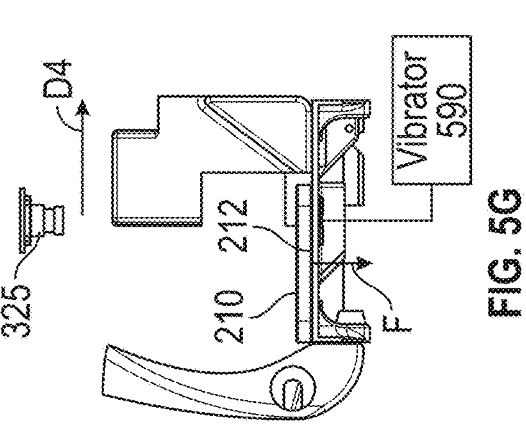
Figure 5F:
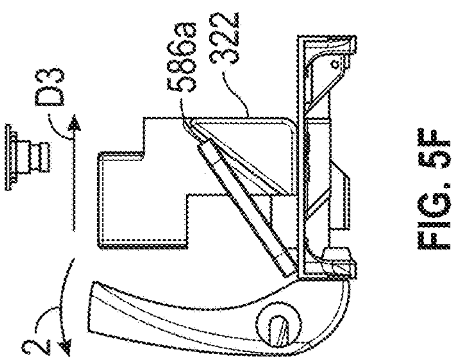

Turning next to FIG. 5F, the ramp member 324 returns through an arc R2 to its original position as the pusher member moves from left to right as indicated by the arrow D3. As the pusher member 322 moves to the right, the first side 586*a* of the mobile phone 210 slides downwardly along the angled surface 380 such that when the pusher member 322 arrives back in its original position, the mobile phone 210 is lying flat on the inspection tray 212 with the front side now pointing downwardly as indicated by the arrow F. In this position, the mobile phone 210 can be visually inspected by means of the camera 325 to determine whether, for example, there is any damage to the back surface of the mobile phone. Such damage could include, for example, cracks, gouges, damage to the phone camera, etc. Additionally, as discussed above, on some mobile phones the IMEI number is printed or otherwise formed on the back surface of the mobile phone. In some embodiments, the kiosk 100 can visually inspect such phones (using, e.g., optical character recognition (OCR)) to read or otherwise obtain the IMEI number off the back surface of the mobile phone once the phone has been flipped.

In some situations, the right side 586*b* of the mobile phone 210 may be positioned against, or otherwise too close to, the mirror 326 at the lower portion of the ramp member 324 and, as a result, the camera 325 may not be able to obtain a satisfactory side profile image of the mobile phone 210. For such situations, the kiosk can include one or more electromechanical vibrators 590 that, in response to a control signal from the kiosk processor 402, vibrate the inspection tray 212 and thereby cause the mobile phone 210 to move away from the mirror 326 so that the camera 325 can obtain one or more suitable side images. Additionally, in some embodiments, the inspection tray 212 may be positioned at a slight angle sloping downward away from the ramp member 324 to facilitate the foregoing movement of the mobile phone 210 in response to vibration of the inspection tray 212.

In some embodiments, the right side 586*b* and/or the left side 586*a* of the mobile phone 210 can be imaged directly by the camera 315 without using the mirror 326 (FIG. 3A) positioned on the lower portion of the ramp member 324 or the mirror 362 (FIG. 3B) positioned toward a lower portion of the pusher member 322. For example, after the mobile phone 210 has been rotated past the over-center position and is supported by the angled surface 380 of the pusher 322 as shown in FIG. 5E, the left side 586*a* can be facing toward, or at least generally toward, and/or otherwise positioned within a field of view of the camera 325. With the mobile phone 210 in this position, the camera 325 can be used to obtain one or more images of the left side 586*a* of the mobile phone 210. These images can be used to evaluate, e.g., the location, condition, etc. of any buttons, connector ports, and/or other features on the left side 586*a* of the phone 210. Similarly, one or more steps of the flipping process described above with reference to FIGS. 5A-5E can be repeated, but with the mobile phone 210 starting from a downward-facing orientation as shown in FIG. 5G, to position the right side 586*b* in the field of view of the camera 325. For example, after the mobile phone 210 has been flipped a first time and is in the position shown in FIG. 5G, the pusher 322 and the ramp member 324 can repeat the operations described above to flip the phone over a second time, e.g., to return the mobile phone 210 to the orientation of FIG. 5A. During that process, the right side 586*b* of the mobile phone 210 can face toward and/or otherwise be positioned within a field of view of the camera 325 when the mobile phone 210 is supported by the angled surface 380 of the pusher 322 (e.g., as shown in FIG. 5E, but with the mobile phone 210 facing a direction opposite the direction F shown). Accordingly, with the mobile phone 210 in this position, the camera 325 can obtain one or more images of the right side 586*b*.

Figure 6C:
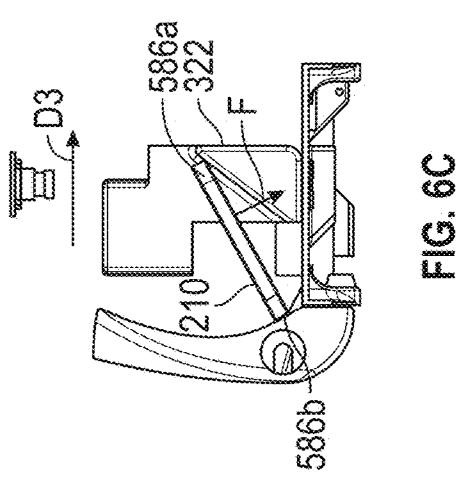
FIGS. 6A-6C are a series of front views illustrating operation of a mobile device flipping apparatus configured in accordance with other embodiments of the present technology.
Figure 6B:
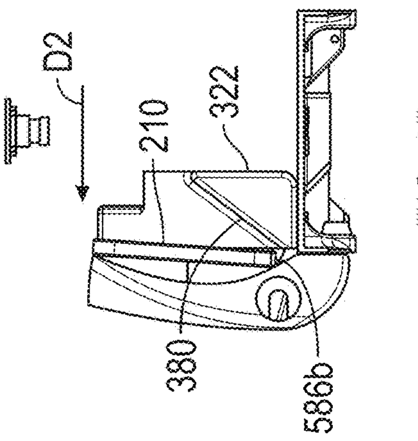
Figure 6A:
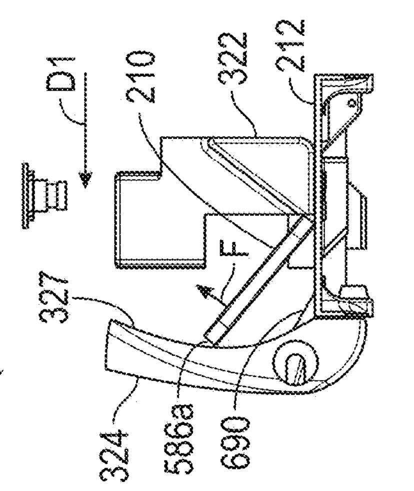

FIGS. 6A-6C are a series of front views illustrating various stages of operation of a flipping apparatus 320*a* configured in accordance with another embodiment of the present technology. Many of the components and features of the flipping apparatus 320*a* are at least generally similar in structure and function to the flipping apparatus 320 described in detail above. In one aspect of this embodiment, however, the flipping apparatus 320*a* is configured to flip the mobile phone 210 over without requiring any "tipping" movement of the ramp member 324. For example, in some embodiments, a portion of the upper surface of the inspection tray 212 may be curved or slanted upwardly toward the base of the ramp member 324, as illustrated by a ramp feature 690. As shown in FIG. 6A, as the pusher member 322 moves from right to left, the first side 586*a* of the mobile phone 210 first slides up the ramp feature 690 and then up the curved surface 327 of the ramp member 324. As shown in FIG. 6B, as the pusher member 322 continues pushing the right side 586*b* of the mobile phone 210 to the left, the right side 586*b* moves up the ramp feature 690 and further into the recess formed by the concave curved surface 327. As a result, the mobile phone 210 is now in an over-center position, which causes the mobile phone 210 to fall to the right and onto the angled surface 380 of the pusher member 322, without any necessary "nudging" or pushing by the ramp member 324. As shown in FIG. 6C, as the pusher member 322 moves to the right toward its starting position, the opposing sides 586*a*, 586*b* of the mobile phone 210 slide down the angled surface 380 and the ramp feature 690, respectively, so that the mobile phone 210 is ultimately resting face down on the upper surface of the inspection tray 212. Accordingly, the embodiment described above with reference to FIGS. 6A-6C provides a method of flipping the mobile phone 210 without requiring the ramp member 324 to rotate or otherwise move.

While various embodiments of flipping apparatus have been described herein, it is contemplated that other flipping apparatuses configured in accordance with the present technology can also be provided to flip mobile phones and other mobile devices. For example, with reference to FIGS. 6A-6C, it is contemplated that the ramp member 324 could be configured with a concaved curved surface similar to the curved surface 327, but with an upper portion that extends farther to the right in FIG. 6A relative to the base of the ramp member 324. By configuring the upper portion of the curved surface 327 to extend more in this direction, it is contemplated that mobile phones and other mobile devices can be moved to an over-center position using a pusher member at least generally similar to the pusher member 322 described above without the need for the ramp member 324 to move or otherwise impart any tipping action to the mobile phone 210.

In some embodiments, the flipping apparatus 320 described in detail above can be used to flip more than mobile phones and other handheld electronic devices. For example, in some embodiments, the flipping apparatus 320 can be used to flip a user's identification card (e.g., a driver's license or other ID card). In these embodiments, the user would place their ID card face out on the inspection tray 212 when the tray is in the position shown in FIG. 2A, and then the inspection tray 212 would rotate back to the position shown in FIG. 2B. In this position, the inspection area camera 325 (see, e.g., FIG. 5A) would capture an image of the face (front side) of the ID card, and then the flipping apparatus 320 would flip the ID card over in the manner described above with reference to FIGS. 5A-5G so that the camera 325 can capture an image of the backside of the ID card. The images of the ID card can then be stored in a database and associated with a mobile phone the user sells. Additionally, the identification information can be read off the ID card image (via, e.g., OCR, etc.) and checked against a database of potentially fraudulent sellers as a means of fraud prevention. The images can also be transferred to a remote computer for display to a remote operator who can compare the information on the ID card (e.g., person's age, height, weight, etc.) to the images of the user obtained via the external camera 106 (FIG. 1) to verify the identity of the user. In such embodiments where the user's ID card or other form of identification is verified via the inspection area camera 325 as described above, the ID scanner 108 (FIG. 1) may not be necessary and could potentially be omitted.

FIGS. 7A-7C are a series of cross-sectional side views of the kiosk 100 illustrating various stages of processing of a mobile device (e.g., the mobile phone 210) in accordance with embodiments of the present technology. As the reader will observe, the positions of the inspection tray 212 in FIGS. 7A-7C correspond to the positions of the inspection tray 212 in FIGS. 2A-2C, respectively, described above. Turning first to FIG. 7A, this view illustrates the mobile phone 210 positioned on the inspection tray 212 with the bottom edge of the phone 210 setting against the shelf 218. In some embodiments, the wireless charger 222 can provide a quick charge to the mobile phone 210 if it is placed on the inspection tray 212 without power. Additionally, in some embodiments, a second wireless charger **222*a* can be placed on or beneath, e.g., an upper surface 700 of the kiosk 100 behind the kiosk display 104. In these embodiments, a user can charge their mobile phone 210 by placing the mobile phone on the surface 700, without the kiosk 100 having to open and close the access door 112 for each charge, leading to wear and tear of the access door 112. In additional embodiments, when a user places the mobile phone 210 on the wireless charger 222, the kiosk 100 is configured to be woken up (enabled from a sleep or rest state) to initiate a transaction. The kiosk 100 moves to the appropriate user interface page to perform the transaction. In some embodiments, the wireless charger 222 is configured to automatically shut-off after a threshold amount of time, e.g., 1 minute, 2 minutes, etc. The automatic shut-off prevents users or malicious entities (who may not intend to sell a device) from lingering at the kiosk 100. In some embodiments, the wireless charger 222 is configured to provide a longer charging period to a user who registers a valid identifier (e.g., e-mail or phone number) with the kiosk 100 and opts-in to receive marketing communications. In some embodiments, when the kiosk 100 determines that the mobile phone 210 is a Qi-enabled phone but the "Qi charging" function is not operational on the mobile phone 210, the kiosk 100 is configured to offer the user a reduced price for the particular model of the phone. For example, the kiosk 100 can use the IMEI number of the mobile phone 210 to determine that the particular model of the phone has Qi support, but that the Qi charging function is not operational. In some embodiments, the price offered by the kiosk 100 is further based on the battery health (e.g., maximum capacity of the phone, number of charge cycles of the phone, etc.) of the mobile phone 210 and/or other information associated with the mobile phone 210 received during an electrical inspection of the mobile phone 210**.

Additionally (and even if the mobile phone 210 is fully or partially charged when it is placed on the inspection tray 212), the mobile phone 210 responds to receiving power from the wireless charger 222 by providing information about the phone to the wireless charger 222. In some embodiments as described above, this information can be transmitted to the kiosk processor 402 (FIG. 4B) and can include a wireless power ID packet that can be used to determine, e.g., a make of the device. The make of the phone can be used to determine the appropriate questions/prompts, etc., to display to the user via the kiosk display screen 104 for the phone inspection/purchase process. For example, if the mobile phone 210 is an Apple® product, the display screen 104 can provide instructions for the user to log out of their iCloud account so that the phone can be purchased by the kiosk 100. Additionally, in some embodiments, the unique phone identification information received from the mobile phone 210 via the wireless charger 222 can be used to track downstream processing of the mobile phone, thereby alleviating the need to have the user apply an identifying label or sticker (e.g., a barcode sticker) to the phone for tracking purposes.

In some embodiments, the make of the mobile phone 210 will be only a part of the information needed to provide an accurate price quote for the mobile phone 210. Thus, if the make is the only information available to the kiosk 100, the kiosk 100 can determine (via, e.g., accessing an associated price database) a price at the low end of the price range for the particular make of phone and offer to purchase the mobile phone 210 for the low price. In addition, the kiosk 100 can also offer to perform a more thorough evaluation of the mobile phone 210 and possibly arrive at a higher price for the phone 210 if the user is willing to wait. If the user opts to sell the mobile phone 210 for the low price (by, e.g., selecting appropriate responses to prompts on the kiosk display screen 104), the kiosk 100 can retain the phone 210 and facilitate remunerating the user as described below. If the user decides to wait and authorizes the kiosk 100 to perform a more thorough evaluation, the kiosk 100 can obtain additional device information, such as the model, the carrier, memory capacity, IMEI number, etc., by guiding the user to provide the additional information. For example, with the mobile phone 210 in the position shown in FIG. 7A, the kiosk 100 can instruct the user (via the kiosk display screen 104) how to navigate menus and/or other options/commands on a display screen of the mobile phone 210 so that the mobile phone 210 displays information about the device. The kiosk 100 can adjust instructions presented to the user based on the make of the mobile phone 210 obtained from the wireless charger 222. By way of example, the user can interact with the mobile phone touch screen display to bring up an "about" page using the phone's "settings" menu. The about page can display various types of information about the phone, which the kiosk 100 can capture via the camera 325 and process using, e.g., associated OCR software. Such information can include, for example, the model, serial number, operating system/operating system version, IMEI number, IP address, MAC addresses, carrier, memory configuration, user information, Cloud lock status, etc. This information can be used by the kiosk 100 to determine (via, e.g., access to an associated pricing database) a more accurate price or a range of prices (e.g., a high price and a low price) for the mobile phone 210 and present the price or range of prices to the user.

If the kiosk 100 cannot obtain the necessary information by guiding the user because, for example, the user cannot follow the instructions, or if the user does not want to spend the time to follow the instructions, the kiosk 100 can establish a communication link with the mobile phone 210 to obtain the necessary information. In some embodiments, the kiosk 100 can establish a wireless communication link with the mobile phone 210 via, e.g., a kiosk wireless transceiver as described herein. In other instances, the kiosk 100 can establish a wired communication link by, e.g., presenting an electrical connector (e.g., one of the electrical connectors 474*a-c* described above with reference to FIG. 4A) to connect to the mobile phone 210 as described above. The kiosk processor 402 can determine the appropriate electrical connector (e.g., a USB-C or Lightning connector) to present to the user on the inspection tray shelf 218 based on, e.g., the make of the device 210. After establishing the communication link between the kiosk 100 and the mobile phone 210, the kiosk 100 can obtain the needed information via an electrical inspection as described above. The kiosk 100 can then determine a more accurate price or a range of prices for the mobile phone 210 based on the information and present the price or range of prices to the user. If the user is not interested in the offered price or range of prices and no longer wishes to proceed with the transaction, the user can simply retrieve their mobile phone 210 from the kiosk 100. If the user decides to proceed with the transaction, the user may be asked to adhere a label with a unique code (e.g., a barcode) dispensed from the outlet 116 (FIG. 1) to the back of the mobile phone 210 for tracking purposes, and then place the phone back on the inspection tray 212.

At this point, in some embodiments, the user may elect to sell the mobile phone 210 for the price at the low end of the more accurate price range, or the user may elect to have the phone further inspected for, e.g., damage to the phone display screen, to potentially obtain the higher price for the phone based on the results from further testing and/or analysis of the mobile phone 210, such as whether the screen is damaged. If the user elects to sell the mobile phone 210 for the lower price, the kiosk 100 can retain the mobile phone 210 and provide the lower price compensation to the user as described below. Alternatively, if the user authorizes the kiosk 100 to further inspect the mobile phone 210 for, e.g., damage to the phone's display screen, and potentially offer a higher price, the access door 112 closes and the inspection tray 212 rotates aft about the horizontal axis defined by the pivot shaft 336 to the position shown in FIG. 7B. In this position, the mobile phone 210 can be visually inspected to determine whether the device is cracked, as described above. For example, as described above, in some embodiments, this includes a visual inspection of the front side of the mobile phone 210 followed by a visual inspection of the back side (or vice versa) after the phone has been flipped using the flipping apparatus 320 described in detail above. As discussed above, the lights 366*a*, 366*b* can facilitate the visual inspection in those embodiments in which the inspection tray 212 is configured as a light table. If the display or other portion of the mobile phone 210 is cracked, the price for the phone 210 will be lower than if the device is not cracked.

After obtaining the device information and performing the visual inspection, the kiosk 100 can determine a price for the mobile phone 210. For example, to determine a price, the kiosk 100 may use information about the make and model of the phone, one or more unique identifiers of the phone, and/or the results of the visual inspection (e.g., cosmetic condition, display screen damage, etc.) to look up a current price for the phone in a database or pricing model. The database or pricing model can be, for example, a local lookup table of common devices and/or a remotely hosted database or web service to which the kiosk 100 can transmit information about an electronic device and receive a current market value or offer price for one or more electronic devices having the same (or at least generally similar) make, model, and/or condition. After a purchase price has been determined, the user may be presented with the offer price via the display screen 104.

If the user accepts the offer price, the kiosk 100 can verify the user's identity and/or perform other fraud prevention measures as described above with reference to FIG. 2B. Once these steps have been satisfactorily completed, the inspection tray 212 rotates further aft as shown in FIG. 7C causing the mobile phone 210 to slide off of the aft portion of the inspection tray 212 and into a chute 792 leading to a storage bin 794. It will be noted that the forward portion of the inspection tray 212 includes a skirt 796 that blocks users from reaching under the inspection tray 212 and into the storage bin 794 when the access door 112 is open and the inspection tray 212 is in the position shown in FIG. 7B. Once the phone has been received in the bin 794, the kiosk 100 can provide payment of the purchase price to the user or the kiosk 100 can retain the phone and facilitate remunerating the user as described herein. In some embodiments, payment can be made in the form of cash dispensed from the payment outlet 110. In other embodiments, the user can receive remuneration for their mobile phone 210 in various other ways. For example, the user can be paid via a redeemable cash voucher, a coupon (e.g., a coupon for purchasing another mobile phone), an e-certificate, a gift code, a prepaid card, etc., that is dispensed from the kiosk 100; or the kiosk 100 can implement payment via a gift code, redeemable voucher, coupon, e-certificate, etc., that is sent to the user via email, text, or other form of electronic message. Additionally, in some embodiments, the kiosk 100 can implement payment to the user via a wired or wireless monetary deposit via the kiosk 100 to an electronic account (e.g., a bank account, a credit account, a loyalty account, an online commerce account, mobile wallet, etc.) via, e.g., PayPal, Venmo, etc., or with cryptocurrency (e.g., Bitcoin), etc.

In other embodiments, the price offered to the user for the mobile phone 210 can be a price quote or a range of price quotes. For example, in some embodiments, the kiosk 100 can provide the user with a range of price quotes for the mobile phone 210, with the final price paid for the phone depending on the outcome of a subsequent evaluation of the mobile phone 210 by a human operator at a remote facility. The highest price quote may be based on the human inspection confirming that the phone 210 is in the same condition that was determined by the kiosk 100, whereas a lower price quote may be based on the human inspection determining that the phone 210 is in worse condition (e.g., more damaged) than was initially determined by the kiosk 100. In such embodiments, if the user wishes to proceed with the sales transaction based on the quoted price (or prices), the kiosk 100 receives the mobile phone 210 but user is not paid for the phone immediately by the kiosk 100. Instead, after the kiosk operator has retrieved the mobile phone 210 from the kiosk 100 and the phone has undergone a human inspection to confirm condition, then the kiosk 100 can retain the phone and facilitate remunerating the user as described herein or the user can be paid the final price based on condition (e.g., the high quote or the low quote) by, e.g., a mailed check, or by any number of different methods of electronic payment including, e.g., sending of an e-certificate, gift code, coupon, redeemable voucher, etc. via email, text or other form of electronic message, or via a wired or wireless monetary deposit to an electronic account (e.g., a bank account, a credit account, a loyalty account, an online commerce account, mobile wallet, etc.).

Returning to FIG. 7B, in some instances a user may just leave their mobile phone 210 in the kiosk 100 and simply walk away without completing the transaction. In such instances, it may be undesirable to move the mobile phone 210 into the bin 794 or otherwise retain the mobile phone 210 in the kiosk 100 because then a service person may have to come out to the kiosk 100 and manually retrieve the phone 210 from the bin 794 to return it to the user. To avoid this scenario, some embodiments of the drive system of the inspection tray 212 (FIG. 3B) can be configured to move the inspection tray 212 from the position shown in FIG. 7B back to the position shown in FIG. 7A so fast that it throws the phone 210 out of the kiosk 100 and onto the adjacent floor space (the kiosk access door 112 will of course be open during this procedure).

Although only one storage bin (i.e., the storage bin 794) is shown in FIGS. 7A-7C, in some embodiments, the kiosk 100 can include two or more storage bins for storing mobile phones of different types and/or for storing phones that may require different types of post-receipt processing. For example, in some embodiments, the storage bin 794 can be a first storage bin used to store mobile phones that will be collected from the kiosk and undergo a normal processing procedure for resale, and the kiosk 100 can include a second storage bin (not shown) that receives mobile phones that may require some type of special processing or evaluation. Placing phones in this second type of storage bin enables a human operator to quickly access such phones if needed for evaluation, reporting, etc. By way of example, to implement a second storage bin, the chute 792 can include two outlet paths and a deflector (not shown) or similar device to direct mobile phones into the appropriate storage bin.

As those of ordinary skill in the art will appreciate, the foregoing processes are but some examples of ways in which the kiosk 100 can be used to purchase, recycle, or otherwise process consumer electronic devices such as mobile phones. Additionally, it should be understood that the configuration of the kiosk 100 described above is but one example of a suitable mobile device evaluation, purchasing, and/or recycling system that can be used with embodiments of the present technology. Accordingly, other embodiments of the present technology can use other systems without departing from the present disclosure. Although the foregoing examples are described in the context of mobile phones, it should be understood that kiosk 100 and/or various embodiments thereof and/or the systems described herein can also be used in a similar manner for recycling virtually any type of consumer electronic device, such as MP3 players, tablet computers, laptop computers, e-readers, PDAs, Google® Glass™, smartwatches, and other portable or wearable devices, as well as other relatively non-portable electronic devices such as desktop computers, printers, televisions, DVRs, gaming devices, entertainment or other digital media on CDs, DVDs, Blu-ray, etc. Moreover, although the foregoing examples are described in the context of use by a consumer, the kiosk 100 and various embodiments thereof and/or the systems described herein can similarly be used by others, such as store clerk, to assist consumers in recycling, selling, exchanging, etc., their electronic devices.

Figure 8:
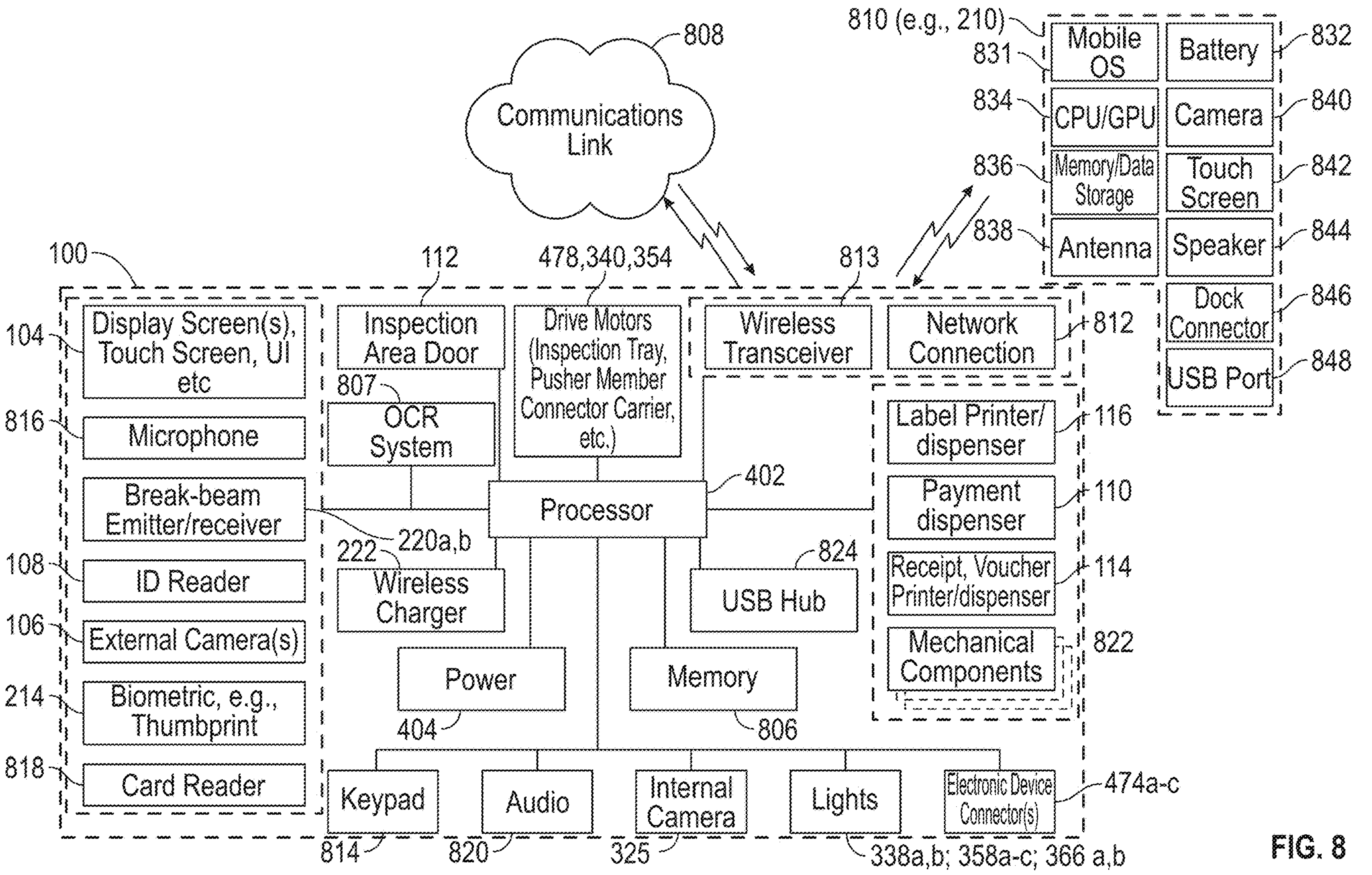
FIG. 8 is a schematic diagram illustrating various components associated with the kiosk of FIG. 1 configured in accordance with embodiments of the present technology.

FIG. 8 provides a schematic representation of an architecture of the kiosk 100 in accordance with embodiments of the present technology. In the illustrated embodiment, the kiosk 100 includes a suitable processor or CPU 402 that controls operation of the kiosk 100 as described above in accordance with non-transitory computer-readable instructions stored on system memory 806. The processor 402 may be any logic processing unit, such as one or more CPUs, digital signal processors (DSPs), application-specific integrated circuits (ASICs), etc. The processor 402 may be a single processing unit or multiple processing units in an electronic device or distributed across multiple devices. The processor 402 is connected to the memory 806 and may be coupled to other hardware devices and high-speed peripherals internally, for example, with the use of a bus (e.g., a USB 3.0 hub 824, a PCI Express, or a Serial ATA bus, etc.). The processor 402 can include, by way of example, a standard personal computer (PC) (e.g., a Dell® Optiplex® 7010PC); or other type of embedded computers running any suitable operating system, such as Windows® (e.g., Windows 8 Pro operating system), Linux®, Android™, iOS®, or an embedded real-time operating system. In some embodiments, the processor 402 can be a small form factor PC with integrated hard disk drive (HDD) or solid-state drive (SSD) and USB or other ports to communicate with other components of the kiosk 100. In other embodiments, the processor 402 can include a microprocessor with a standalone motherboard that interfaces with a separate HDD. The memory 806 can include read-only memory (ROM) and random access memory (RAM) or other storage devices, such as disk drives or SSDs, that store the executable applications, test software, databases, and/or other software required to, for example, control kiosk components, process electronic device information and data (to, e.g., evaluate device make, model, condition, pricing, etc.), and communicate and exchange data and information with remote computers and other devices, etc. Program modules can be stored in the system memory 806, such as an operating system, one or more application programs, other programs or modules and program data. The memory 806 may also include a web browser for permitting kiosk 100 to access and exchange data with websites over the internet.

The processor 402 can provide information and instructions to kiosk users via the display screen 104 and/or an audio system (e.g., a speaker) 820. The processor 402 can also receive user inputs via, e.g., a touch screen associated with the display screen 104 and/or, in some embodiments, a keypad 814 with physical keys, and/or a microphone 816. Additionally, the processor 402 can receive personal identification and/or biometric information associated with users via the ID reader 108 (e.g., a driver's license reader/scanner), one or more of the external cameras 106, and/or the fingerprint reader 214. In some embodiments, the processor 402 can also receive information (such as user identification and/or account information) via a card reader 818 (e.g., a debit, credit, or loyalty card reader having, e.g., a suitable magnetic stripe reader, optical reader, etc.). The processor 402 can also control operation of the label dispenser 116 and systems for providing remuneration to users, such as the payment (e.g., cash) dispenser 110 and/or a receipt or voucher printer and its associated dispenser 114.

The processor 402 can also control operation of the electronic, optical, and electromechanical systems the kiosk 100 includes for electrically, visually, and/or physically analyzing electronic devices placed in the kiosk 100, and/or information displayed on such devices, for purchase or recycling. Such systems can include: one or more internal cameras (e.g., the camera 325) for imaging and visual inspection of electronic devices for, e.g., determining external dimensions and/or determining condition, such as whether and to what extent the LCD display of the mobile phone may be cracked, and/or for performing OCR of information displayed on electronic devices in conjunction with an OCR system 807. Such systems can also include the electrical connectors 474*a-c* (e.g., USB connectors) for, e.g., powering up mobile phones and other electronic devices and performing electronic inspections. The processor 402 can also be operably connected to the connector carrier 478 to control dispensing of the connectors 474*a-c*, and to the motors 340 and 354 to control movement of the inspection tray 212 and the pusher member 322, respectively, as described in detail above. The kiosk 100 further includes a plurality of mechanical components 822 that are electronically actuated for carrying out the various functions of the kiosk 100 during operation. The mechanical components 822 can include, for example, the inspection area access door 112 (FIG. 1). The kiosk 100 further includes power 404, which can include battery power and/or facility power for operation of the various electrical components associated with kiosk operation.

In the illustrated embodiment, the kiosk 100 further includes a network connection 812 (e.g., a wired connection, such as an Ethernet port, cable modem, FireWire cable, Lightning connector, USB port, etc.) suitable for communication with, e.g., all manner of processing devices (including remote processing devices) via a communication link 808, and a wireless transceiver 813 (e.g., including a Wi-Fi access point; Bluetooth transceiver; near field communication (NFC) device; wireless modem or cellular radio utilizing GSM, CDMA, 3G, 4G, and/or 5G technologies; etc.) suitable for communication with, e.g., all manner of processing devices (including remote processing devices) via the communication link 808 and/or directly via, e.g., a wireless peer-to-peer connection. For example, the wireless transceiver 813 can facilitate wireless communication with electronic devices, such as a mobile device 810 (e.g., the mobile phone 210) for, e.g., wireless evaluation of the mobile device via, e.g., a mobile application loaded on the device. Such communication with the mobile device 810 can occur when the device is in the proximity of the kiosk 100 (e.g., in or near the inspection area 216) or when the device is remote from the kiosk. In other embodiments, the kiosk 100 can include other components and features that may be different from those described above, and/or one or more of the components and features described above may be omitted.

In the illustrated embodiment, the electronic device 810 is depicted as a handheld device, e.g., the mobile phone 210. In other embodiments, however, the electronic device 810 can be other types of electronic devices including, for example, other handheld devices; PDAs; MP3 players; tablets, notebooks and laptop computers; e-readers; cameras; desktop computers; TVs; DVRs; game consoles; Google® Glass™; smartwatches; etc. By way of example only, in the illustrated embodiment, the electronic device 810 can include one or more features, applications, and/or other elements commonly found in smartphones and other known mobile devices. For example, the electronic device 810 can include a CPU and/or a graphics processing unit (GPU) 834 for executing computer-readable instructions stored on memory 836. In addition, the electronic device 810 can include an internal power source or battery 832, a dock connector 846, a USB port 848, a camera 840, and/or well-known input devices, including, for example, a touch screen 842, a keypad, etc. In many embodiments, the electronic device 810 can also include a speaker 844 for two-way communication and audio playback. In addition to the foregoing features, the electronic device 810 can include an operating system (OS) 831 and/or a device wireless transceiver that may include one or more antennas 838 for wirelessly communicating with, for example, other electronic devices, websites, and the kiosk 100. Such communication can be performed via, e.g., the communication link 808 (which can include the internet, a public or private intranet, a local or extended Wi-Fi network, cell towers, the plain old telephone system (POTS), etc.), direct wireless communication, etc.

Figure 9:
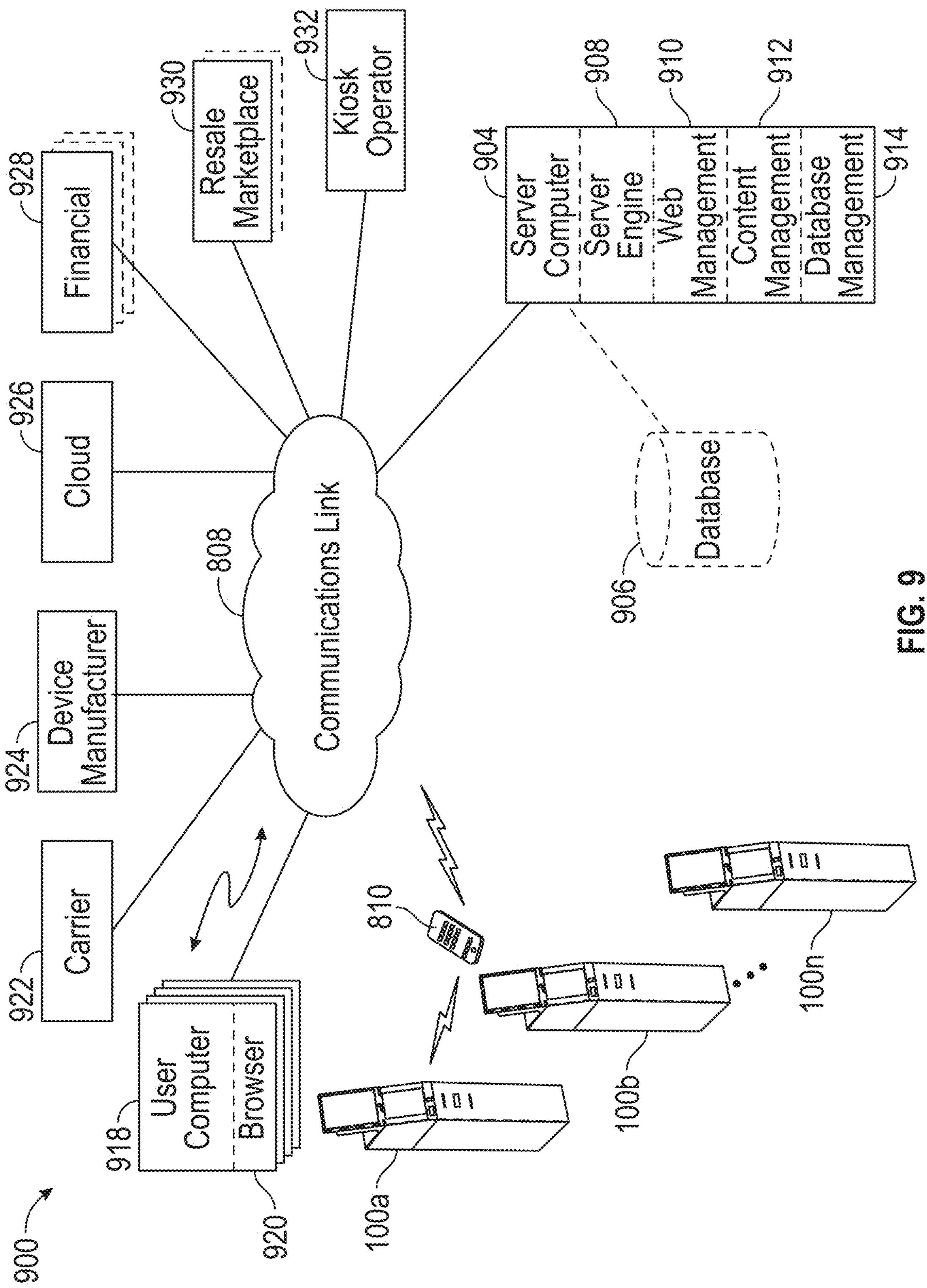
FIG. 9 is a schematic diagram of a suitable network environment for implementing various aspects of an electronic device recycling system configured in accordance with embodiments of the present technology.

FIG. 9 is a schematic diagram of a suitable network environment for implementing various aspects of an electronic device recycling system 900 configured in accordance with embodiments of the present technology. In the illustrated embodiment, a plurality of the kiosks 100 (identified individually as kiosks 100*a*-100*n*) can exchange information with one or more remote computers (e.g., one or more server computers 904) via the communication link 808. The one or more server computers 904 can be positioned remote from one or more of the kiosks 100, e.g., in a different room, building, city, zip code, state, country, continent, etc. Although the communication link 808 can include a publicly available network (e.g., the internet with a web interface), a private communication link, such as an intranet or other network, can also be used. Moreover, in various embodiments the individual kiosks 100 can be connected to a host computer (not shown) that facilitates the exchange of information between the kiosks 100 and remote computers, other kiosks, mobile devices, etc.

The server computer 904 can perform many or all of the functions for receiving, routing, and storing of electronic messages, such as web pages, audio signals, and electronic images necessary to implement the various electronic transactions described herein. For example, the server computer 904 can retrieve and exchange web pages and other content with an associated database or databases 906. In some embodiments, the database 906 can include information related to mobile phones and/or other consumer electronic devices. Such information can include, for example, make, model, serial number, IMEI number, carrier plan information, pricing information, owner information, etc. In various embodiments, the server computer 904 can also include a server engine 908, a web page management component 910, a content management component 912, and a database management component 914. The server engine 908 can perform the basic processing and operating system level tasks associated with the various technologies described herein. The web page management component 910 can handle creation and/or display and/or routing of web or other display pages. The content management component 912 can handle many of the functions associated with the routines described herein. The database management component 914 can perform various storage, retrieval, and query tasks associated with the database 906, and can store various information and data such as animation, graphics, visual and audio signals, etc.

In the illustrated embodiment, the kiosks 100 can also be operably connected to a plurality of other remote devices and systems via the communication link 808. For example, the kiosks 100 can be operably connected to a plurality of user devices 918 (e.g., PCs, laptops, handheld devices, etc.) having associated browsers 920. Similarly, as described above, the kiosks 100 can each include wireless communication facilities for exchanging digital information with wireless-enabled electronic devices, such as the electronic device 810 (e.g., the mobile phone 210). The kiosks 100 and/or the server computer 904 are also operably connectable to a series of remote computers for obtaining data and/or exchanging information with necessary service providers, financial institutions, device manufactures, authorities, government agencies, etc. For example, the kiosks 100 and the server computer 904 can be operably connected to one or more cell carriers 922, one or more device manufacturers 924 (e.g., mobile phone manufacturers), one or more electronic payment or financial institutions 928, one or more databases (e.g., the GSMA IMEI Database, etc.), and one or more computers and/or other remotely located or shared resources associated with cloud computing 926. The financial institutions 928 can include all manner of entities associated with conducting financial transactions, including banks, credit/debit card facilities, online commerce facilities, online payment systems, virtual cash systems, money transfer systems, etc.

In addition to the foregoing, the kiosks 100 and the server computer 904 can also be operably connected to a resale marketplace 930 and a kiosk operator 932. The resale marketplace 930 represents a system of remote computers and/or services providers associated with the reselling of consumer electronic devices through both electronic and brick and mortar channels. Such entities and facilities can be associated with, for example, online auctions for reselling used electronic devices as well as for establishing market prices for such devices. The kiosk operator 932 can be a central computer or system of computers for controlling all manner of operation of the network of kiosks 100. Such operations can include, for example, remote monitoring and facilitating of kiosk maintenance (e.g., remote testing of kiosk functionality, downloading operational software and updates, etc.), servicing (e.g., periodic replenishing of cash and other consumables), performance, etc. In addition, the kiosk operator 932 can further include one or more display screens operably connected to receive images from one or more cameras located at each of the kiosks 100 (e.g., one or more of the cameras 106 and 325). This remote viewing capability enables operator personnel to verify user identification and/or make other visual observations at the kiosks 100 in real-time during transactions. This can include remote evaluation of images of an electronic device by a remote operator to grade the physical condition of the device.

The foregoing description of the electronic device recycling system 900 illustrates but one possible network system suitable for implementing the various technologies described herein. Accordingly, those of ordinary skill in the art will appreciate that other systems consistent with the present technology can omit one or more of the facilities described in reference to FIG. 9 or can include one or more additional facilities not described in detail in FIG. 9.

Although specific circuitry is described above, those of ordinary skill in the art will recognize that a microprocessor-based system could also be used where any logical decisions are configured in software. The foregoing discussions of FIGS. 8 and 9 provide a brief, general description of a suitable computing environment in which the present technology can be implemented. Although not required, aspects of the present technology are described in the general context of computer-executable instructions, such as routines executed by a general-purpose data processing device, e.g., a server computer, wireless device, or personal computer. Those skilled in the relevant art will appreciate that aspects of the present technology can be practiced with other communications, data processing, or computer system configurations, including: internet appliances, handheld devices (including personal digital assistants (PDAs)), wearable computers, all manner of cellular or mobile phones (including Voice over IP (VOIP) phones), dumb terminals, media players, gaming devices, multi-processor systems, microprocessor-based or programmable consumer electronics, set-top boxes, network PCs, mini-computers, mainframe computers, and the like. Indeed, the terms "computer," "server," "host," "host system," and the like are generally used interchangeably herein, and refer to any of the above devices and systems, as well as any data processor.

Figure 10:
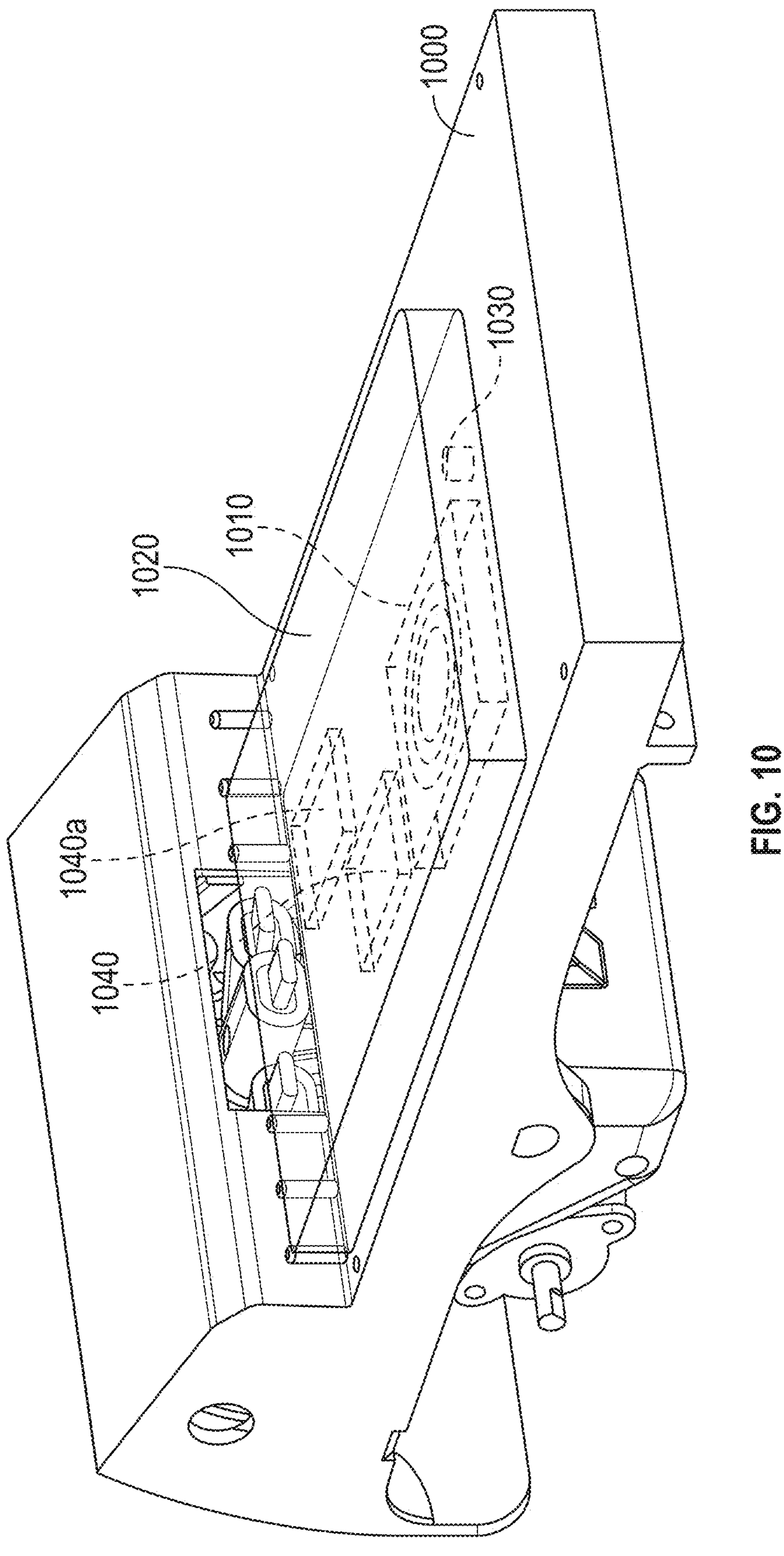
FIGS. 10 and 11 are isometric views of a wireless charger mounted to or otherwise integrated into a structure in accordance with embodiments of the present technology.
Figure 11:
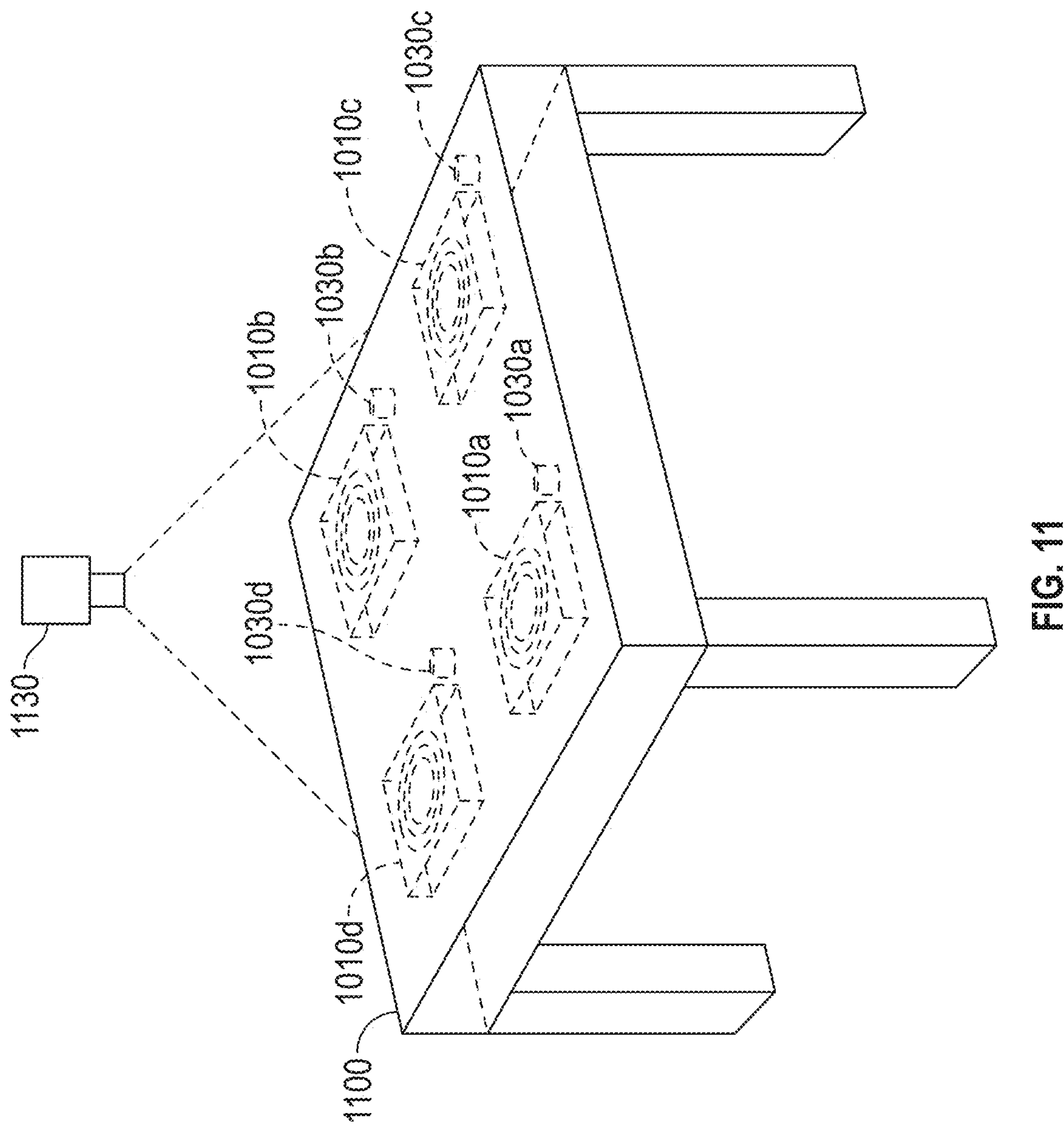

FIGS. 10 and 11 are isometric views of a wireless charger 1010 mounted to or otherwise integrated into a structure 1000 and a structure 1100, respectively, in accordance with embodiments of the present technology. In FIG. 10, the structure 1000 can be an inspection tray that is part of a kiosk, such as the inspection tray 212 of the kiosk 100 described above. In FIG. 11, one or more wireless chargers 1010 (identified individually as wireless chargers 1010*a*-1010*d*) can be mounted to the structure 1100 which can be, for example, a standalone table or a piece of furniture such as a countertop, coffee table, desk, couch, etc. The structure 1100 can be placed in a publicly accessible area or establishment. For example, the structure 1100 can be a table at a restaurant, coffee shop, etc.

The wireless charger 1010 can be mounted to an underside of the structures 1000 and 1100. The wireless charger 1010 can be placed within the surfaces of the structures 1000 and 1100 to prevent a dismantling of the wireless charger 1010. For example, if the wireless charger 1010 is mounted to an underside of the structures 1000 and 1100, the wireless charger can be removed from the structures 1000 and 1100. To have the wireless charger 1010 placed within the structures 1000 and 1100, the structures 1000 and 1100 can have a surface that is thicker than the thickness of the wireless charger. In some embodiments, the wireless charger 1010 can be added to an existing structure, such as an existing kiosk 100, or an existing table 1100, countertop, etc.

Structures 1000, 1100 can accommodate multiple wireless chargers 1010, as seen in FIG. 11. A hardware or a software processor, e.g., the processor 402 in FIGS. 4B and 8, can cause the multiple wireless chargers 1010 to wirelessly connect to a mobile phone or other electronic device 1020 ("device 1020"), determine which wireless charger receives the strongest signal from the device, and use the wireless charger receiving the strongest signal to communicate with and charge the device. Having multiple wireless chargers 1010 enables the structures 1000, 1100 to charge large or small devices placed anywhere on the surface of the structures 1000, 1100. Further, having multiple chargers 1010 enables multiple people sitting at, for example, the structure 1100 to charge their devices. Mounting multiple wireless chargers 1010 to the structure 1100 (e.g., to the underside of the structure 1100) enables a wireless charger 1010 to be within operating range to charge a mobile phone or other electronic device regardless of where the device is placed on the structure 1100. In some embodiments, the wireless charger 1010 can be a Qi wireless charger and can be the same as, or at least similar to, the wireless charger 222 described above. In other embodiments, the wireless charger 1010 can be other types of wireless chargers.

In some embodiments, the wireless charger 1010 coupled to the structure 1100 can communicate with the device 1020 directly or indirectly. In an example of direct communication, the wireless charger 1010 can cause the device 1020 to display messages to the user, such as informing the user of a price for the device 1020, and asking the user whether the user wants to sell the device. In an example of indirect communication, the wireless charger 1010 can communicate with a processor associated with a third device, such as a cloud computer or a local computer proximate to the structure 1100, which, in turn, can cause the device 1020 to display messages to the user.

In some embodiments, in addition to the wireless charger 1010, a camera 1130, mounted on a ceiling above the structure 1100, can record images of the display of the device 1020. The camera 1130 can be in communication with a processor, e.g., the processor 402 in FIGS. 4B and 8, which can use an OCR system to recognize the information displayed on the device 1020, such OCR systems described in U.S. patent application Ser. No. 17/445,083 and U.S. Provisional Patent Application No. 63/116,020, filed Nov. 19, 2020, both of which are incorporated by reference herein. The processor can be associated with a third device such as a cloud computer or a local computer.

Referring to FIGS. 10 and 11 together, when a mobile phone or other electronic device ("device") 1020 is in proximity to the wireless charger 1010, such as laying on the structure 1000, 1100, the device 1020 and the wireless charger 1010 can engage if the device 1020 is equipped with an internal wireless charging circuit. The wireless charger 1010 can be activated under various conditions such as whenever the device 1020 is placed in proximity to the wireless charger 1010. For example, in some embodiments, the wireless charger 1010 can be associated with a proximity sensor 1030 that detects a presence of the device 1020. In some embodiments, the proximity sensor 1030 can be a Hall effect sensor, an ultrasonic sensor, a capacitive sensor, or other sensors known in the art. In some embodiments, the wireless charger 1010 can activate after the user indicates that they want to sell the device 1020, and the wireless charger 1010 can provide a timed charge, such as up to five minutes. To indicate that that the user wants to sell the device 1020, the user can place the device 1020 on the structure 1000, 1100, or can make a selection at the kiosk 100 or at the device 1020, as described in the following examples. For example, in some embodiments, the structure 1000, 1100 can have the proximity sensor 1030 that detects a presence of the device 1020. Upon detecting the presence of the device 1020, the proximity sensor can activate the wireless charger 1010. In another example, the wireless charger 1010 can activate after the user places the device 1020 on the inspection tray 1000 for a predetermined amount of time, such as 30 seconds. In a third example, the user can make a selection via the kiosk 100 to indicate that the user is interested in selling the device 1020. In a fourth example, the user can make a selection via the device 1020, such as activating an appropriate display that indicates to the kiosk 100 that the user is interested in selling the device. The kiosk 100, in turn, can understand the device display using the OCR system.

While the device 1020 is being charged, the device 1020 can use a wireless charging message to provide information about the device 1020 to a system configured to purchase the device 1020, such as the kiosk 100. The wireless charging message can comply with a protocol such as a wireless charging protocol, 3GPP/LTE standard, 3GPP/5G standard, etc. The wireless charging message sent from the device 1020 to the system can be part of a mandatory message exchange during a protocol initiation between the device 1020 and the system. For example, the wireless charging message can be part of a header packet initiating the wireless charging protocol.

The header packet of the wireless charging protocol sent from the device 1020 to the system can include a unique identifier of the device 1020. The unique identifier of the device 1020 prevents the user from placing an expensive device on the structure 1000, 1100 for evaluation and switching the expensive device with a less expensive device prior to the device being deposited with the kiosk 100. For example, to avoid a person switching the device 1020, the wireless charger 1010 can require the header packet including the unique identifier every time the device 1020 is placed in the inspection tray 1000 or on the table 1100. The wireless charger 1010 can detect a device swap if at any point in the evaluation process the unique identifier detected in the header packet received from the device 1020 changes from the unique identifier initially detected when charging was initiated. Even if the device 1020 is out of power, the device 1020 can be activated through the wireless charger 1010 to obtain necessary information, as described herein.

In one embodiment, the device 1020 can send information to the wireless charger 1010 that identifies the manufacturer of the wireless charger on the device 1020. For example, the wireless charging protocol can include packets sent by the device 1020 that contain a wireless charger identifier (ID) that identifies the manufacturer of the device's wireless charger. The manufacturer of the wireless charger can in turn be used to uniquely identify the make of the device 1020. For example, if the device 1020 is a Google® device, it may not specify that it is a Google® device; however, all Google® devices can have a TI wireless charger. Consequently, if the manufacturer of the wireless charger on the device 1020 is TI, the system can determine that the device 1020 is a Google® device. Similarly, if the device is an Apple® device, the wireless charger ID can specify the manufacturer of the wireless charger as Apple®, and if the device 1020 is a Samsung device, the wireless charger ID can specify the wireless charger as Samsung. Consequently, a hardware or software processor, e.g., the processor 402 in FIGS. 4B and 8 associated with the wireless charger 1010 can infer and determine the make of the device 1020 based on the information packet from the device 1020. Based on the make of the device 1020, the processor can offer a price estimate to the user. To provide a more accurate price, the processor can obtain additional information about the device 1020, such as the model of the device, the memory capacity of the device, the carrier, the condition of, e.g., the device display screen, etc. The processor can obtain the needed information in several ways as described below.

In a first example, the processor associated with the wireless charger 1010 can provide instructions to the user to guide the user in selecting appropriate menus on the device 1020 so that the device 1020 provides the additional information to the processor, such as by the device 1020 displaying the additional information. The instructions can be provided to the user via, e.g., a user interface display, such as the display screen 104 of the kiosk 100 described above or via the display of the device 1020. The instructions can guide the user to select the appropriate menus such as "select the following menus Settings>About Phone." Once the appropriate information is displayed on the device 1020, the processor, using one or more cameras (e.g., the camera 325 in the inspection area 216 as described above with reference to FIG. 3A, or the camera 1130 in FIG. 11), can record the additional information shown on the device 1020 display and can extract the needed information from the recording using OCR.

In the second example, based on the make of the device, the processor can determine a cable that can connect to the device 1020, as described above in reference to FIG. 4A. The user can then connect the cable to the device 1020 and the processor associated with the wireless charger 1010 can obtain the additional information as described above.

In a third example, one or more cameras positioned above the structure 1000 (e.g., the camera 325 in the inspection area 216 as described above with reference to FIG. 3A) or, in the case of the structure 1100, one or more cameras 1130 in a similar position relative to the structure 1100 and associated with the wireless charger 1010 can record images of the device 1020. Based on the images, the processor associated with the wireless charger 1010 can determine width and height of the device 1020 as well as shape of a curvature of a corner of the device 1020. For example, Apple® devices, such as iPhones®, have a particular corner curvature whereas Android® devices, and Microsoft® devices, tend to have sharper corners than iPhones®. Based on the width, height, and/or the curvature, the processor can determine the make and/or model of the device using visual identification (ID). Further, the processor can determine a cable that can connect to the device 1020, which can obtain the additional information.

In another embodiment, the device 1020 can send information identifying the make and model of the device 1020 to the wireless charger 1010. The wireless charging protocol can include packets containing a wireless power ID, and packets containing an extended ID. The wireless power ID can include the make of the device 1020, such as Apple®. The extended ID can include the model of the device 1020 such as an Apple® iPhone X® made in 2020. Based on the make and model of the device 1020, the processor can offer a more accurate price estimate to the user than the price estimate based solely on the make of the device. For example, if the processor determines that the device is an Apple® phone, but does not know the model of the phone, the processor can offer a low price such as $30, because the device could be an iPhone 1. However, if the processor determines that the device is an iPhone 11, the processor can offer $100 for the phone.

In a fourth example, the device 1020 can wirelessly send additional information to the processor associated with the wireless charger 1010. The processor can obtain information using the wireless protocol, or the processor can obtain information through a NFC protocol. The NFC protocol can be communicated using dedicated NFC antennas, and/or the wireless charger 1010. The additional information can include:

Serial Number
Operating System (OS)/OS version
IMEI, primary and secondary
IP addresses (ipv4/6)
BT Wi-Fi MAC Addresses Carrier (AT&T, Verizon, etc.)
Memory capacity
User info: email, phone, name
Cloud lock status (via login screen for new user)

Some of the more important factors in determining a price of the device 1020 are make, model, carrier, memory capacity, and IMEI. IMEI uniquely identifies the device 1020. Using the IMEI, the processor can determine whether the device 1020 is stolen and should not be sold. Based on all the information, the processor can produce a more accurate price quote for the device 1020 to the user.

Figure 12:
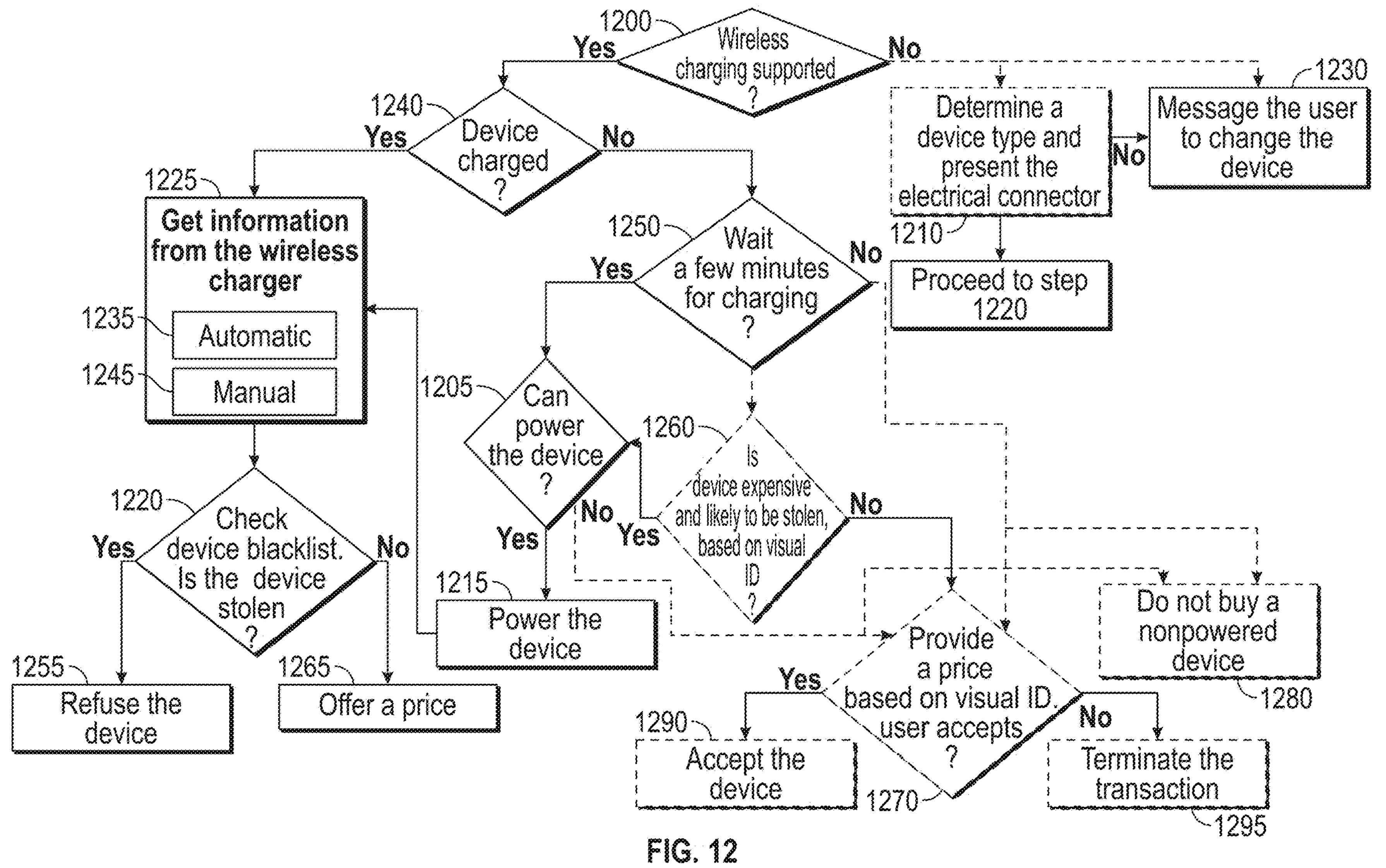
FIG. 12 shows a flowchart of a process to evaluate a device and present a price quote to a user in accordance with embodiments of the present technology.

FIG. 12 shows a flowchart of a process to evaluate a mobile phone or other electronic device and present a price quote to a user in accordance with embodiments of the present technology. In some embodiments, the kiosk 100 can evaluate the device 1020 using the front-facing camera 106 shown in FIG. 1. For example, the kiosk 100 can instruct the user to bring up a unique identifier of the device 1020, such as the IMEI number, MEID number, serial number, etc., on the display of the device, and point the unique identifier at the front-facing camera 106 or otherwise position the unique identifier in the field of view of the camera 106. The camera 106 captures an image of the unique identifier, and the kiosk 100 evaluates the image (via, e.g., OCR, a barcode reader, etc.) to obtain the unique identifier. In some embodiments, to obtain a unique identifier such as the IMEI number, the kiosk 100 can instruct the user to dial a particular number on the device 1020, such as "*#06#", which causes the device to display the IMEI number (which may be displayed as a barcode). In other embodiments, the user can be instructed to bring up the about page of the device, which can include the IMEI or other unique identifier. The kiosk 100 can communicate the instructions to the user through the kiosk display 104, or by causing the display of the device 1020 to show instructions to the user. Based on the IMEI number or other unique identifier, the kiosk 100 can determine, e.g., the make and/or model of the device, and can present a price range to the user (e.g., a high price and a low price). In some embodiments, the high price can be based on a device in very good condition, while the low price can be based on a device in poor (e.g., damaged) condition. The user can choose to accept the low price of the price range without waiting, or the user can wait for the kiosk 100 to perform a more detailed inspection of the device 1020 and receive a higher price. The user can also choose to terminate the transaction by walking away from the kiosk 100. If the user decides to continue with the transaction, the user can place the device 1020 on the inspection tray 212 in FIG. 2A of the kiosk 100 so that the kiosk 100 can proceed with a more detailed inspection as described above. Other examples of such a process are described below with reference to FIGS. 13A-13C.

As described above, in other embodiments, a processor associated with the wireless charger 1010 of FIGS. 10 and 11 (e.g., the kiosk processor 402) can obtain the necessary information to evaluate the device completely wirelessly, without having to connect the device 1020 to a cable. For example, in step 1200, the processor can determine whether the device 1020 supports wireless charging. To determine whether the device 1020 supports wireless charging, the processor can instruct the wireless charger 1010 to send an initial message according to a wireless protocol (e.g., a Qi wireless protocol) to the device 1020. If the device 1020 responds to the initial message, the processor can determine that the device 1020 supports wireless charging.

If the processor does not receive a response from the device 1020, the processor can perform the visual ID to obtain the make and/or model of the device 1020, e.g., based at least in part on the width, height, and/or the curvature of the device 1020 as described above. In addition, or alternatively, the processor can access a database storing information as to whether a particular make and/or model of device supports wireless charging. Based on the make and/or model of the device 1020 (e.g., determined using the visual ID) and the information from the database, the processor can determine whether the device 1020 supports wireless charging.

If the device 1020 does not support wireless charging, in step 1210, the processor can perform a visual ID to determine the make and/or model of the device 1020 (e.g., if not previously performed to determine whether the device 1020 supports wireless charging, as described above). Based on the device's 1020 make and/or model, the processor can present a cable connector (e.g., one of the connectors 474*a-c*) to the device, and attempt to obtain necessary information, such as make, model, IMEI, carrier, and memory capacity, through the cable connector as described above. If the user declines to connect the device 1012 to the connector, the processor can proceed to step 1230. If the user connects the device 1020 to connector, the processor can obtain the necessary information through the cable by performing an electrical inspection and can proceed to step 1220. Before or after performing the step 1220, the processor can perform a visual inspection, as described herein. Prior to performing the visual inspection, the processor can ask the user whether the user is willing to wait for the visual inspection because the price might increase in response to the visual inspection.

If the device 1020 does not support wireless charging, instead of performing step 1210 or in addition to performing step 1210, the processor can perform step 1230, and can message the user to charge the device and then bring the device back for evaluation.

If the device 1020 supports wireless charging, in step 1240, the processor can determine whether the device is charged. To determine whether the device 1020 is charged, the processor can instruct the wireless charger 1010 to send an initial message according to the wireless protocol to the device 1020. If the device 1020 responds to the initial message, the processor can determine that the device 1020 is charged.

If the device 1020 is not charged, in step 1250, the processor can ask (via, e.g., an associated user interface display) if the user wants to wait a few minutes for charging. The processor can explain to the user that the wait is short, about 3 minutes, and is needed to make sure that the device 1020 is not stolen. If the user does not want to wait a few minutes for charging, the processor can proceed to steps 1260, 1270, or 1280.

In step 1280, the processor can refuse to purchase the device 1020 if the device is not powered, because the device 1020 may be stolen. Without powering the device 1020, obtaining the device's unique identifier (UID), and checking whether the UID is stolen, the processor cannot determine whether the device 1020 is available for sale.

In step 1270, the processor can perform a visual ID of the device 1020. Based on the make and/or model of the device 1020, the processor can offer a purchase price for the device 1020 that represents a low bound of a price range associated with device 1020. For example, the price range for the device 1020 is $45 for a device in poor condition and $150 for a device in excellent condition. The processor can offer $45 to the user if the user does not want to wait to power the device, or if the device cannot be powered.

If the user accepts the offer, in step 1290, the processor can accept the device 1020. For example, kiosk 100 in FIG. 2A can slide the device into the chute 792 leading to the storage bin 794, as described above with reference to FIG. 7C, and initiate, otherwise cause payment to be made to the user for the device 1020, or the kiosk 100 can retain the device 1020 and facilitate remunerating the user as described herein. If the user does not accept the offer, in step 1295, the transaction between the user and the kiosk 100 and/or the structure 1100 terminates.

In step 1260, the processor can perform visual ID of the device 1020 to determine make and/or model of the device 1020. Based on the make and model of the device 1020, the processor can determine whether the device 1020 is expensive and likely to be stolen. The processor can make the determination by accessing a database containing a list of devices and prices, and/or containing a list of stolen devices. If the device is expensive and likely to be stolen, the processor can attempt to power the device 1020 in step 1205. If the device is not expensive and not likely to be stolen, the processor can proceed to step 1270, and provide a price.

The processor can reach step 1205 if in step 1250 the user affirms that the user can wait for charging, or if in step 1260 the processor determines that the device 1020 is expensive and might be stolen. In step 1205, the processor can attempt to power the device 1020 using, e.g., the wireless charger 1010. Wireless charging of the device 1020 may be unsuccessful if the wireless charger on the device 1020 is broken. If the wireless charging is unsuccessful, the processor can proceed to steps 1270 and 1280, as described above.

If the device can be charged, in step 1215 the processor can power the device 1020 via the wireless charger 1010. In step 1225, the processor can obtain information from the wireless charger 1010 automatically, in step 1235, or in a manual way, in step 1245, as described above. To automatically get information in step 1235, the processor can obtain various information from the wireless charger 1010 as described herein. For example, the processor can obtain the make, the model, the carrier, memory capacity, and/or IMEI of the device 1020, etc., from the wireless charger 1010.

In addition, the processor can be operably connectable (via, e.g., a wired or wireless connection) to an NFC antenna 1040 that can be embedded in or otherwise mounted to the structure 1000 (e.g., to the underside of an inspection tray) in FIG. 10, or in the structure 1100 (e.g., a table) in FIG. 11. The NFC antenna 1040 associated with the processor can communicate with an NFC antenna 1040*a* contained in the device 1020 to obtain information about the device, without the user having to do anything other than placing the device in proximity to the embedded NFC antenna 1040. The device NFC antenna 1040*a* can communicate information about the device 1020 to the NFC antenna 1040, where the information can include the make, model, carrier, capacity, etc. of the device 1020. The NFC communication between can enable two electronic devices to communicate over a distance of 4 cm (1.5 inches) or less. The NFC communication can use any of a set of NFC communication protocols such as ISO/IEC 18092, ISO/IEC 21481, and/or NFC protocols defined by associations such as GSMA, StoLPaN, NFC forum, etc.

In addition to, or instead of, the automatic step 1235, the processor can guide the user to provide additional information to the processor in step 1245. For example, the processor can instruct the user how to navigate menus on the device 1020 so that the device 1020 can display information about the device. The cameras associated with the processor can capture an image of the device display and perform OCR to extract the device information. In some embodiments, to obtain the unique identifier of the device 1020 such as the IMEI number, the processor can instruct the user to dial a particular number, such as "*#06#". In other embodiments, the processor can instruct the user to place the device 1020 on the structure 1100 (or on the inspection tray 212—see FIG. 2A) with the display side of the device 1020 facing the structure 1100 (or facing the inspection tray 212), so that the camera 1130 in FIG. 11 (or the camera 325 in FIG. 3A) can read the back of the device 1020 because, in some embodiments, the device 1020 can have a unique identifier, such as the IMEI number, printed in small text on the back of the device 1020.

In the manual step 1245, the user may be able to have a video call, such as a Skype/Zoom call, with tech support where a remote agent can turn on both the external camera 106 in FIG. 1 to see the user's face, and/or the internal camera 325 to see how the user is interacting with the device 1020 in the kiosk 100. By seeing the device display, the remote agent can inform the user how to interact with the device display. For example, via the internal camera 325, the remote agent can see the user's finger in relation to the device 1020 and inform the user to, for example, "move to the right and click the app with the green icon." In some embodiments, the remote agent can be a chatbot or artificial intelligence. The remote agent can interact with the user using video, audio, and/or text, provided by the kiosk 100.

If the processor cannot obtain the necessary information in step 1225, because for example, the user cannot follow the instructions, or if the user does not want to spend the time to follow the instructions, the processor can obtain information via a cable. The kiosk 100 can present the cable to connect to the device 1020, as described herein. In step 1220, the processor can obtain a list of stolen devices including the UIDs of the stolen devices. The processor can track whether a UID of the device 1020, such as the IMEI number, is contained in the list. If the UID of the device 1020 is in the list of stolen devices, in step 1255, the processor can refuse to accept the device 1020. In some embodiments, the processor further flags a location of the kiosk in a record of a stolen device in a database that contains the UIDs of stolen devices. If the UID of the device 1020 is not in the list of stolen devices, the processor, in step 1265, can present the purchase price for the device 1020 that has been determined based on the information obtained, in step 1225, from the device 1020.

In one embodiment, prior to presenting the offer price to the user, the processor can further visually inspect the device 1020 for cracks or other damage to the display screen (LCD), as well as cracks off of the display screen, as described herein. After the inspection and gathering device information, the processor can offer an accurate price for the device 1020.

In another embodiment, the processor can present a price to the user based on the information gathered and without performing the visual inspection, and suggest that the price can increase if the user is willing to wait for the visual inspection to be performed. If the user accepts the presented price, the processor does not perform the visual inspection, accepts the device as described herein, and facilitates remuneration to the user. If the user indicates that the user is willing to wait, the processor can perform the visual inspection, as described herein, and based on the additional information obtained through the visual inspection, can offer the final price to the user.

The processor can perform the visual inspection as described herein before or after step 1220.

The processor can gather information about successfully completed transactions where the user accepted the offer, and transactions where the user did not accept the offer or did not even proceed to the step to view the offer. The processor can determine at which of the steps 1200-1290 a large number of users terminated the transaction. A large number of users can be at least 20% of all the users that terminated the transaction. For example, the processor can determine that a large number of users terminated the transaction in step 1210 when the cable was presented due to privacy concerns. As a result, the processor can replace step 1210 with steps 1270 and 1290. In another example, the processor can determine that a large number of users terminated the transaction in step 1245 when they had to manually navigate the device 1020. As a result, the processor can eliminate the manual step 1245, obtain the information that is available through the automatic process 1234, and provide a price based on the obtained information.

Figure 13A:
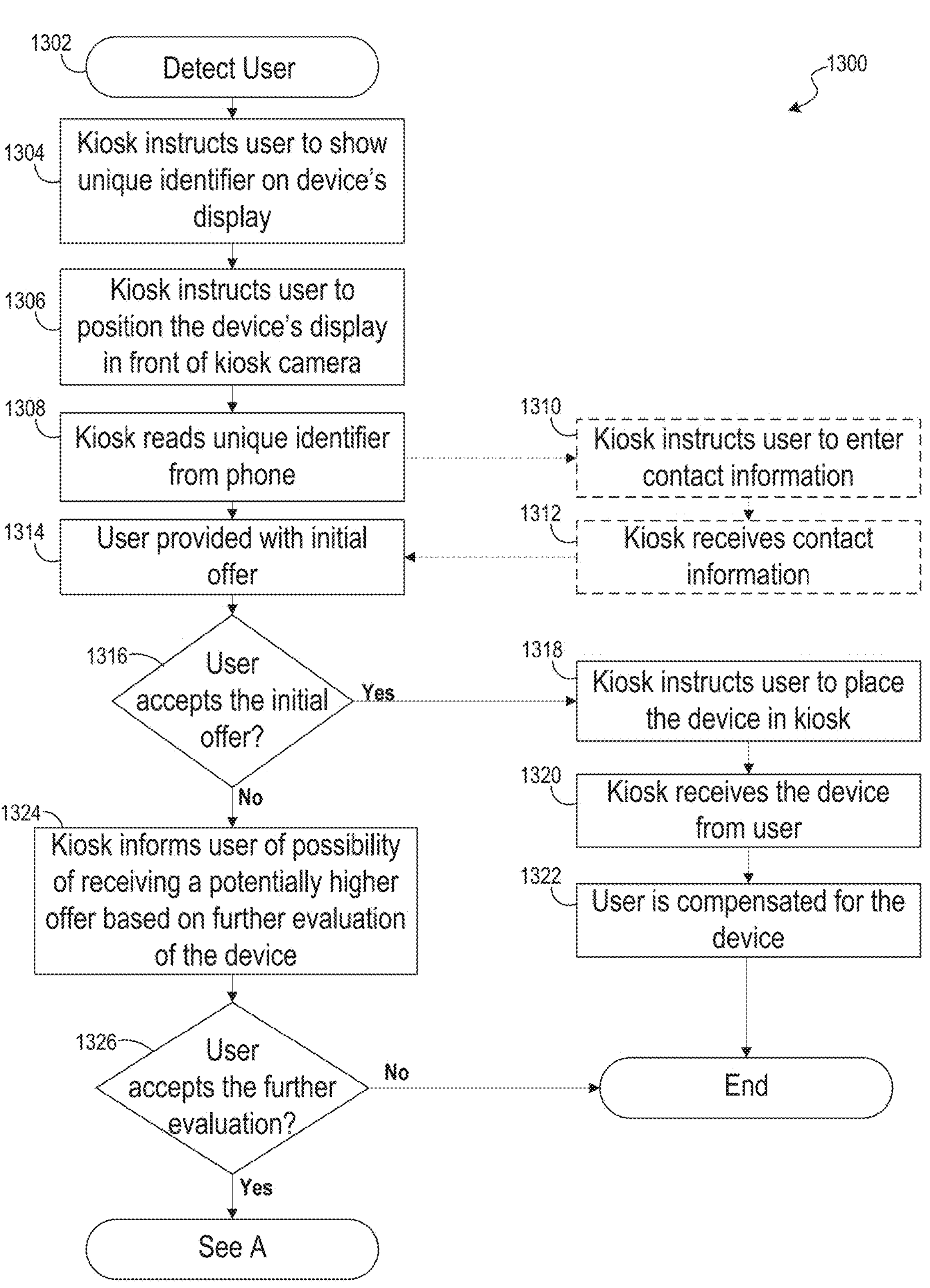
FIGS. 13A-13C show a flowchart of a process to evaluate a mobile phone or other electronic device in accordance with embodiments of the present technology.
Figure 13B:
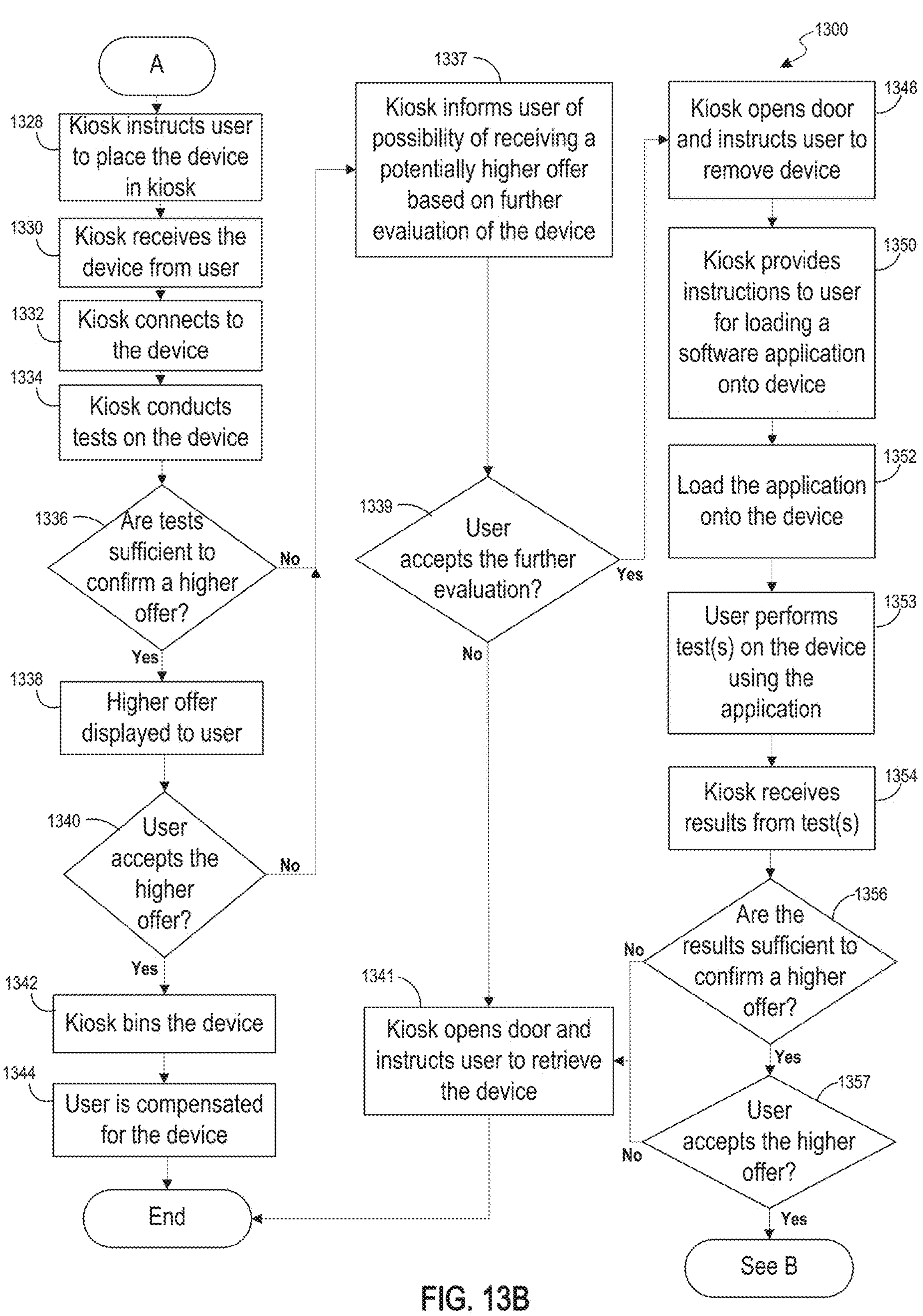
Figure 13C:
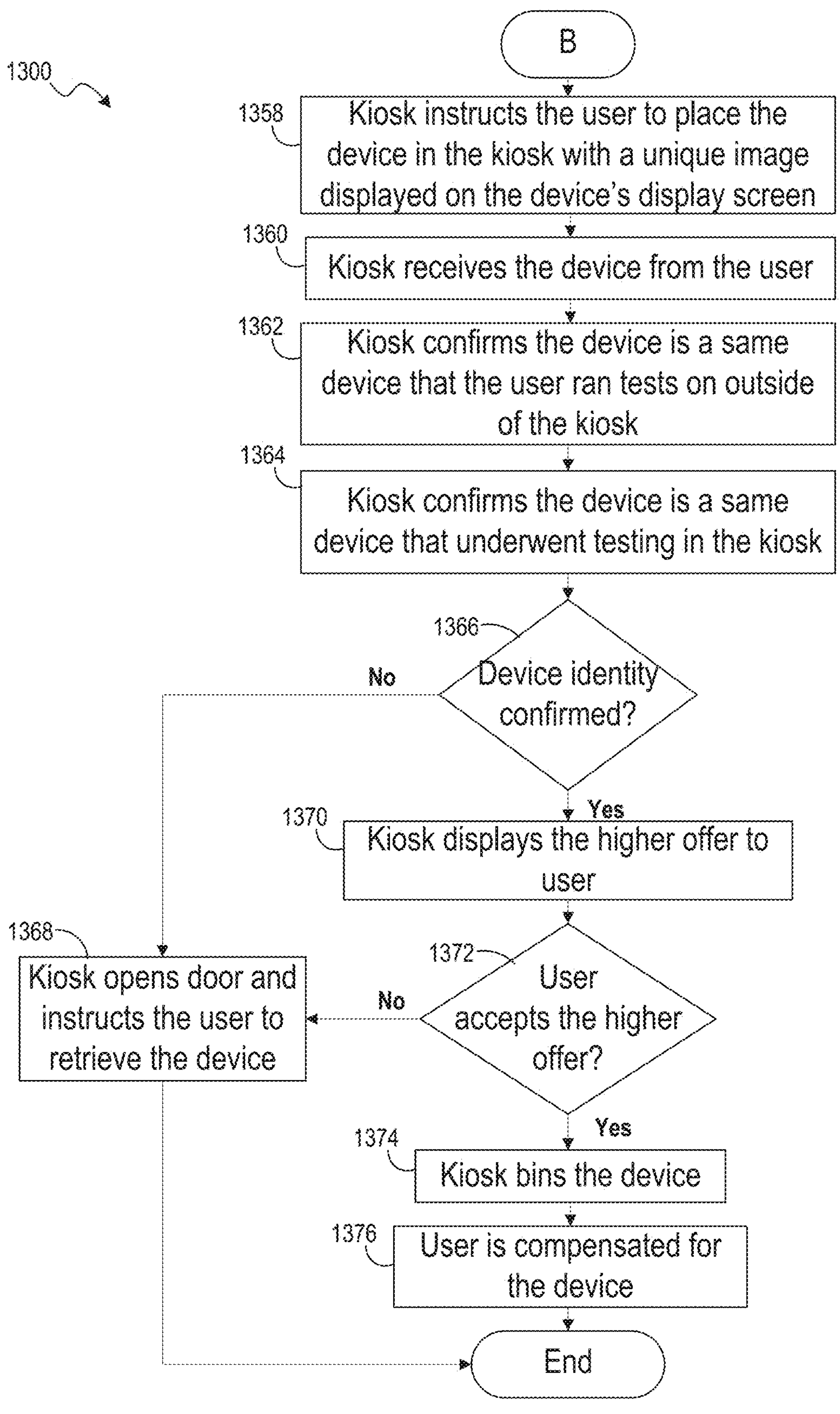

FIGS. 13A-13C show a flowchart of a process 1300 to evaluate a mobile phone and/or other electronic device (e.g., the mobile device 210, 1020) and present a price quote to a user in accordance with embodiments of the present technology. In some embodiments, all or portions of the routine 1300 can be performed by the kiosk 100 and/or the processor 402 in accordance with non-transitory computer-readable instructions stored on a computer readable medium, such as the memory 806. Referring first to FIG. 13A, in step 1302, the kiosk 100 can detect a user wishing to sell and/or recycle a mobile device via, for example, the kiosk's front-facing camera 106 shown in FIG. 1 and/or in response to an input provided by the user via a touch screen portion of the kiosk display screen 104. In step 1304, in response to detecting the user the kiosk 100 can instruct the user to bring up a unique identifier associated with the device 1020, such as the IMEI number, MEID number, serial number, etc., on the display of the device 1020. In some embodiments, for example, the kiosk 100 can instruct the user to dial "*#06#" to cause the device 1020 to display the device's IMEI number (which may be displayed as, for example, a barcode or other machine readable indicia). Additionally, or alternatively, the kiosk display screen 104 can instruct the user to bring up the "about page" of the device 1020, which can include the IMEI or other unique identifier. The kiosk 100 can communicate the instructions to the user via the kiosk display 104 or by sending a wireless communication to the mobile device 1020, or the instructions can be displayed on the screen of the mobile device 1020 via a mobile app loaded on the device 1020. In step 1306, the kiosk 100 can instruct the user to point the unique identifier at the front-facing camera 106 or otherwise position the mobile device's display screen and/or the unique identifier shown thereon in the field of view of the camera 106. In step 1308, the camera 106 captures an image of the unique identifier and the kiosk 100 (e.g., the kiosk processor 402) can evaluate the image (via, e.g., OCR, a barcode reader, etc.) to obtain the unique identifier.

In some embodiments, the process 1300 includes step 1310 in which the kiosk 100 instructs the user to enter contact information (e.g., for the device 1020) and/or enable another way for the kiosk 100 to communicate with the user. For example, the kiosk 100 can instruct the user to enter a phone number, email address, other electronic address, etc., via the kiosk display screen 104 and/or via a website associated with the kiosk 100 that the user accesses via the device 1020. In step 1312, the kiosk 100 can receive the contact information from the user via the kiosk display screen 104, the website, etc. The kiosk 100 can provide a message or other indicia to the user via, e.g., the kiosk display screen 104, a message sent to the mobile device 1020, etc., to verify the kiosk 100 received the contact information.

Based at least in part on the IMEI number and/or one or more other unique identifiers received by the kiosk 100 in step 1308, the kiosk 100 can determine, e.g., the make and/or model of the device 1020 and, in step 1314, can present an initial offer to the user for the device 1020 based on the make and/or model. The kiosk 100 can present the offer to the user via the kiosk display screen 104 and/or via the device 1020 (e.g., text message, email, mobile app, etc.). If the user accepts the initial offer for the device (step 1316, Yes) by, e.g., making an appropriate selection via the display screen 104, then in step 1318 the kiosk 100 can instruct the user to place the device 1020 on the inspection tray 212 when the inspection tray 212 is in the position shown in, e.g., FIG. 7A and, in step 1320, the kiosk 100 receives the device in the storage bin 794 by, e.g., rotating the inspection tray 212 from the position shown in FIG. 7A to the position shown in FIG. 7C. Once the kiosk 100 has received the device 1020 from the user then, in step 1322, the kiosk 100 can facilitate providing compensation to the user in accordance with the initial offer. In some embodiments, the kiosk 100 directly provides compensation to the user, e.g., in the form of cash, a voucher, an e-certificate, etc. Additionally, or alternatively, the kiosk 100 can facilitate providing compensation to the user electronically via, e.g., PayPal, Venmo, cryptocurrency (e.g., bitcoin), and/or any other suitable form of compensation. The process 1300 can end after the kiosk 100 has finished providing, or facilitating providing, the compensation to the user.

If the user does not accept the initial offer (step 1316, No) then, in step 1324, the kiosk 100 can inform the user of the possibility of receiving a potentially higher offer based on further evaluation of the device 1020. The potentially higher offer can be based at least in part on the information associated within the unique identifier (step 1308) obtained from the device 1020 (including, e.g., the make and/or model of the device 1020) and/or, as described in greater detail below, the results of one or more tests (including, e.g., an electrical and/or visual inspection) performed on the device 1020. In some embodiments, the kiosk 100 can provide the user (via, e.g., a touch screen portion of the display screen 104) with an estimated time to complete the further evaluation, e.g., to help the user decide whether to proceed with the further evaluation. If the user does not want to proceed with further evaluation of the device (step 1326, No), then the process 1300 ends. The user can also choose to terminate the transaction by simply walking away from the kiosk 100. If, however, the user wants to proceed with the further evaluation of the device 1020 (Step 1326, Yes) in the hopes of receiving a higher offer, then the kiosk 100 can proceed with a more detailed evaluation and inspection of the device 1020 as described below in reference to FIG. 13B. In some embodiments, the kiosk 100 may provide the user with one or more subsequent opportunities to accept the initial offer (step 1314) during the further evaluation if, e.g., the user changes their mind and decides that they no longer want to proceed with the further evaluation. For example, the kiosk display screen 104 can temporarily or persistently display an option for the user to stop the further evaluation and/or accept or otherwise return to the initial offer (step 1314) during all or a portion of one or more steps of the further valuation, which are described in greater detail below with reference to, e.g., FIG. 13B.

In some embodiments, if the initial offer (step 1314) is equal to or below a predetermined valuation threshold (e.g., less than $20, less than $10, less than $5, less than $2, less than $1, etc.), the process 1300 can instruct the user to retrieve the device 1020 from the kiosk 100 and/or end if the user does not accept the initial offer (step 1316, No) instead of, e.g., informing the user of the possibility of receiving a potentially higher offer based on further evaluation of the device 1020 (Step 1324). If, however, the initial offer (step 1314) is above the predetermined valuation threshold, then the process 1300 can proceed to step 1324, as described in greater detail herein.

Although step 1316 and step 1324 are illustrated as separate steps in FIG. 13A, in some embodiments the kiosk 100 can inform the user of the possibility of receiving a potentially higher offer (step 1324) at a same time as the kiosk 100 provides the user with the initial offer (step 1314). For example, both the initial offer (step 1314) and the possibility of receiving a potentially higher offer (step 1324) including, e.g., an estimate of the potentially higher offer, can be displayed to the user to allow the user to make an informed decision about whether to proceed with the further evaluation.

Referring next to FIG. 13B, in step 1328 the kiosk 100 can instruct the user to place the device 1020 in the kiosk 100 on the inspection tray 212 and, in step 1330, the kiosk 100 receives the device 1020 from the user on the inspection tray 212. In some embodiments, the kiosk 100 can receive the device 1020 with the inspection tray 212 in the inclined position shown in, e.g., FIG. 7A. In step 1332, the kiosk 100 (e.g., one or more of the kiosk processors) can connect to the device 1020 via, e.g., a wireless connection (WiFi, Bluetooth, via the wireless charger 222, etc.) and/or a wired connection (e.g., via one of the cable connectors 474*a-c* (FIG. 4A)). For example, in some embodiments the kiosk 100 can include a wireless radio transceiver that is accessible by user devices (e.g., the device 1020). The kiosk 100 can establish a wireless connection with the device 1020 by providing connection instructions and/or authentication information for the user to enter via the device 1020 and/or via the display screen 104. For example, the kiosk 100 can direct the user to make the mobile phone's Bluetooth connection discoverable, and/or can provide a Bluetooth pairing code that the user can type or otherwise enter on the screen of the device 1020 or on the touchscreen of the kiosk 100. As another example, the kiosk 100 can provide a Wi-Fi network name and/or password that when selected and/or entered on the user's device 1020 enables the user to wirelessly connect the device 1020 to the indicated Wi-Fi network. In other embodiments, establishing the connection can include providing a visual code or image (e.g., a QR code) for the user to scan using the device 1020, such that scanning the code or image prompts the phone to connect to the kiosk's wireless network (e.g., upon user confirmation). In some embodiments, establishing the connection can include allowing a particular wireless device to join or use the wireless network or make a wireless connection. For example, when the kiosk 100 detects the device 1020 and determines that the device 1020 is registered for access or otherwise recognized, the kiosk 100 automatically connects to the device 1020 without requiring further user authentication. In other embodiments, the user can load a mobile app onto the device 1020, and the app can evaluate the electronic device and facilitate wireless communication between the device 1020 and the kiosk 100 to facilitate phone evaluation and purchase by the kiosk 100. Various systems and methods for establishing a wireless connection between the kiosk 100 and a mobile phone or other electronic device of a user are described in at least some of the patents and/or patent applications incorporated herein by reference in their entireties. In other embodiments, wireless connections between the kiosk 100 and mobile phones and other electronic devices can be established using other suitable means known in the art. In other embodiments, the kiosk 100 can establish a wired connection to the mobile device 1020 by means of a suitable one of the connectors 474*a-c* described above with reference to FIG. 4A.

In step 1334, the kiosk 100 can further evaluate the device 1020 by, for example, conducting one or more tests on the device 1020. In some embodiments, prior to conducting one or more of the tests, the kiosk 100 can rotate the inspection tray 212 rearwardly from the inclined position shown in FIG. 7A to the horizontal position shown in FIG. 7B. The one or more tests can include visual and/or electrical tests, including any of the tests described herein and/or in any of the applications incorporated by reference herein. In some embodiments, the kiosk 100 can conduct the tests and/or obtain data and/or other information (e.g., device identification information, device functional information, etc.) from the mobile device 1020 using the connection between the kiosk 100 and the device 1020 established in, e.g., step 1332. Additionally or alternatively, the kiosk 100 can further inspect the device 1020 (e.g. the physical condition of the device, such as the condition of the display screen, buttons and other exterior features, etc.) by evaluating images of the device 1020 obtained by the camera 325.

If the additional tests (e.g., electrical and/or visual tests) are sufficient to confirm a higher offer (step 1336, Yes), then in step 1338 the higher offer (e.g., step 1324) can be displayed to the user via, e.g., the kiosk display screen 104. If the user accepts the higher offer (step 1340, Yes), then in step 1342 the kiosk 100 can bin the device 1020 (e.g., as described previously with reference to FIG. 7C) and, in step 1344, the kiosk 100 can facilitate providing compensation to the user. Then the process 1300 ends. If the user does not accept the higher offer provided in step 1338 (step 1340, No), then the process 1300 can continue to step 1337 and the kiosk 100 can inform the user of the possibility of receiving a potentially higher offer (e.g., a highest offer or an offer potentially higher than the higher offer provided in step 1338) based on a further evaluation of the device (e.g., different than the tests performed by the kiosk 100 in step 1334). The potentially higher offer can be based at least in part on the information associated within the unique identifier (step 1308) obtained from the device 1020 (including, e.g., the make and/or model of the device 1020, the results of one or more tests (including, e.g., the electrical and/or visual inspection) performed on the device 1020 by the kiosk (step 1334), and/or, as described in greater detail below, the results of one or more additional tests performed on the device 1020 by the user and facilitated by a software application loaded on the device 1020. If the user accepts the further evaluation (step 1339, Yes), then the process can continue to step 1348, which is described in greater detail below. If, however, the user does not accept the further evaluation (step 1339, No), then in step 1341 the kiosk 100 can rotate the inspection tray 212 from the horizontal position of, e.g., FIG. 7B to the initial position of FIG. 7A, open the door 112 (FIG. 1) to the inspection area 216, and instruct the user to retrieve the device 1020 from within the kiosk 100. Then the process 1300 ends.

In some embodiments, the kiosk 100 may provide the user with one or more subsequent opportunities to accept the higher offer (step 1338) during the further evaluation if, e.g., the user changes their mind and decides that they no longer want to proceed with the further evaluation. For example, the kiosk display screen 104 can temporarily or persistently display an option to stop the further evaluation and/or accept or otherwise return to the initial offer (step 1338) during all or a portion of one or more steps of the further valuation, which are described in greater detail below with reference to, e.g., one or more of steps 1348-1357.

Although step 1338 and step 1337 are illustrated as separate steps in FIG. 13B, in some embodiments the kiosk 100 can inform the user of the possibility of receiving a potentially higher offer (step 1337) at a same time as the kiosk 100 provides the user with the higher offer (step 1338). For example, both the higher offer (step 1338) and the possibility of receiving a potentially higher offer (step 1337) including, e.g., an estimate of the potentially higher offer, can be displayed to the user to allow the user to make an informed decision about whether to proceed with the further evaluation.

Returning to decision step 1336, if the additional tests performed by the kiosk in step 1334 are not sufficient to confirm a higher offer (step 1336, No), then in step 1337 the kiosk can inform the user of the possibility of receiving a potentially higher offer based on further evaluation of the device 1020. At least some aspects of step 1337 can be at least generally similar or identical to step 1324 in FIG. 13A. For example, in some embodiments, the kiosk 100 can provide the user (via, e.g., the display 104) with an estimated time to complete the further evaluation, e.g., to help the user decide whether to proceed with the further evaluation. If the user does not accept the further evaluation (step 1339, No), then in step 1341 the kiosk 100 can rotate the inspection tray 212 to the position of FIG. 7A, open the door 112 and instruct the user to retrieve the device 1020 from the inspection area. Then the process 1300 ends.

If the user accepts the further evaluation (step 1339, Yes), then the user can be prompted to perform further tests to confirm a higher offer. For example, in step 1348 the kiosk 100 can open the door 112 to the inspection area 216 and instruct the user to retrieve the device 1020 from within the kiosk 100 (e.g., at least generally similar or identical to step 1346). The user can then load a software application (e.g., a mobile application, a web application, diagnostic software, testing software, and/or other suitable software applications) onto the device 1020 to enable further testing of the device 1020. For example, in step 1350 the kiosk can provide instructions to the user (via, e.g., the kiosk display 104) for loading the software application onto the device 1020. In some embodiments, the kiosk 100 instruct the user to scan a machine-readable code (e.g., a QR code) or other indicia (e.g., a QR code) with the device 1020 and, in step 1352, the machine-readable code can cause the device 1020 to connect to the kiosk and/or a wireless network associated therewith that loads the software application onto the device 1020. The machine-readable indicia can be displayed on the exterior of the kiosk 100, such as printed or posted on the housing 102, displayed via the kiosk display screen 104, or displayed using any other suitable means known in the art. In other embodiments, the software application can be loaded onto the device 1020 using the kiosk's cable connectors 474*a-c*, downloaded by the user via an app store and/or from the internet, and/or loaded onto the device 1020 using another suitable process or technique. In yet other embodiments, the software application can be loaded onto the mobile device 1020 at the time of the device's manufacture, and/or all or a portion of the functions performed by the software application can be performed via other suitable processes or techniques known in the art which may, or may not, require the downloading of a software or other computer-readable media onto the device 1020. In some instances, instead of loading the software application on the device 1020, the user can also choose to terminate the transaction by walking away from the kiosk 100 with the device 1020.

In some embodiments, the kiosk 100 can monitor a charge state of the device 1020. For example, the kiosk 100 can monitor an amount of power provided to the device 1020 via a wireless charger of the kiosk 100 (e.g., the wireless charger 222, the wireless charger 1010, etc.) and/or the information received from the device 1020 via the wireless charger and, based at least partially on the monitored amount of power and/or the information received via the wireless charger, determine that the device 1020 is in a low-power and/or low-charged state. Additionally, or alternatively, the kiosk camera 325 can obtain an image of the device's display screen during the visual analysis of the device 1020 (e.g., step 1334) and the kiosk 100 can, using, e.g., OCR or other suitable visual analysis, read the battery charge indicator to determine the percentage of battery charge. If the kiosk 100 determines that the charge state of the device 1020 is insufficient to perform the further evaluation (in, e.g., step 1353), the kiosk 100 can instruct the user to leave the device 1020 in the kiosk 100 on the wireless charger 222 and/or otherwise allow the device 1020 to charge for a predetermined amount of time (e.g., at least, 5 minutes, at least 10 minutes, at least 15 minutes, etc.) and/or to a predetermined battery level (e.g., at least, 10%, at least 20%, at least 30%, at least 40%, at least 50%, etc.). After the predetermined amount of time has elapsed and/or once the device's battery has reached the predetermined battery level, the kiosk 100 can then instruct the user to remove the device 1020 from the kiosk 100 (step 1348) and perform additional tests on the device 1020 (step 1353, described below). In other embodiments, the kiosk 100 can instruct the user to remove the device 1020 from the kiosk 100 to charge the device 1020 using another charger. For example, the kiosk 100 can instruct the user to place the device 1020 on a wireless charger external to the inspection area 216, e.g., on the upper surface 103 of the kiosk housing 102. Once the device 1020 is sufficiently charged, the user can perform additional tests on the device 1020 (step 1353, described below).

In step 1353, the user can perform one or more tests on the device 1020 by, for example, following instructions and/or prompts provided by the software application. The tests can include (i) prompting a user to respond to questions about, e.g., the device, device condition, etc. and/or interact with the device 1020, and (ii) analyzing the results of the interaction. For example, the software application can prompt the user to touch, select, or otherwise interact with a portion of a display screen of the device 1020 and use the result of the interaction to determine whether the portion of the display screen is operational. As another example, the software application can prompt the user to press one or more of the device's buttons (e.g., volume button, mute switch power button, etc.) and/or enable/disable one or more of the device's features (e.g., WiFi connectivity, Bluetooth connectivity, location services, etc.) and uses the result of this interaction to determine whether the associated function of the device are functional (e.g., volume buttons increase/decrease volume, mute switch turns the ringer off, power button locks the phone, etc.). In some embodiments, the software application prompts the user to shake, turn, tilt, and/or otherwise move the phone to one or more specific orientations (e.g., portrait, landscape, etc.) and/or through one or more patterns (e.g., circular, figure-eight, etc.) and uses the result of this interaction to determine whether one or more components (e.g., accelerometer) of the device are functional.

In step 1354, the kiosk 100 can receive results from one or more of the tests performed on the mobile device 1020, e.g., in step 1353. The kiosk 100 can receive the test results wirelessly via the software application. For example, the software application and upload the test results to a server remote from the kiosk 100 and the kiosk 100 can download the test results from the remote server. Additionally, or alternatively, the software application can connect directly to the kiosk 100 (via, e.g., a wired and/or wireless connection with the mobile device 1020, such as described previously herein) and use that connection to provide the test results to the kiosk 100. If the tests performed by the user are not sufficient to confirm a higher offer (step 1356, No), then the process 1300 can continue to step 1341 (described previously herein) and end. If, however, the tests performed by the user are sufficient to confirm a higher offer (step 1356, Yes), then in step 1357 the process 1300 can including determining whether the user accepts the higher offer. If the user does not accept the higher offer (step 1357, No), then the process 1300 can continue to step 1341 (described previously herein) and end. If, however, the user accepts the higher offer (step 1357, Yes), the process 1300 can continue by verifying the identity of the device 1020, as described in greater detail below with reference to FIG. 13C, before providing compensation to the user.

In some embodiments, the kiosk 100 can visually evaluate the device 1020 during all or a portion of the further evaluation, e.g., after the user removes the device 1020 from the kiosk 100 (step 1348), while the user performs the test(s) on the device (step 1352), etc. For example, the kiosk 100 can activate one or more externally-facing cameras (e.g., one or more of the external cameras 106) to evaluate a physical and/or cosmetic condition of the device 1020 by, e.g., looking for scratches, damage, and/or other signs of wear on the device 1020 while, e.g., the user positions the device 1020 in front of, or otherwise within the field of view, of one or more of the externally-facing cameras.

Referring to FIG. 13C, in some embodiments, to verify the identity of the device 1020, the kiosk 100 can instruct the user to bring up a unique image on the display screen of the device 1020. The unique image can include, for example, a QR code, bar code or other machine-readable indicia, a graphic or textual image, URL (e.g., a unique URL), and/or another unique image. The unique image can be displayed on the device 1020 via the diagnostic software application (e.g., step 1350) in response to, e.g., a user input and/or in response to a wireless instruction from the kiosk 100, remote server, etc., such as after competition of the tests using the diagnostic software and/or a confirmation that the tests were sufficient to confirm the higher offer (e.g., step 1356, Yes). In some embodiments, the unique image may automatically load in response to touching an area (e.g., a box, a message, a prompt, etc.) on the screen (e.g., a touch screen portion of the kiosk display screen 104), as prompted by the diagnostic software application running on the device 1020. For example, after the user accepts the higher offer (step 1357, Yes), the diagnostic software can prompt the user to touch or select the area on the kiosk display screen 104 and, in response, the kiosk 100 can cause the diagnostic software running on the device 1020 to display the unique image on the display screen of the device 1020. In some embodiments, the diagnostic software application automatically displays the unique image via the display screen of the device 1020 upon conclusion of the tests (in, e.g., step 1353), after the kiosk 100 receives results from the tests (in, e.g., step 1354), if the results from the tests are sufficient to confirm the higher offer (in, e.g., step 1356), and/or after the user accepts the higher offer (step 1357, Yes). The unique image can, in some embodiments, be generated and displayed on the display screen of the device 1020 when a user loads a unique instance of a website on the device 1020 via, e.g., touching a prompt provided by the diagnostic software application, by scanning a machine-readable code on the kiosk 100 or displayed by the kiosk display screen 104, etc. In step 1358, the kiosk 100 instructs the use to place the device 1020 within the kiosk 100 via the inspection tray 212) with the unique image displayed on the display screen of the device 1020.

In step 1360 the kiosk 100 can receive the device 1020 from the user by, e.g., rotating the inspection tray 212 aft to the position of FIG. 7B. In step 1362, the kiosk 100 can then verify that the device 1020 received in step 1360 is the same device that the user ran tests on outside of the kiosk 100 (e.g., in step 1354). For example, if the unique image includes a QR code or other machine-readable code, unique indicia, etc. the kiosk 100 can obtain an image of the QR code displayed on the display screen of the device 1020 via the camera 325 and analyze the image to verify that the QR code displayed by the device 1020 was the same QR code provided to the device 1020 in response to one or more tests performed using the diagnostic software via the kiosk 100, etc. (e.g., in step 1354). For example, the kiosk 100 can receive (from, e.g., the software application via, e.g., a remote computer or other connectivity) a copy of the QR code or other unique image at the conclusion of the testing (e.g., in step 1353). The kiosk 100 can then compare this received copy of the QR code or other unique image to the QR code or other unique image shown on the device's display screen. If the QR codes or other unique images are the same (e.g., they match), the kiosk can confirm that the device 1020 within the kiosk 100 is the same device that underwent testing outside the kiosk 100. In some embodiments, the unique image includes an alphanumeric code that is specifically generated for the device 1020 based at least in part on a unique URL associated with the testing of the device 1020 and/or the results of one or more of the tests (performed in, e.g., 1353), and the kiosk can scan or read the alphanumeric code (using, e.g., OCR) to confirm or verify that the device 1020 is the same device that the user ran tests on outside of the kiosk 100 (in, e.g., step 1354).

In step 1364, the kiosk 100 can confirm that the device is the same device that underwent testing inside the kiosk 100 (e.g., in step 1334). For example, the kiosk 100 can perform an electrical and/or visual inspection of the device received in step 1360 and compare the results of the electrical and/or visual inspection with the results of the tests performed in step 1334 to confirm that the device is the same device that underwent testing inside the kiosk 100. Additionally or alternatively, the kiosk 100 can receive information from the device 1020 via, e.g., the wireless charger 222, and compare that information to information previously received from the electronic device (via, e.g., the wireless charger 222, the unique identifier from step 1308, the results of one or more of the tests performed in step 1334, etc.) to confirm that the device is the same device that underwent testing inside the kiosk 100. By verifying that the device received in step 1360 is the same device that underwent the additional testing (e.g., testing outside the kiosk in step 1353 and/or testing inside the kiosk in step 1334) and not a different device (e.g., an untested device and/or a device of lesser value), the kiosk 100 can reduce or prevent fraud or other instances in which a user performs tests on one device but in step 1360 provides the kiosk with another device of lesser value.

If the kiosk 100 cannot verify, e.g., the identity of the device (step 1366, No), then in step 1368 the kiosk 100 can rotate the inspection tray 212 to the position of FIG. 7A, open the door 112 and instruct the user to retrieve the device 1020 from the inspection area and the process 1300 can end. If, however, the kiosk 100 confirms the identity of the device (step 1366, Yes), then in step 1370 the higher offer (e.g., step 1324) can be displayed to the user via, e.g., the kiosk 100.

If the user accepts the higher offer (step 1372, Yes), then in step 1374 the kiosk 100 can bin the device 1020 (e.g., as described previously with reference to FIG. 7C) and, in step 1376, facilitate providing compensation to the user. If the user does not accept the higher offer (step 1372, No), then in step 1368 the kiosk 100 can open the door 112 to the inspection area 216 and/or instruct the user to retrieve the device 1020 from within the kiosk 100, as described previously.

EXAMPLES

At least some aspects of the present technology are described with reference to the following examples:

1. A method for purchasing an electronic device at a kiosk, the method comprising:
   - obtaining, via the kiosk, first information associated with the electronic device while the electronic device is positioned within an inspection area of the kiosk;
   - providing a first offer to purchase the electronic device from a user, wherein the first offer is provided via a user interface of the kiosk, and wherein the first offer is based at least in part on the first information;
   - receiving a first input from the user in response to the first offer, wherein the first input is received via the user interface, and wherein the first input indicates a nonacceptance of the first offer;
   - after receiving the first input—
     - prompting the user to remove the electronic device from the inspection area;
     - prompting the user to load a software application onto the electronic device; and
     - receiving, via the software application, second information associated with the electronic device;
   - providing a second offer to purchase the electronic device from the user, wherein the second offer is provided via the user interface, and wherein the second offer is based at least in part on the second information;
   - receiving a second input from the user in response to the second offer, wherein the second input is received via the user interface, and wherein the second input indicates an acceptance of the second offer;
   - prompting the user, via the user interface, to return the electronic device to the inspection area;
   - confirming, by the kiosk, that the electronic device within the inspection area is the same electronic device associated with the first information and the second information; and
   - after confirming, providing, via the kiosk, compensation to the user for the electronic device, wherein the compensation is based on the second offer.
2. The method of example 1, wherein—
   - prompting the user to remove the electronic device from the inspection area includes prompting the user via the user interface;

prompting the user to load the software application onto the electronic device includes prompting the user via the user interface; and receiving the second information associated with the electronic device includes receiving the second information by the kiosk.

3. The method of example 1 or 2 further comprising— before obtaining the first information, obtaining, via the kiosk, initial information associated with the electronic device;

providing an initial offer to purchase the electronic device from the user, wherein the initial offer is provided via the user interface of the kiosk and is based at least in part on the initial information;

receiving an input from the user in response to the initial offer, wherein the input is received via the user interface and indicates a nonacceptance of the initial offer; and prompting the user to position the electronic device within the inspection area.

4. The method of example 3 wherein the initial information includes a make, a model, and/or an identification number of the electronic device.

5. The method of any of examples 1-4 wherein operation of the software application causes the kiosk or a remote computer to receive a unique identifier, and wherein confirming includes:

obtaining, via the kiosk, an image of a display screen of the electronic device; and confirming that the image of the display screen includes the unique identifier.

6. The method of example 5 wherein the unique identifier includes a bar code, a QR code, an alphanumeric code, and/or other machine-readable code.

7. The method of any of examples 1-6 wherein obtaining the first information includes— performing, via a wired and/or wireless connection to the electronic device, an electrical inspection of the electronic device; and/or performing, via a camera of the kiosk, a visual inspection of the electronic device.

8. The method of example 7 wherein performing the electrical inspection includes determining a condition of a battery of the electronic device.

9. The method of example 7 or 8 wherein performing the visual inspection of the electronic device includes visually inspecting a display screen of the electronic device for cracks or other damage.

10. The method of any of examples 1-9 wherein receiving the second information includes receiving, via the software application, results from one or more tests performed on the electronic device by the user.

11. The method of example 10 wherein the one or more tests include, via the software application, prompting the user to interact with a portion of a display screen of the electronic device and using a result of the interaction to determine a condition of the display screen and/or other aspect of the electronic device.

12. The method of example 10 or 11 wherein the one or more tests include, via the software application, prompting the user to press one or more buttons of the electronic device and, based on the pressing, determining whether a function of the electronic device associated with the one or more buttons is operational.

13. The method of any of examples 10-12 wherein the one or more tests include, via the software application, prompting the user to move the electronic device to one or more specific orientations and, based on the movement of the electronic device, determining whether an accelerometer of the electronic device is operational.

14. The method of any of examples 1-13 wherein the electronic device is a mobile phone.

15. A method for purchasing an electronic device at a kiosk, the method comprising:

receiving the electronic device in an inspection area of the kiosk;

inspecting the electronic device via the kiosk while the electronic device is positioned within the inspection area;

providing a first offer to purchase the electronic device from a user, wherein the first offer is provided via a user interface of the kiosk and is based at least in part on the inspection of the electronic device;

receiving a first input from the user in response to the first offer, wherein the first input is received via the user interface while the electronic device is positioned within the inspection area, and wherein the first input indicates a nonacceptance of the first offer;

prompting the user to remove the electronic device from the inspection area;

prompting the user to load a software application onto the electronic device, wherein the software application is configured to prompt the user to perform one or more tests on the electronic device;

providing a second offer to purchase the electronic device from the user, wherein the second offer is provided via the user interface and is based at least in part on results of the one or more tests;

receiving a second input from the user in response to the second offer, wherein the second input is received via the user interface, wherein the second input indicates an acceptance of the second offer, and wherein the software application is further configured to cause a display screen of the electronic device to display a unique image after the user interface receives the second input;

prompting the user, via the user interface, to return the electronic device to the inspection area while the display screen displays the unique image;

after the electronic device is returned to the inspection area, obtaining, via the kiosk, an image of the display screen;

detecting, via the kiosk, whether the electronic device returned to the inspection area is the same electronic device on which the one or more tests were performed, wherein the detecting is based at least in part on whether the image of the display screen includes the unique image; and in response to detecting that the electronic device returned to the inspection area is the same electronic device on which the one or more tests were performed, providing, via the kiosk, compensation to the user for the electronic device based on the second offer.

16. The method of example 15 wherein the first offer is based on first information associated with the electronic device, and wherein the method further comprises— before providing the compensation, obtaining, via the kiosk, second information associated with the electronic device; and comparing the first information and the second information to confirm that the electronic device returned to the kiosk is the same electronic device about which the first information was obtained.

17. The method of example 16 wherein inspecting the electronic device includes performing a first electrical inspection and/or a first visual inspection of the electronic device to obtain the first information, and wherein obtaining the second information includes performing a second electrical inspection and/or a second visual inspection of the electronic device.
18. The method of example 16 or 17 wherein inspecting the electronic device includes obtaining the first information from the electronic device via a wireless charger of the kiosk, and wherein obtaining the second information includes obtaining the second information via the wireless charger.
19. The method of any of examples 16-18 wherein comparing the first information and the second information includes confirming that the second information is the same as the first information.
20. The method of any of examples 15-19 wherein the unique image includes a bar code, a QR code, an alphanumeric code, and/or other machine-readable code.
21. The method of any of examples 15-20 wherein the kiosk is configured to receive a copy of the unique image from the software application, and wherein detecting includes—
    - obtaining, via the kiosk, an image of the display screen, wherein the image of the display screen includes an image of the unique image; and
    - comparing the image of the unique image to the copy of the unique image to confirm that the image and the copy are the same.
22. The method of any of examples 15-21 wherein the unique image is generated for the electronic device based at least in part on a unique URL associated the one or more tests performed on the electronic device.
23. The method of any of examples 15-22 further comprising—
    - before inspecting the electronic device, obtaining, via the kiosk, initial information associated with the electronic device;
    - providing an initial offer to purchase the electronic device from the user, wherein the initial offer is provided via the user interface of the kiosk and is based at least in part on the initial information;
    - receiving an input from the user in response to the initial offer, wherein the input is received via the user interface and indicates a nonacceptance of the initial offer; and
    - prompting the user to position the electronic device within the inspection area.
24. The method of any of examples 15-23 wherein the electronic device is a mobile phone.
25. A kiosk system for purchasing an electronic device, the kiosk system comprising:
    - a kiosk, including—
        - a housing defining an inspection area; and
        - a user interface coupled to the housing;
    - one or more processors; and
    - one or more non-transitory, computer-readable media carrying instructions that, when executed by the one or more processors, cause the kiosk system to—
        - receive, via the kiosk, first information associated with the electronic device while the electronic device is positioned in the inspection area;
        - provide a first offer to purchase the electronic device from a user, wherein the first offer is provided via a user interface of the kiosk, and wherein the first offer is based at least in part on the first information;
        - receive a first input from the user in response to the first offer, wherein the first input is received via the user interface, and wherein the first input indicates a nonacceptance of the first offer;
        - after receiving the first input—
            - prompt the user, via the user interface, to remove the electronic device from the inspection area;
            - prompt the user, via the user interface, to load a software application onto the electronic device; and
            - receive, via the software application, second information associated with the electronic device;
        - provide a second offer to purchase the electronic device from the user, wherein the second offer is provided via the user interface, and wherein the second offer is based at least in part on the second information;
        - receive a second input from the user in response to the second offer, wherein the second input is received via the user interface, and wherein the second input indicates an acceptance of the second offer;
        - prompt the user, via the user interface, to return the electronic device to the inspection area;
        - confirm that the electronic device within the inspection area is the same electronic device associated with the first information and the second information; and
        - after confirming, provide, via the kiosk, compensation to the user for the electronic device based on the second offer.
26. The kiosk system of example 25 wherein the instructions further cause the kiosk system to—
    - before obtaining the first information, obtain, via the kiosk, initial information associated with the electronic device;
    - provide an initial offer to purchase the electronic device from the user, wherein the initial offer is provided via the user interface of the kiosk and is based at least in part on the initial information;
    - receive an input from the user in response to the initial offer, wherein the input is received via the user interface and indicates a nonacceptance of the initial offer; and
    - prompt the user to position the electronic device within the inspection area.
27. The kiosk system of example 26 wherein the initial information includes a make, a model, and/or an identification number of the electronic device.
28. The kiosk system of any of examples 25-28 wherein operation of the software application causes a display screen of the electronic device to display a unique identifier, and wherein, to confirm, the instructions cause the kiosk system to—
    - obtain, via the kiosk, an image of the display screen; and
    - confirm that the image of the display screen includes the unique identifier.
29. The kiosk system of example 28 wherein the unique identifier includes a bar code, a QR code, an alphanumeric code, and/or other machine-readable code.
30. The kiosk system of any of examples 25-29 wherein, to obtain the first information, the instructions cause the kiosk system to— perform, via a wired and/or wireless connection to the electronic device, an electrical inspection of the electronic device; and/or perform, via a camera of the kiosk, a visual inspection of the electronic device.

31. The kiosk system of example 30 wherein the kiosk is configured to perform the electrical inspection to determine a condition of a battery of the electronic device.

32. The kiosk system of example 30 or 31 wherein the kiosk is configured to perform the visual inspection of the electronic device to analyze a display screen of the electronic device for cracks or other damage.

33. The kiosk system of any of examples 25-32 wherein, to receive the second information, the instructions further cause the kiosk system to receive, via the software application, results from one or more tests performed on the electronic device by the user.

34. The kiosk system of example 33 wherein the one or more tests prompt the user to interact with a portion of a display screen of the electronic device and use a result of the interaction to determine whether the portion of the display screen is operational.

35. The kiosk system of example 33 or 34 wherein the one or more tests prompt the user to press one or more buttons of the electronic device and use a result of the one or more button presses to determine whether a function of the electronic device associated with the one or more buttons is operational.

36. The kiosk system of any of examples 33-35 wherein the one or more tests prompt the user to move the electronic device to one or more specific orientations and use a result of the movement of the electronic device to determine whether an accelerometer of the electronic device is operational.

37. The kiosk system of any of examples claim 25-36 wherein the kiosk includes the one or more processors and/or the one or more non-transitory, computer-readable media.

38. The kiosk system of any of examples 25-37 wherein the electronic device is a mobile phone.

39. A kiosk system for purchasing an electronic device, the kiosk system comprising:

a kiosk, including— a housing defining an inspection area; and a user interface coupled to the housing;

one or more processors; and one or more non-transitory, computer-readable media carrying instructions that, when executed by the one or more processors, cause the kiosk system to— receive the electronic device in the inspection area of the kiosk;

inspect the electronic device via the kiosk while the electronic device is positioned within the inspection area;

provide a first offer to purchase the electronic device from a user, wherein the first offer is provided via a user interface of the kiosk and is based at least in part on the inspection of the electronic device;

receive a first input from the user in response to the first offer, wherein the first input is received via the user interface while the electronic device is positioned within the inspection area, and wherein the first input indicates a nonacceptance of the first offer;

prompt the user to remove the electronic device from the inspection area;

prompt the user to load a software application onto the electronic device, wherein the software application is configured to prompt the user to perform one or more tests on the electronic device;

provide a second offer to purchase the electronic device from the user, wherein the second offer is provided via the user interface and is based at least in part on results of the one or more tests;

receive a second input from the user in response to the second offer, wherein the second input is received via the user interface, wherein the second input indicates an acceptance of the second offer, and wherein the software application is further configured to cause a display screen of the electronic device to display a unique image after the user interface receives the second input;

prompt the user, via the user interface, to return the electronic device to the inspection area while the display screen displays the unique image;

after the electronic device is returned to the inspection area, obtain, via the kiosk, the unique image;

detect, via the kiosk, whether the electronic device returned to the inspection area is the same electronic device on which the one or more tests were performed, wherein the detecting is based at least in part on the unique image; and in response to detecting that the electronic device returned to the inspection area is the same electronic device on which the one or more tests were performed, provide, via the kiosk, compensation to the user for the electronic device based on the second offer.

40. The kiosk system of example 39 wherein the first offer is based on first information associated with the electronic device, and wherein the instructions further cause the kiosk system to— before providing the compensation, obtain, via the kiosk, second information associated with the electronic device; and compare the first information and the second information to confirm that the electronic device returned to the kiosk is the same electronic device about which the first information was obtained.

41. The kiosk system of example 40 wherein, to inspect the electronic device, the instructions cause the kiosk system to, via the kiosk, perform an electrical inspection and/or a visual inspection of the electronic device to obtain the first information, and wherein, to obtain the second information, the instructions cause the kiosk system to, via the kiosk, perform another electrical inspection and/or visual inspection of the electronic device.

42. The kiosk system of example 40 or 41 wherein, to inspect the electronic device, the instructions cause the kiosk system to, via the kiosk, obtain the first information from the electronic device via a wireless charger of the kiosk, and wherein, to obtain the second information, the instructions cause the kiosk system to obtain the second information via the wireless charger.

43. The kiosk system of any of examples 40-42 wherein, to compare the first information and the second information, the instructions cause the kiosk system to confirm that the second information is the same as the first information.

44. The kiosk system of any of examples 39-43 wherein the unique image includes a bar code, a QR code, an alphanumeric code, and/or other machine-readable indicia.
45. The kiosk system of any of examples 39-44 wherein the instructions that cause the kiosk system to detect include instructions that cause the kiosk system to—
    obtain, via the kiosk, an image of the display screen; and
    confirm that the image of the display screen includes the unique image.
46. The kiosk system of any of examples 39-45 wherein the kiosk is configured to receive a copy of the unique image from the software application, and wherein—
    the instructions that cause the kiosk to obtain the unique image include instructions that cause the kiosk system to obtain, via the kiosk, an image of the display screen, wherein the image of the display screen includes an image of the unique image; and
    wherein the instructions that cause the kiosk system to detect include instructions that cause the kiosk system to compare the image of the unique image to the copy of the unique image to confirm that the image and the copy are the same.
47. The kiosk system of any of examples 39-46 wherein the unique image is generated for the electronic device based at least in part on a unique URL associated the one or more tests performed on the electronic device.
48. The kiosk system of any of examples 39-47 wherein the instructions further cause the kiosk system to—
    before inspecting the electronic device, obtain, via the kiosk, initial information associated with the electronic device;
    provide an initial offer to purchase the electronic device from the user, wherein the initial offer is provided via the user interface of the kiosk and is based at least in part on the initial information;
    receive an input from the user in response to the initial offer, wherein the input is received via the user interface and indicates a nonacceptance of the initial offer; and
    prompt the user to position the electronic device within the inspection area.
49. The kiosk system of any of examples 39-48 wherein the electronic device is a mobile phone.

Although at least some of the embodiments described above include steps for purchasing electronic devices from users, the present technology can also include steps allowing users to purchase electronic devices, e.g., via the kiosk 100. For example, in some embodiments the kiosk 100 can display a listing of one or more electronic devices available for purchase via the kiosk 100 before, during, and/or after the user recycles their current electronic device. This can allow users to "trade-up" by recycling their current phone and applying the proceeds from that sale toward the purchase price of another (e.g., newer) phone. For example, rather than directly dispensing compensation to the user for recycling their electronic device by, e.g., dispensing cash gift card, etc. and/or making an electronic transfer of value to, e.g., a user account, etc. (step 1322 in FIG. 13A, step 1344 in FIG. 3B, step 1376 in FIG. 13C, etc.), the kiosk can be configured to reduce/discount the purchase price of another electronic device selected by the user by the amount (or, in some embodiments, by a greater or lesser amount) that the user would have received in compensation for recycling their current electronic device. The price reduction/discount can be applied immediately to the purchase price of another electronic device (e.g., as part of a single sell-buy transaction carried out by the user via the kiosk 100) or can be saved and applied to the purchase price of a new device within a time period after issuance (e.g., within 1, 2, 3, 4, etc. days of recycling the current electronic device) at the same kiosk at which the user recycled their current device and/or at another location (e.g., another kiosk, a store, a website, etc.). The price reduction/discount can be provided to the user in the form of a voucher (e.g., a printed voucher, an electronic voucher, etc.) an email, a text message, an alpha-numeric code, a QR code, bar code and/or other machine-readable indicia, a graphic or textual image, and/or via another suitable process or technique.

Although at least some instances of the process 1300 described above include performing two sets of tests (e.g., step 1334 and step 1353) on the device 1020, in other instances the process 1300 can include performing three, four, five, or more sets of tests on the device. In at least some instances, for example, one or more steps of the process 1300 can repeat to allow for additional testing/evaluation of the device 1020. For example, the user may be instructed to return the device 1020 to the kiosk 100 (as described in, e.g., step 1318, step 1328, step 1358, etc.) one or more times to allow for additional testing/evaluation of the device 1020 by the kiosk 100. Additionally, or alternatively, the user may be instructed to remove the device 1020 from the kiosk 100 (as described in, e.g., step 1348) one or more times to allow for additional testing/evaluation of the device 1020 by, e.g., the user or another individual (e.g., a store clerk). The kiosk 100 can use results from the additional testing/evaluation to, e.g., confirm one or more of the offers provided by the kiosk 100 (in, e.g., step 1314, step 1338, step 1370, etc.), determine whether still further testing/evaluation of the device 1020 is needed, identify the possibility of another potentially higher offer for the device 1020 (as described with reference to, e.g., step 1337), etc.

Although many embodiments of the present technology are described herein in the context of mobile phones, aspects of the present technology are not limited to mobile phones and generally apply to other consumer electronic devices. Such devices include, as non-limiting examples, all manner of mobile phones; smartphones; handheld devices; personal digital assistants (PDAs); MP3 or other digital music players; tablet, notebook, ultrabook and laptop computers; e-readers all types of cameras GPS devices; set-top boxes; universal remote controls; wearable computers; etc. In some embodiments, it is contemplated that the kiosk 100 can facilitate selling and/or otherwise processing larger consumer electronic devices, such as desktop computers, TVs, game consoles, etc., as well smaller electronic devices such as Google® Glass™, smartwatches (e.g., the Apple Watch™, Android Wear™ devices such as the Moto 360®, or the Pebble Steel™ watch), etc. Embodiments of the kiosk 100 and various features thereof can be at least generally similar in structure and function to the systems, methods and corresponding features described in the following patents and patent applications, which are incorporated herein by reference in their entireties: U.S. Pat. Nos. 11,482,067, 11,462,868, 11,080,672, 10,860,990, 10,853,873, 10,572,946, 10,475,002; 10,445,708; 10,438,174; 10,417,615; 10,401,411; 10,269,110; 10,127,647; 10,055,798; 9,885,672; 9,881,284; 8,200,533; 8,195,511; and 7,881,965; U.S. patent application Ser. Nos. 18/167,390; 17/811,548, 17/645,039, 17/445,799; 17/445,821; 17/445,799; 17/445,178; 17/445,158; 17/445,083; 17/445,082; 17/125,994; 16/794,009; 16/719,699; 16/794,009; 16/534,741; 15/057,707; 14/967,183; 14/964,963; 14/663,331; 14/660,768;

14/598,469; 14/568,051; 14/498,763; 13/794,816; 13/794,814; 13/753,539; 13/733,984; 13/705,252; 13/693,032; 13/658,828; 13/658,825; 13/492,835; 13/113,497; U.S. Provisional Application Nos. 63/365,778, 63/267,911, 63/220,890, 63/220,381, 63/127,148, 63/116,020; 63/116,007; 63/088,377; 63/070,207; 63/066,794; 62/950,075; 62/807,165; 62/807,153; 62/804,714; 62/782,947; 62/782,302; 62/332,736; 62/221,510; 62/202,330; 62/169,072; 62/091,426; 62/090,855; 62/076,437; 62/073,847; 62/073,840; 62/059,132; 62/059,129; 61/607,572; 61/607,548; 61/607,001; 61/606,997; 61/595,154; 61/593,358; 61/583,232; 61/570,309; 61/551,410; 61/472,611; 61/347,635; 61/183,510; and 61/102,304. All the patents and patent applications listed in the preceding sentence and any other patents or patent applications identified herein are incorporated herein by reference in their entireties. Additionally, embodiments of the kiosk 100 and/or various features thereof can be at least generally similar in structure and function to the systems, methods and/or corresponding features described in U.S. patent application Ser. No. 17/445,082, filed Aug. 13, 2021; U.S. patent app. Ser. No. 17/445,158, filed Aug. 16, 2021; U.S. patent application Ser. No. 17/445,083, filed Aug. 13, 2021; U.S. patent application Ser. No. 17/445,178, filed Aug. 16, 2021; and U.S. patent application Ser. No. 18/167,390, filed Feb. 10, 2023; which are each incorporated by reference herein.

Aspects of the invention can be embodied in a special purpose computer or data processor that is specifically programmed, configured, or constructed to perform one or more of the computer-executable instructions explained in detail herein. While aspects of the present technology, such as certain functions, are described as being performed exclusively on a single device, the present technology can also be practiced in distributed environments where functions or modules are shared among disparate processing devices, which are linked through a communications network, such as a Local Area Network (LAN), Wide Area Network (WAN), or the internet. In a distributed computing environment, program modules may be located in both local and remote memory storage devices.

Aspects of the present technology may be stored or distributed on tangible computer-readable media, including magnetically or optically readable computer discs, hard-wired or preprogrammed chips (e.g., EEPROM semiconductor chips), nanotechnology memory, biological memory, or other data storage media. A non-transitory computer-readable medium can store instructions described herein, which when executed by at least one computing device, can perform methods as generally shown and described herein and equivalents thereof. Alternatively, computer implemented instructions, data structures, screen displays, and other data under aspects of the present technology may be distributed over the internet or over other networks (including wireless networks), on a propagated signal on a propagation medium (e.g., an electromagnetic wave(s), a sound wave, etc.) over a period of time, or provided on any analog or digital network (packet switched, circuit switched, or other scheme).

References throughout the foregoing description to features, advantages, or similar language do not imply that all of the features and advantages that may be realized with the present technology should be or are in any single embodiment of the invention. Rather, language referring to the features and advantages is understood to mean that a specific feature, advantage, or characteristic described in connection with an embodiment is included in at least one embodiment of the present technology. Thus, discussions of the features and advantages, and similar language, throughout this specification may, but do not necessarily, refer to the same embodiment.

Furthermore, the described features, advantages, and characteristics of the present technology may be combined in any suitable manner in one or more embodiments. One skilled in the relevant art will recognize that the present technology can be practiced without one or more of the specific features or advantages of a particular embodiment. In other instances, additional features and advantages may be recognized in certain embodiments that may not be present in all embodiments of the present technology.

Any patents and applications and other references noted above, including any that may be listed in accompanying filing papers, are incorporated herein by reference in the entirety, except for any subject matter disclaimers or disavowals, and except to the extent that the incorporated material is inconsistent with the express disclosure herein, in which case the language in this disclosure controls. Aspects of the invention can be modified, if necessary, to employ the systems, functions, and concepts of the various references described above to provide yet further implementations of the invention.

As used herein, the use of relative terminology, such as "about", "generally", "approximately", "substantially" and the like refer to the stated value plus or minus ten percent. For example, the use of the term "about 100" refers to a range of from 90 to 110, inclusive. In instances in which the context requires otherwise and/or relative terminology is used in reference to something that does not include, or is not related to, a numerical value, the terms are given their ordinary meaning to one skilled in the art.

The above Detailed Description of examples and embodiments of the invention is not intended to be exhaustive or to limit the invention to the precise form disclosed above. While specific examples for the invention are described above for illustrative purposes, various equivalent modifications are possible within the scope of the invention, as those skilled in the relevant art will recognize. For example, while processes are presented in a given order, alternative implementations may perform routines having steps, or employ systems having blocks, in a different order, and some processes or blocks may be deleted, moved, added, subdivided, combined, and/or modified to provide alternative or sub-combinations. Each of these processes or blocks may be implemented in a variety of different ways. Also, while processes are at times described as being performed in series, these processes may instead be performed or implemented in parallel or performed at different times.

The teachings of the present technology provided herein can be applied to other systems, not necessarily the system described above. The elements and acts of the various examples described above can be combined to provide further implementations of the invention. Some alternative implementations of the invention may include not only additional elements to those implementations noted above, but also may include fewer elements. Further, any specific numbers noted herein are only examples: alternative implementations may employ differing values or ranges.

Although the above description describes various embodiments of the invention and the best mode contemplated, regardless of how detailed the above text, the invention can be practiced in many ways. Details of the system may vary considerably in its specific implementation, while still being encompassed by the present disclosure. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention under the claims.

From the foregoing, it will be appreciated that specific embodiments of the invention have been described herein for purposes of illustration, but that various modifications may be made without deviating from the spirit and scope of the various embodiments of the invention. Further, while various advantages associated with certain embodiments of the invention have been described above in the context of those embodiments, other embodiments may also exhibit such advantages, and not all embodiments need necessarily exhibit such advantages to fall within the scope of the invention. Accordingly, the invention is not limited, except as by the appended claims.

Although many embodiments of the present technology are described herein in the context of mobile phones, aspects of the present technology are not limited to mobile phones and generally apply to other consumer electronic devices. Such devices include, as non-limiting examples, all manner of mobile phones; smartphones; handheld devices; personal digital assistants (PDAs); MP3 or other digital music players; tablet, notebook, ultrabook and laptop computers; e-readers all types of cameras GPS devices; set-top boxes; universal remote controls; wearable computers; etc. In some embodiments, it is contemplated that the kiosk 100 can facilitate selling and/or otherwise processing larger consumer electronic devices, such as desktop computers, TVs, game consoles, etc., as well smaller electronic devices such as Google® Glass™, smartwatches (e.g., the Apple Watch™, Android Wear™ devices such as the Moto 360®, or the Pebble Steel™ watch), etc. Embodiments of the kiosk 100 and various features thereof can be at least generally similar in structure and function to the systems, methods and corresponding features described in the following patents and patent applications, which are incorporated herein by reference in their entireties: U.S. Pat. Nos. 11,907,915, 11,843,206, 11,803,954, 11,798,250, 11,790,328, 11,790,237, 11,734,654, 11,526,932, 11,443,289, 11,436,570, 11,315,093, 11,232,412, 11,126,973, 11,107,046, 11,482,067, 11,462,868, 11,080,672, 11,080,662, 11,010,841, 10,909,673, 10,860,990, 10,853,873, 10,825,082, 10,572,946, 10,496,963, 10,475,002, 10,445,708, 10,438,174, 10,417,615, 10,401,411, 10,269,110, 10,157,427, 10,127,647, 10,055,798, 10,032,140, 9,911,102, 9,885,672, 9,881,284, 9,818,160, 9,904,911, 8,463,646 8,423,404, 8,239,262, 8,200,533, 8,195,511, and 7,881,965; U.S. patent application Ser. Nos. 18/499,518, 18/472,994, 18/472,054, 18/464,023, 18/462,213, 18/437,212, 18/417,971, 18/346,618, 18/324,921, 18/324,903, 18/051,512, 17/933,046, 17/817,296, 17/815,205, 17/655,217, 17/644,330, 17/393,168, 17/225,932, 17/086,357, 16/575,090, 16/534,741, 15/855,320, 15/641,145, 15/214,791, 13/492,835, U.S. Provisional Application Nos. 63/484,972, 63/365,778, 63/267,911, 63/220,890, 63/220,381, 63/127,148, 63/116,020, 63/116,007, 63/088,377, 63/070,207, 63/066,794, 62/950,075, 62/807,165, 62/807,153, 62/804,714, 62/782,947, 62/782,302, 62/332,736, 62/221,510, 62/202,330, 62/169,072, 62/091,426, 62/090,855, 62/076,437, 62/073,847, 62/073,840, 62/059,132, 62/059,129, 61/607,572, 61/607,548, 61/607,001, 61/606,997, 61/595,154, 61/593,358, 61/583,232, 61/570,309, 61/551,410, 61/472,611, 61/347,635, 61/183,510, 61/102,304. All the patents and patent applications listed in the preceding sentence and any other patents or patent applications identified herein are incorporated herein by reference in their entireties.

Although certain aspects of the invention are presented below in certain claim forms, the applicant contemplates the various aspects of the invention in any number of claim forms. Accordingly, the applicant reserves the right to pursue additional claims after filing this application to pursue such additional claim forms, in either this application or a continuing application.

We claim:

1. A method for purchasing an electronic device at a kiosk, the method comprising:

receiving the electronic device in a closeable inspection area of the kiosk;

obtaining, via the kiosk, first information associated with the electronic device while the electronic device is positioned within the inspection area of the kiosk;

providing a first offer to purchase the electronic device from a user, wherein the first offer is provided via a user interface of the kiosk, and wherein the first offer is based at least in part on the first information;

receiving a first input from the user in response to the first offer, wherein the first input is received via the user interface, and wherein the first input indicates a non-acceptance of the first offer;

after receiving the first input— opening an access door of the kiosk to permit the user to access the inspection area and the electronic device positioned therein;

prompting the user to remove the electronic device from the inspection area;

prompting the user to load a software application onto the electronic device; and receiving, via the software application, second information associated with the electronic device;

providing a second offer to purchase the electronic device from the user, wherein the second offer is provided via the user interface, and wherein the second offer is based at least in part on the second information;

receiving a second input from the user in response to the second offer, wherein the second input is received via the user interface, and wherein the second input indicates an acceptance of the second offer;

prompting the user, via the user interface, to return the electronic device to the inspection area;

closing the access door to prevent the user from accessing the inspection area and the electronic device contained therein;

confirming, by the kiosk, that the electronic device within the inspection area is the same electronic device associated with the first information and the second information; and after confirming, providing, via the kiosk, compensation to the user for the electronic device, wherein the compensation is based on the second offer.

2. The method of claim 1, wherein— prompting the user to remove the electronic device from the inspection area includes prompting the user via the user interface;

prompting the user to load the software application onto the electronic device includes prompting the user via the user interface; and receiving the second information associated with the electronic device includes receiving the second information by the kiosk.

3. The method of claim 1 further comprising— before obtaining the first information, obtaining, via the kiosk, initial information associated with the electronic device;

providing an initial offer to purchase the electronic device from the user, wherein the initial offer is provided via the user interface of the kiosk and is based at least in part on the initial information;

receiving an input from the user in response to the initial offer, wherein the input is received via the user interface and indicates a nonacceptance of the initial offer; and prompting the user to position the electronic device within the inspection area.

4. The method of claim 3 wherein the initial information includes a make, a model, and/or an identification number of the electronic device.

5. The method of claim 1 wherein operation of the software application causes the kiosk or a remote computer to receive a unique identifier, and wherein confirming includes:

obtaining, via the kiosk, an image of a display screen of the electronic device; and confirming that the image of the display screen includes the unique identifier.

6. The method of claim 5 wherein the unique identifier includes a bar code, a QR code, an alphanumeric code, and/or other machine-readable code.

7. The method of claim 1 wherein obtaining the first information includes— performing, via a wired and/or wireless connection to the electronic device, an electrical inspection of the electronic device; and/or performing, via a camera of the kiosk, a visual inspection of the electronic device.

8. The method of claim 7 wherein performing the electrical inspection includes determining a condition of a battery of the electronic device.

9. The method of claim 7 wherein performing the visual inspection of the electronic device includes visually inspecting a display screen of the electronic device for cracks or other damage.

10. The method of claim 1 wherein receiving the second information includes receiving, via the software application, results from one or more tests performed on the electronic device by the user.

11. The method of claim 10 wherein the one or more tests include, via the software application, prompting the user to interact with a portion of a display screen of the electronic device and using a result of the interaction to determine a condition of the display screen and/or other aspect of the electronic device.

12. The method of claim 10 wherein the one or more tests include, via the software application, prompting the user to press one or more buttons of the electronic device and, based on the pressing, determining whether a function of the electronic device associated with the one or more buttons is operational.

13. The method of claim 10 wherein the one or more tests include, via the software application, prompting the user to move the electronic device to one or more specific orientations and, based on the movement of the electronic device, determining whether an accelerometer of the electronic device is operational.

14. The method of claim 1 wherein the electronic device is a mobile phone.

15. A method for purchasing an electronic device at a kiosk, the method comprising:

receiving the electronic device on an inspection tray within an inspection area of the kiosk while the inspection tray is in a first position relative to the inspection area;

moving the inspection tray to a second position relative to the inspection area to facilitate an inspection of the electronic device;

inspecting the electronic device via the kiosk while the electronic device is positioned within the inspection area;

providing a first offer to purchase the electronic device from a user, wherein the first offer is provided via a user interface of the kiosk and is based at least in part on the inspection of the electronic device;

receiving a first input from the user in response to the first offer, wherein the first input is received via the user interface while the electronic device is positioned within the inspection area, and wherein the first input indicates a nonacceptance of the first offer;

returning the inspection tray to the first position to facilitate user access to the electronic device;

prompting the user to remove the electronic device from the inspection area;

prompting the user to load a software application onto the electronic device, wherein the software application is configured to prompt the user to perform one or more tests on the electronic device;

providing a second offer to purchase the electronic device from the user, wherein the second offer is provided via the user interface and is based at least in part on results of the one or more tests;

receiving a second input from the user in response to the second offer, wherein the second input is received via the user interface, wherein the second input indicates an acceptance of the second offer, and wherein the software application is further configured to cause a display screen of the electronic device to display a unique image after the user interface receives the second input;

prompting the user, via the user interface, to return the electronic device to the inspection tray within the inspection area while the display screen displays the unique image;

after the electronic device is returned to the inspection tray of the inspection area, obtaining, via the kiosk, an image of the display screen;

detecting, via the kiosk, whether the electronic device returned to the inspection area is the same electronic device on which the one or more tests were performed, wherein the detecting is based at least in part on whether the image of the display screen includes the unique image; and in response to detecting that the electronic device returned to the inspection tray within the inspection area is the same electronic device on which the one or more tests were performed, providing, via the kiosk, compensation to the user for the electronic device based on the second offer.

16. The method of claim 15 wherein the first offer is based on first information associated with the electronic device, and wherein the method further comprises— before providing the compensation, obtaining, via the kiosk, second information associated with the electronic device; and comparing the first information and the second information to confirm that the electronic device returned to the kiosk is the same electronic device about which the first information was obtained.

17. The method of claim 16 wherein inspecting the electronic device includes performing a first electrical inspection and/or a first visual inspection of the electronic device to obtain the first information, and wherein obtaining the second information includes performing a second electrical inspection and/or a second visual inspection of the electronic device.

18. The method of claim 16 wherein inspecting the electronic device includes obtaining the first information from the electronic device via a wireless charger of the kiosk, and wherein obtaining the second information includes obtaining the second information via the wireless charger.

19. The method of claim 16 wherein comparing the first information and the second information includes confirming that the second information is the same as the first information.

20. The method of claim 15 wherein the unique image includes a bar code, a QR code, an alphanumeric code, and/or other machine-readable code.

21. The method of claim 15 wherein the kiosk is configured to receive a copy of the unique image from the software application, and wherein detecting includes— obtaining, via the kiosk, an image of the display screen, wherein the image of the display screen includes an image of the unique image; and comparing the image of the unique image to the copy of the unique image to confirm that the image and the copy are the same.

22. The method of claim 15 wherein the unique image is generated for the electronic device based at least in part on a unique URL associated the one or more tests performed on the electronic device.

23. The method of claim 15 further comprising— before inspecting the electronic device, obtaining, via the kiosk, initial information associated with the electronic device;

providing an initial offer to purchase the electronic device from the user, wherein the initial offer is provided via the user interface of the kiosk and is based at least in part on the initial information;

receiving an input from the user in response to the initial offer, wherein the input is received via the user interface and indicates a nonacceptance of the initial offer; and prompting the user to position the electronic device within the inspection area.

24. The method of claim 15 wherein the electronic device is a mobile phone.

25. A kiosk system for purchasing an electronic device, the kiosk system comprising:

a kiosk, including— a housing defining a closeable inspection area;

an access door coupled to the housing and configured to open and close to, respectively, allow and prevent access to the inspection area; and a user interface coupled to the housing;

one or more processors; and one or more non-transitory, computer-readable media carrying instructions that, when executed by the one or more processors, cause the kiosk system to— receive, via the kiosk, first information associated with the electronic device while the electronic device is positioned in the inspection area;

provide a first offer to purchase the electronic device from a user, wherein the first offer is provided via a user interface of the kiosk, and wherein the first offer is based at least in part on the first information;

receive a first input from the user in response to the first offer, wherein the first input is received via the user interface, and wherein the first input indicates a nonacceptance of the first offer;

after receiving the first input— opening the access door to permit the user to access the inspection area and the electronic device positioned therein;

prompt the user, via the user interface, to remove the electronic device from the inspection area;

prompt the user, via the user interface, to load a software application onto the electronic device; and receive, via the software application, second information associated with the electronic device;

provide a second offer to purchase the electronic device from the user, wherein the second offer is provided via the user interface, and wherein the second offer is based at least in part on the second information;

receive a second input from the user in response to the second offer, wherein the second input is received via the user interface, and wherein the second input indicates an acceptance of the second offer;

prompt the user, via the user interface, to return the electronic device to the inspection area;

closing the access door to prevent the user from accessing the inspection area and the electronic device contained therein;

confirm that the electronic device within the inspection area is the same electronic device associated with the first information and the second information; and after confirming, provide, via the kiosk, compensation to the user for the electronic device based on the second offer.

26. The kiosk system of claim 25 wherein the instructions further cause the kiosk system to— before obtaining the first information, obtain, via the kiosk, initial information associated with the electronic device;

provide an initial offer to purchase the electronic device from the user, wherein the initial offer is provided via the user interface of the kiosk and is based at least in part on the initial information;

receive an input from the user in response to the initial offer, wherein the input is received via the user interface and indicates a nonacceptance of the initial offer; and prompt the user to position the electronic device within the inspection area.

27. The kiosk system of claim 26 wherein the initial information includes a make, a model, and/or an identification number of the electronic device.

28. The kiosk system of claim 25 wherein operation of the software application causes a display screen of the electronic device to display a unique identifier, and wherein, to confirm, the instructions cause the kiosk system to— obtain, via the kiosk, an image of the display screen; and confirm that the image of the display screen includes the unique identifier.

29. The kiosk system of claim 28 wherein the unique identifier includes a bar code, a QR code, an alphanumeric code, and/or other machine-readable code.

30. The kiosk system of claim 25 wherein, to obtain the first information, the instructions cause the kiosk system to— perform, via a wired and/or wireless connection to the electronic device, an electrical inspection of the electronic device; and/or perform, via a camera of the kiosk, a visual inspection of the electronic device.

31. The kiosk system of claim 30 wherein the kiosk is configured to perform the electrical inspection to determine a condition of a battery of the electronic device.

32. The kiosk system of claim 30 wherein the kiosk is configured to perform the visual inspection of the electronic device to analyze a display screen of the electronic device for cracks or other damage.

33. The kiosk system of claim 25 wherein, to receive the second information, the instructions further cause the kiosk system to receive, via the software application, results from one or more tests performed on the electronic device by the user.

34. The kiosk system of claim 33 wherein the one or more tests prompt the user to interact with a portion of a display screen of the electronic device and use a result of the interaction to determine whether the portion of the display screen is operational.

35. The kiosk system of claim 33 wherein the one or more tests prompt the user to press one or more buttons of the electronic device and use a result of the one or more button presses to determine whether a function of the electronic device associated with the one or more buttons is operational.

36. The kiosk system of claim 33 wherein the one or more tests prompt the user to move the electronic device to one or more specific orientations and use a result of the movement of the electronic device to determine whether an accelerometer of the electronic device is operational.

37. The kiosk system of claim 25 wherein the kiosk includes the one or more processors and/or the one or more non-transitory, computer-readable media.

38. The kiosk system of claim 25 wherein the electronic device is a mobile phone.

39. A kiosk system for purchasing an electronic device, the kiosk system comprising:

a kiosk, including— a housing defining an inspection area;

an inspection tray positioned within the inspection area and configured to move relative to the housing between a first position and a second position; and a user interface coupled to the housing;

one or more processors; and one or more non-transitory, computer-readable media carrying instructions that, when executed by the one or more processors, cause the kiosk system to— receive the electronic device on the inspection tray within the inspection area of the kiosk while the inspection tray is in the first position;

moving the inspection tray to a second position to facilitate an inspection of the electronic device;

inspect the electronic device via the kiosk while the electronic device is positioned within the inspection area;

provide a first offer to purchase the electronic device from a user, wherein the first offer is provided via a user interface of the kiosk and is based at least in part on the inspection of the electronic device;

receive a first input from the user in response to the first offer, wherein the first input is received via the user interface while the electronic device is positioned within the inspection area, and wherein the first input indicates a nonacceptance of the first offer;

returning the inspection tray to the first position to facilitate user access to the electronic device;

prompt the user to remove the electronic device from the inspection area;

prompt the user to load a software application onto the electronic device, wherein the software application is configured to prompt the user to perform one or more tests on the electronic device;

provide a second offer to purchase the electronic device from the user, wherein the second offer is provided via the user interface and is based at least in part on results of the one or more tests;

receive a second input from the user in response to the second offer, wherein the second input is received via the user interface, wherein the second input indicates an acceptance of the second offer, and wherein the software application is further configured to cause a display screen of the electronic device to display a unique image after the user interface receives the second input;

prompt the user, via the user interface, to return the electronic device to the inspection tray within the inspection area while the display screen displays the unique image;

after the electronic device is returned to the inspection tray, obtain, via the kiosk, the unique image;

detect, via the kiosk, whether the electronic device returned to the inspection area is the same electronic device on which the one or more tests were performed, wherein the detecting is based at least in part on the unique image; and in response to detecting that the electronic device returned to the inspection tray within the inspection area is the same electronic device on which the one or more tests were performed, provide, via the kiosk, compensation to the user for the electronic device based on the second offer.

40. The kiosk system of claim 39 wherein the first offer is based on first information associated with the electronic device, and wherein the instructions further cause the kiosk system to— before providing the compensation, obtain, via the kiosk, second information associated with the electronic device; and compare the first information and the second information to confirm that the electronic device returned to the kiosk is the same electronic device about which the first information was obtained.

41. The kiosk system of claim 40 wherein, to inspect the electronic device, the instructions cause the kiosk system to, via the kiosk, perform an electrical inspection and/or a visual inspection of the electronic device to obtain the first information, and wherein, to obtain the second information, the instructions cause the kiosk system to, via the kiosk, perform another electrical inspection and/or visual inspection of the electronic device.

42. The kiosk system of claim 40 wherein, to inspect the electronic device, the instructions cause the kiosk system to, via the kiosk, obtain the first information from the electronic device via a wireless charger of the kiosk, and wherein, to obtain the second information, the instructions cause the kiosk system to obtain the second information via the wireless charger.

43. The kiosk system of claim 40 wherein, to compare the first information and the second information, the instructions cause the kiosk system to confirm that the second information is the same as the first information.

44. The kiosk system of claim 39 wherein the unique image includes a bar code, a QR code, an alphanumeric code, and/or other machine-readable indicia.

45. The kiosk system of claim 39 wherein the instructions that cause the kiosk system to detect include instructions that cause the kiosk system to— obtain, via the kiosk, an image of the display screen; and confirm that the image of the display screen includes the unique image.

46. The kiosk system of claim 39 wherein the kiosk is configured to receive a copy of the unique image from the software application, and wherein— the instructions that cause the kiosk to obtain the unique image include instructions that cause the kiosk system to obtain, via the kiosk, an image of the display screen, wherein the image of the display screen includes an image of the unique image; and wherein the instructions that cause the kiosk system to detect include instructions that cause the kiosk system to compare the image of the unique image to the copy of the unique image to confirm that the image and the copy are the same.

47. The kiosk system of claim 39 wherein the unique image is generated for the electronic device based at least in part on a unique URL associated the one or more tests performed on the electronic device.

48. The kiosk system of claim 39 wherein the instructions further cause the kiosk system to— before inspecting the electronic device, obtain, via the kiosk, initial information associated with the electronic device;

provide an initial offer to purchase the electronic device from the user, wherein the initial offer is provided via the user interface of the kiosk and is based at least in part on the initial information;

receive an input from the user in response to the initial offer, wherein the input is received via the user interface and indicates a nonacceptance of the initial offer; and prompt the user to position the electronic device within the inspection area.

49. The kiosk system of claim 39 wherein the electronic device is a mobile phone.

* * * * *